(12) United States Patent
Kajino et al.

(10) Patent No.: US 12,294,021 B2
(45) Date of Patent: *May 6, 2025

(54) SEMICONDUCTOR MEMORY DEVICE

(71) Applicant: KIOXIA CORPORATION, Tokyo (JP)

(72) Inventors: Tomonori Kajino, Yokkaichi (JP);
Taichi Iwasaki, Yokkaichi (JP);
Tatsuya Fujishima, Yokkaichi (JP);
Masayuki Shishido, Yokkaichi (JP);
Nozomi Kido, Yokkaichi (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/598,073

(22) Filed: Mar. 7, 2024

(65) Prior Publication Data

US 2024/0213339 A1 Jun. 27, 2024

Related U.S. Application Data

(63) Continuation of application No. 17/470,982, filed on Sep. 9, 2021, now Pat. No. 11,984,484.

(30) Foreign Application Priority Data

Mar. 23, 2021 (JP) .................. 2021-049130

(51) Int. Cl.
*H01L 29/417* (2006.01)
*G11C 16/04* (2006.01)
(Continued)

(52) U.S. Cl.
CPC .... *H01L 29/41775* (2013.01); *G11C 16/0483* (2013.01); *H01L 29/42328* (2013.01);
(Continued)

(58) Field of Classification Search
CPC .......... H01L 21/76816; H01L 21/8221; H01L 29/41775; H01L 29/42328;
(Continued)

(56) References Cited

U.S. PATENT DOCUMENTS

| 10,553,603 | B2 | 2/2020 | Yamashita |
| 10,566,339 | B2 | 2/2020 | Fujii et al. |

(Continued)

FOREIGN PATENT DOCUMENTS

| JP | 2019-160922 A | 9/2019 |
| TW | 201807812 A | 3/2018 |
| TW | 202008560 A | 2/2020 |

*Primary Examiner* — Brook Kebede
(74) *Attorney, Agent, or Firm* — Oblon, McClelland, Maier & Neustadt, L.L.P.

(57) ABSTRACT

A semiconductor memory device according to an embodiment includes a substrate, a source line, word lines, a pillar, and a first member. The first member is provided to penetrate the source line. The first member includes a first portion which is far from the substrate, and a second portion which is near the substrate. The first member includes a first contact and a first insulating film. The first contact is provided to extend from the first portion to the second portion. The first contact is electrically connected to the substrate. The first insulating film insulates the source line from the first contact. The first member includes a stepped portion at a boundary part between the first portion and the second portion.

20 Claims, 50 Drawing Sheets

(51) Int. Cl.
*H01L 29/423* (2006.01)
*H10B 41/10* (2023.01)
*H10B 41/27* (2023.01)
*H10B 41/35* (2023.01)
*H10B 43/10* (2023.01)
*H10B 43/27* (2023.01)
*H10B 43/35* (2023.01)
*H01L 29/06* (2006.01)

(52) U.S. Cl.
CPC ....... *H01L 29/42344* (2013.01); *H10B 41/10* (2023.02); *H10B 41/27* (2023.02); *H10B 41/35* (2023.02); *H10B 43/10* (2023.02); *H10B 43/27* (2023.02); *H10B 43/35* (2023.02); *H01L 29/0607* (2013.01)

(58) Field of Classification Search
CPC ... H01L 29/42344; H10B 41/10; H10B 41/27; H10B 41/35; H10B 43/10; H10B 43/27; H10B 43/35; G11C 16/0483
See application file for complete search history.

(56) References Cited

U.S. PATENT DOCUMENTS

| | | | |
|---|---|---|---|
| 2010/0237400 A1* | 9/2010 | Aoyama | H10B 43/27 257/324 |
| 2017/0040338 A1* | 2/2017 | Lee | H10B 43/40 |
| 2017/0263634 A1 | 9/2017 | Inokuma et al. | |
| 2018/0323207 A1 | 11/2018 | Shim et al. | |
| 2019/0279996 A1* | 9/2019 | Yamashita | H01L 27/0688 |
| 2020/0027800 A1 | 1/2020 | Yamamoto et al. | |
| 2020/0051995 A1 | 2/2020 | Tanaka et al. | |

\* cited by examiner

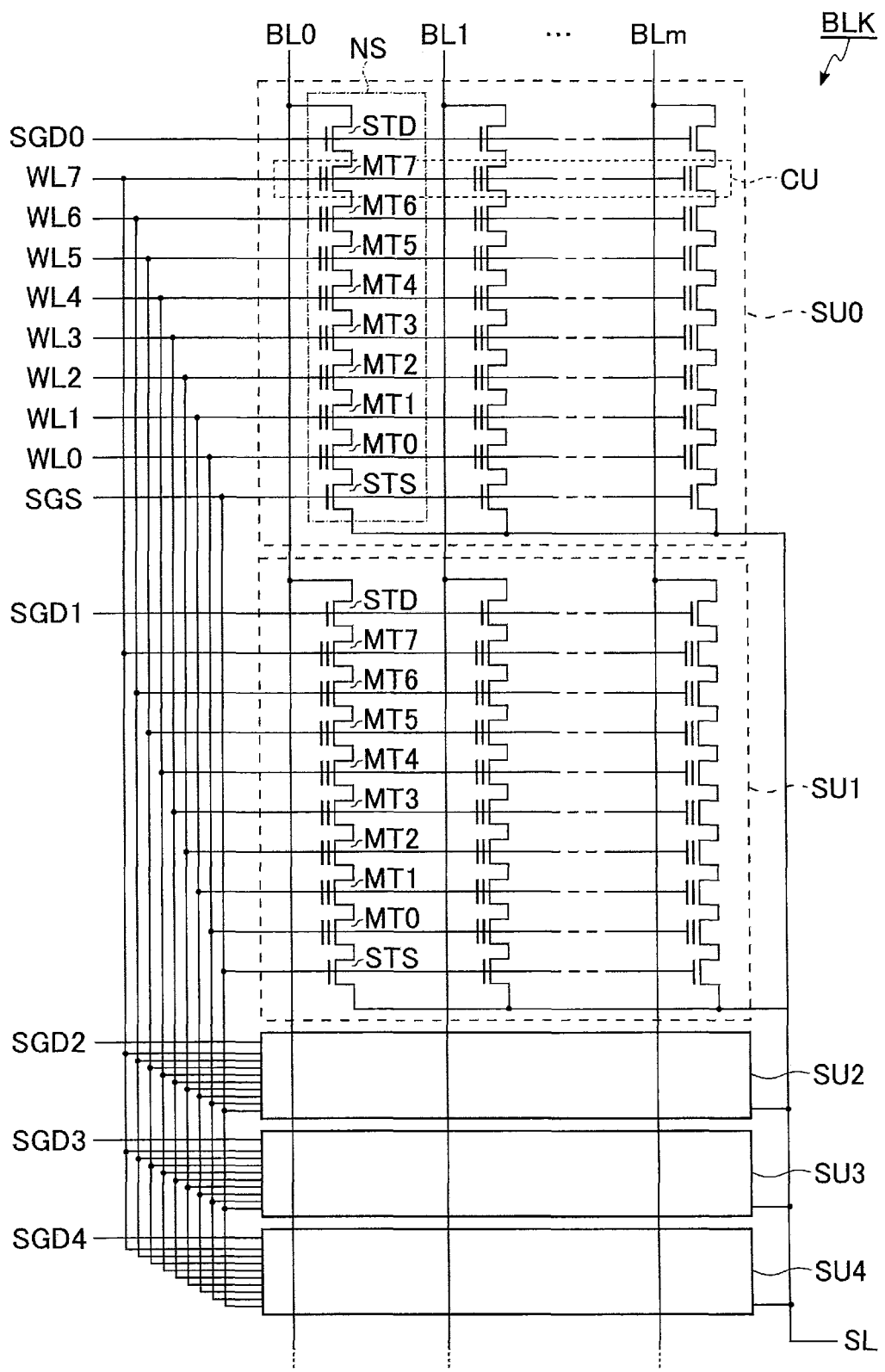
F I G. 2

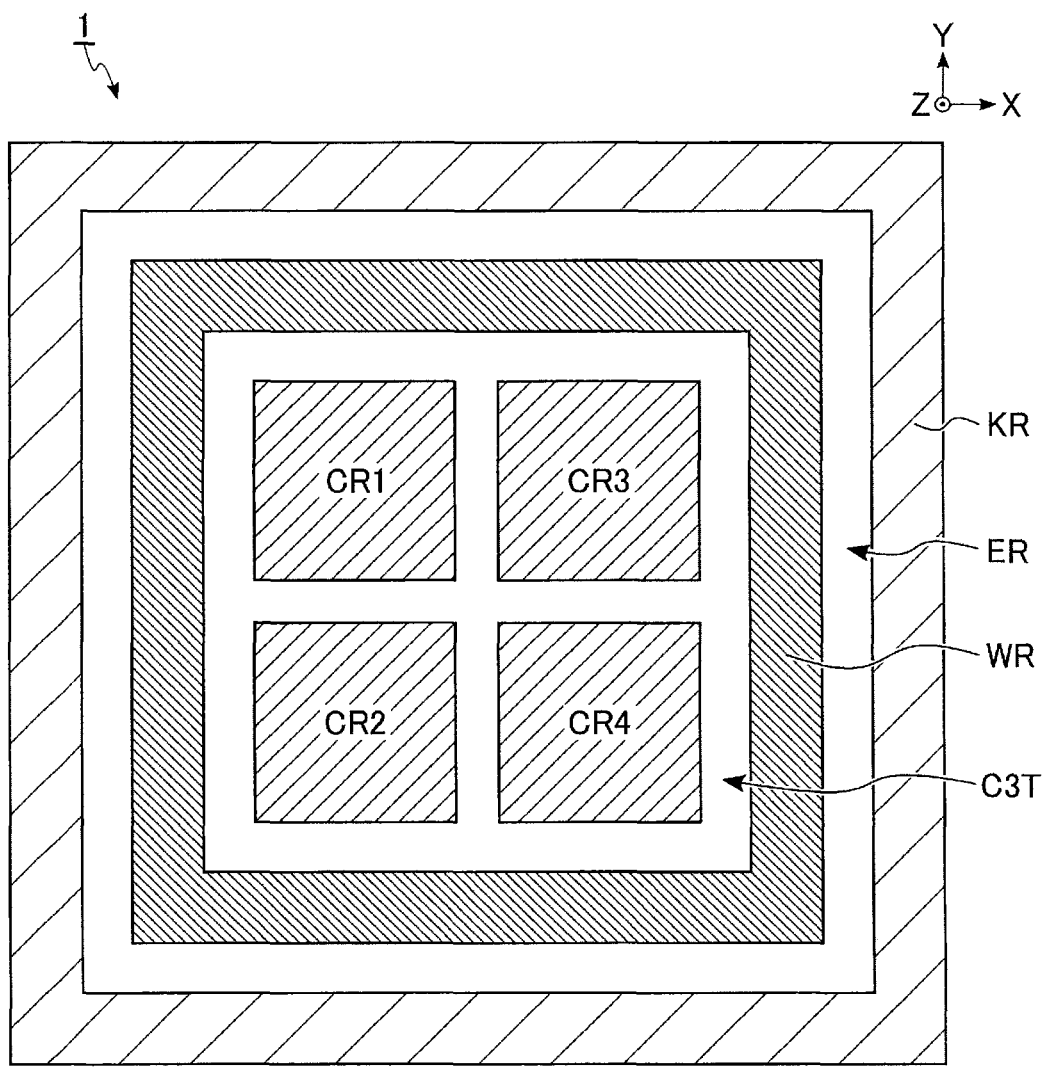
F I G. 3

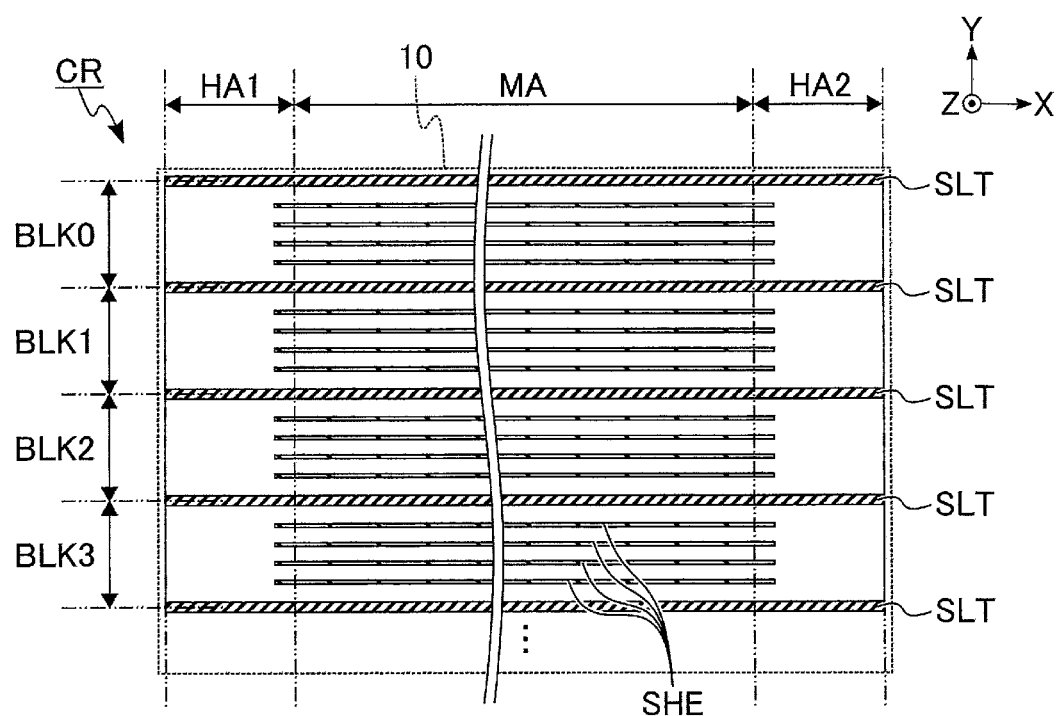
F I G. 4

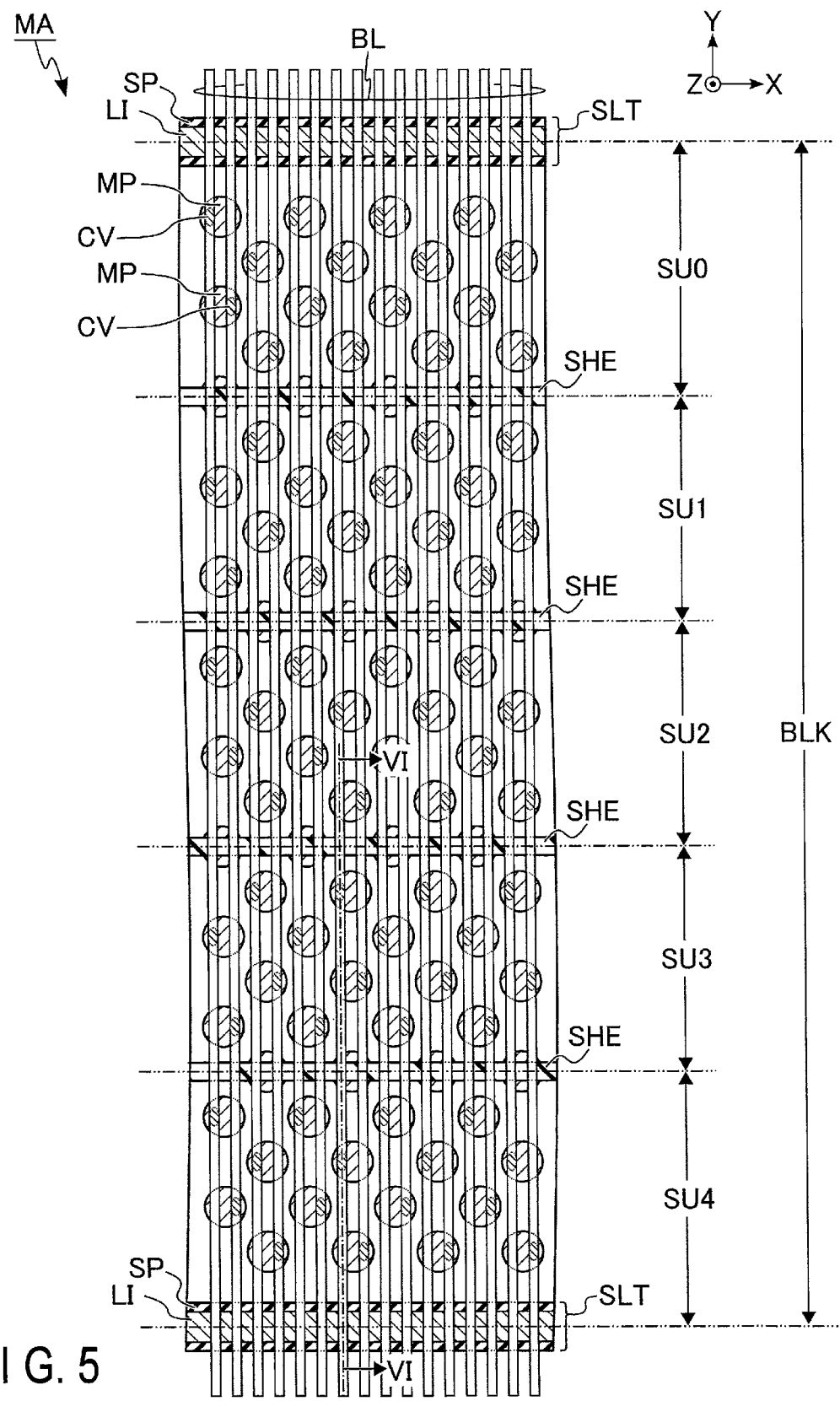
F I G. 5

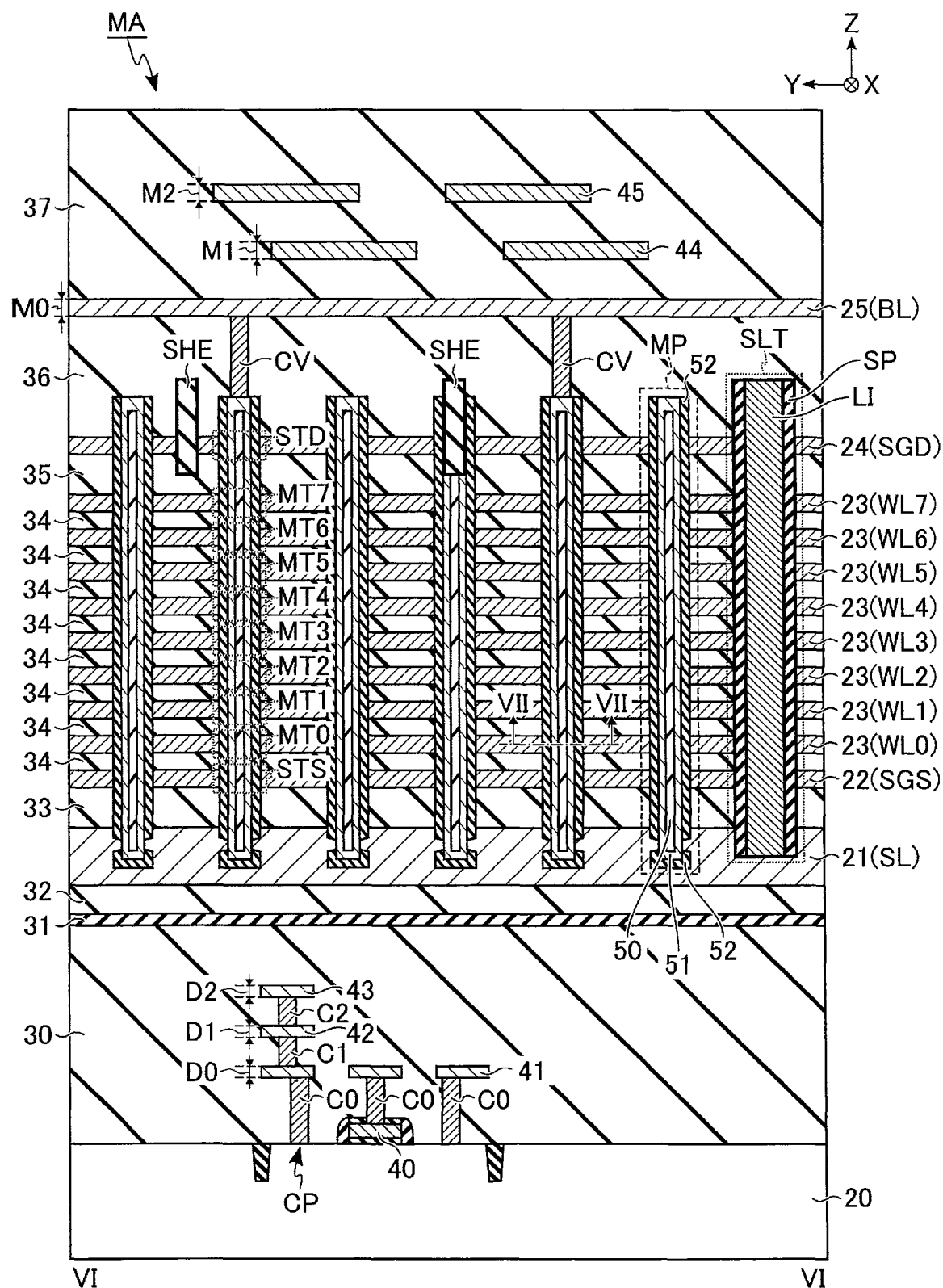
F I G. 6

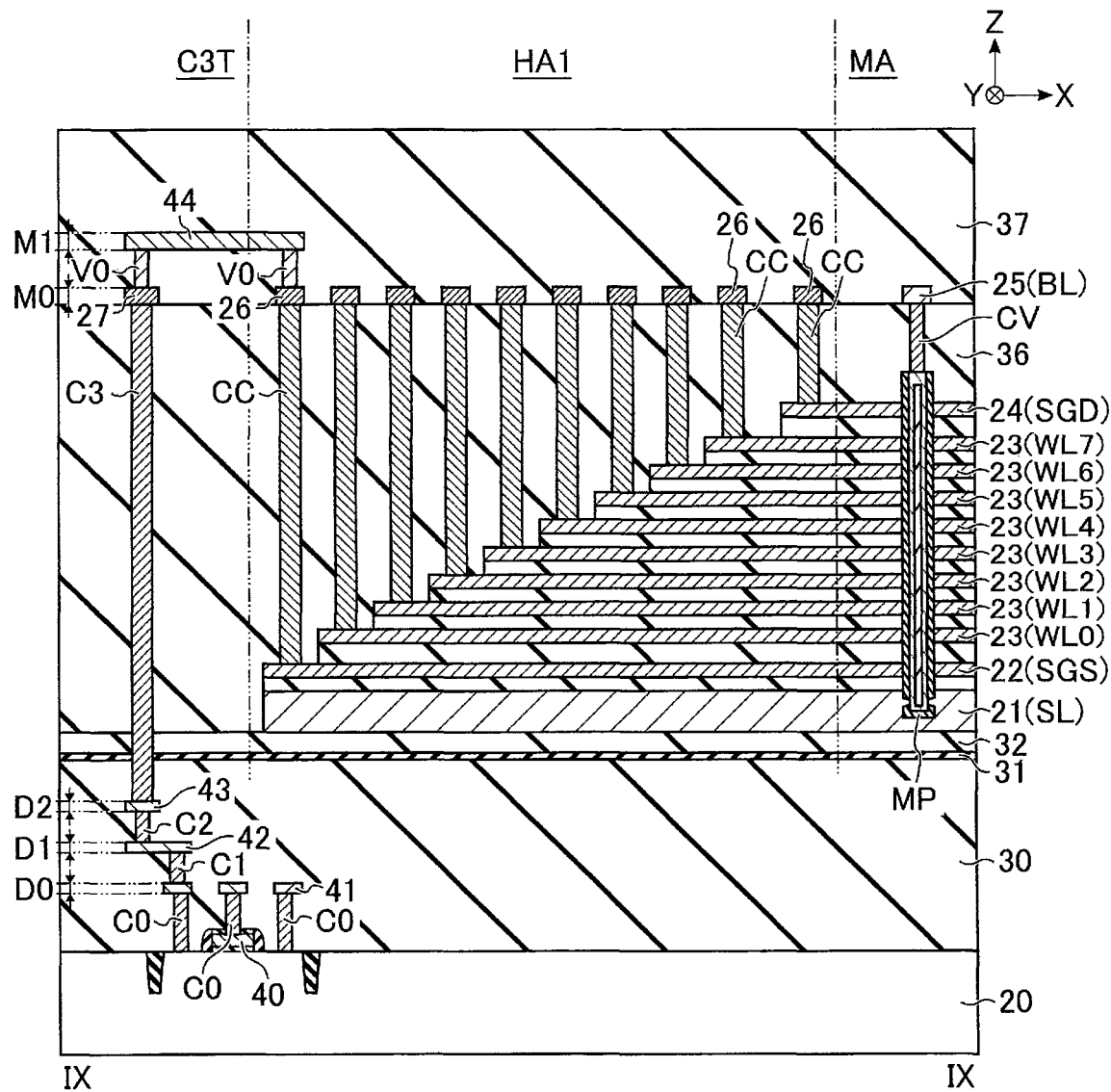
F I G. 9

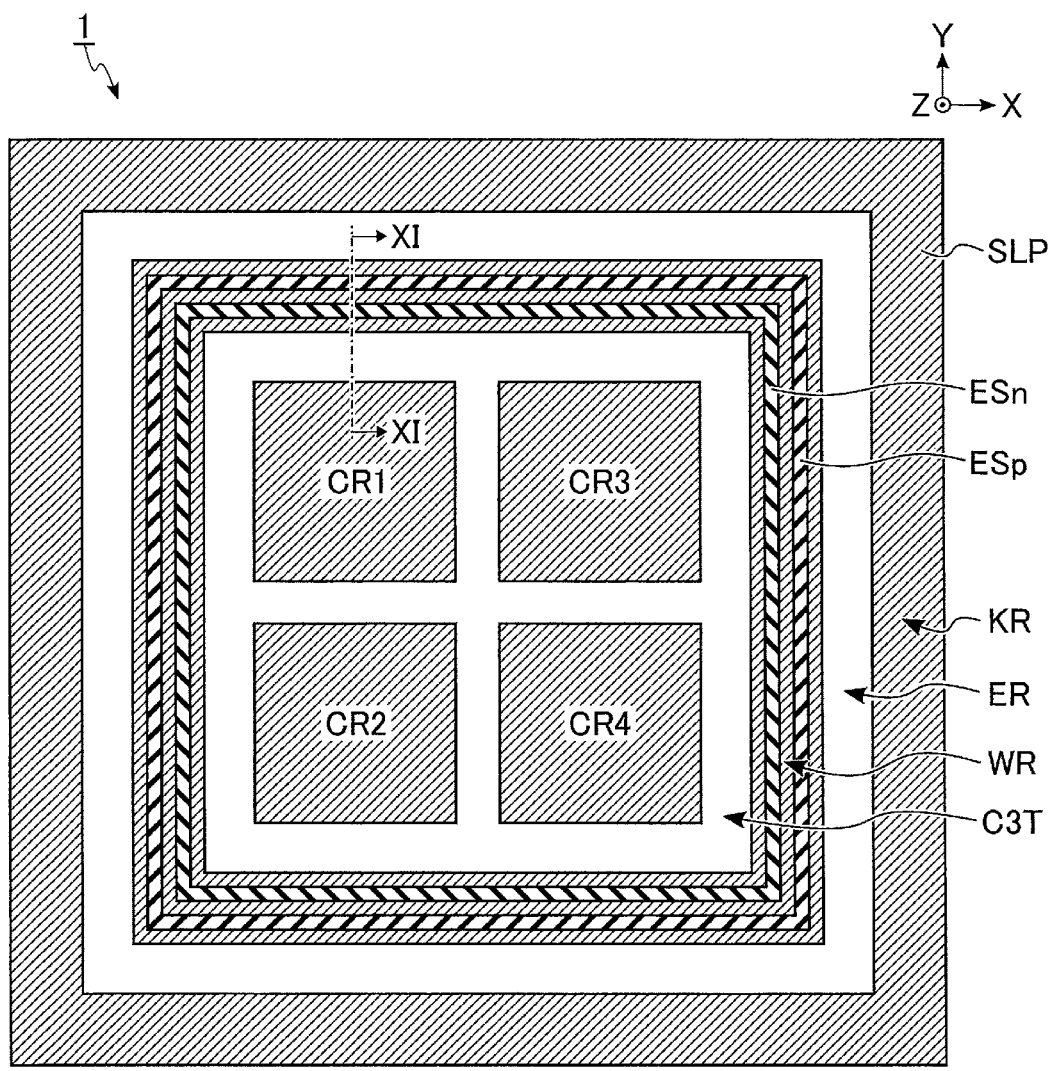
F I G. 10

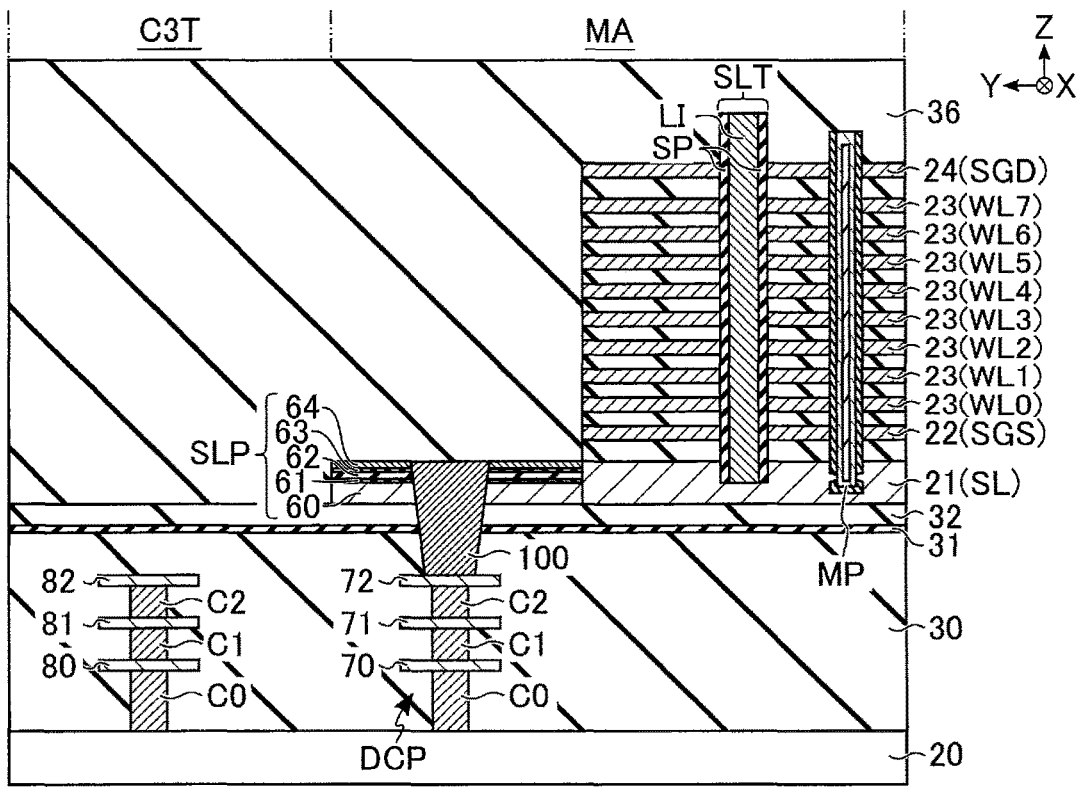
F I G. 22
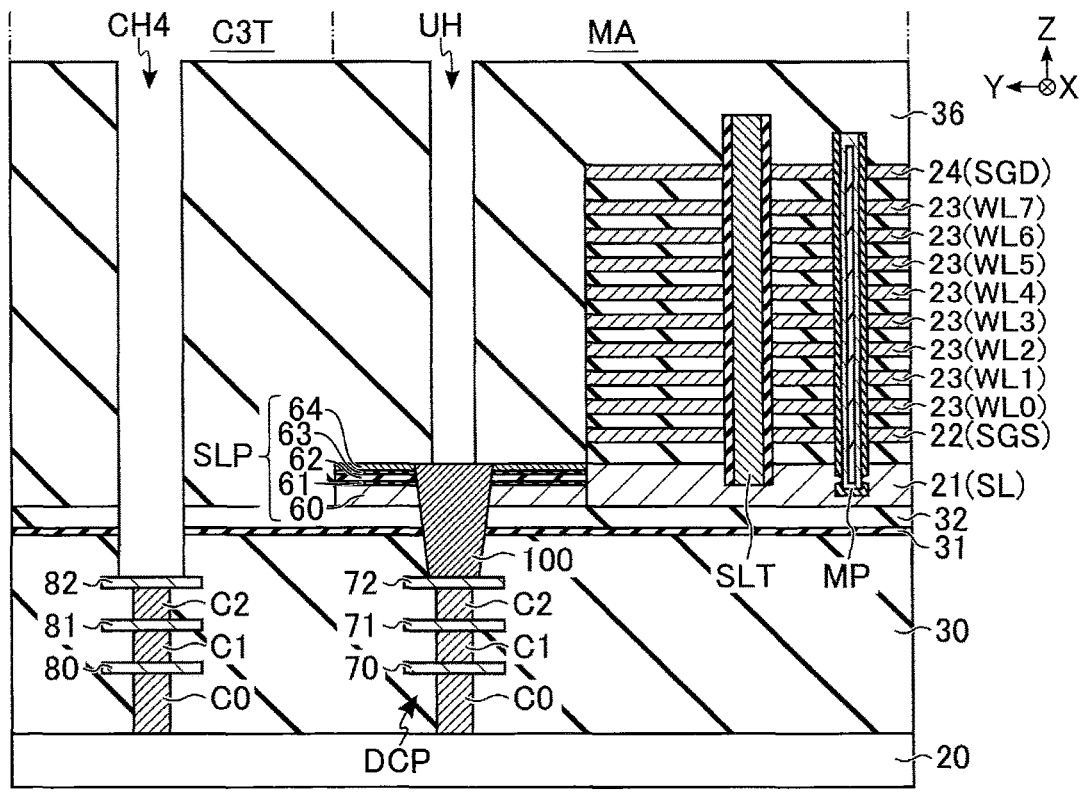
F I G. 23

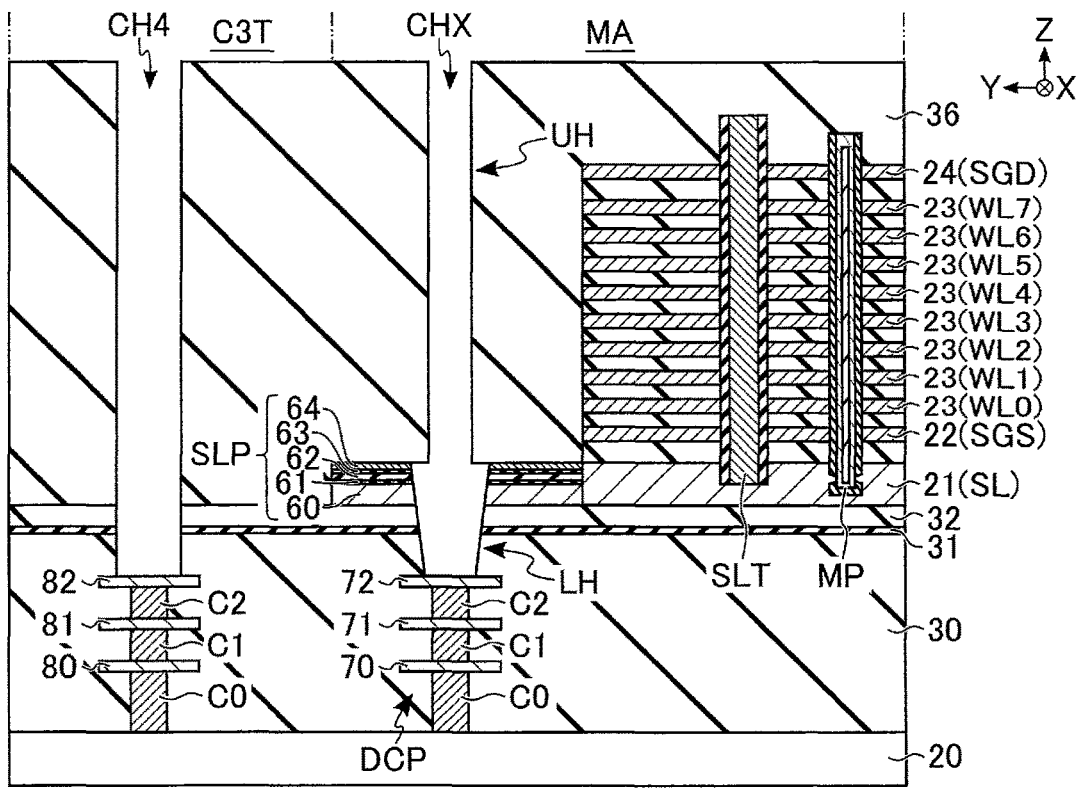
F I G. 24
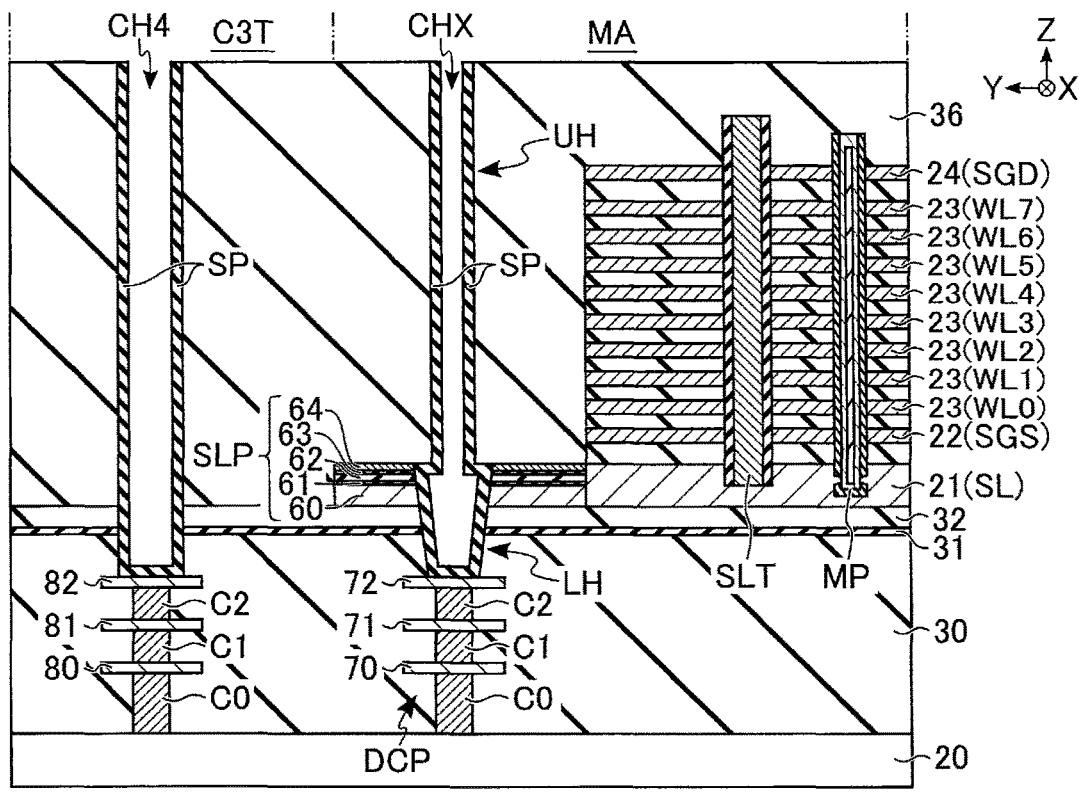
F I G. 25

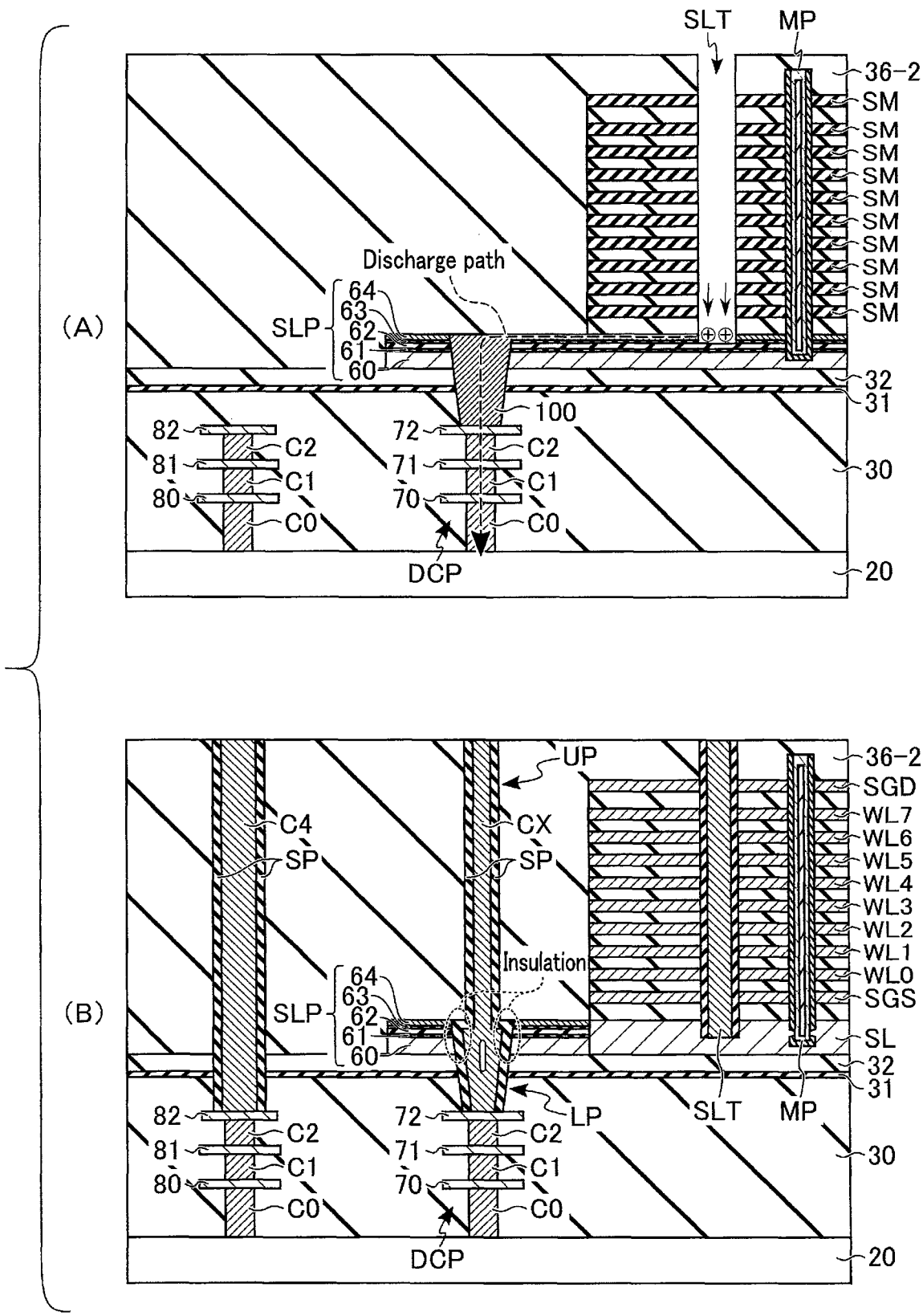
F I G. 28

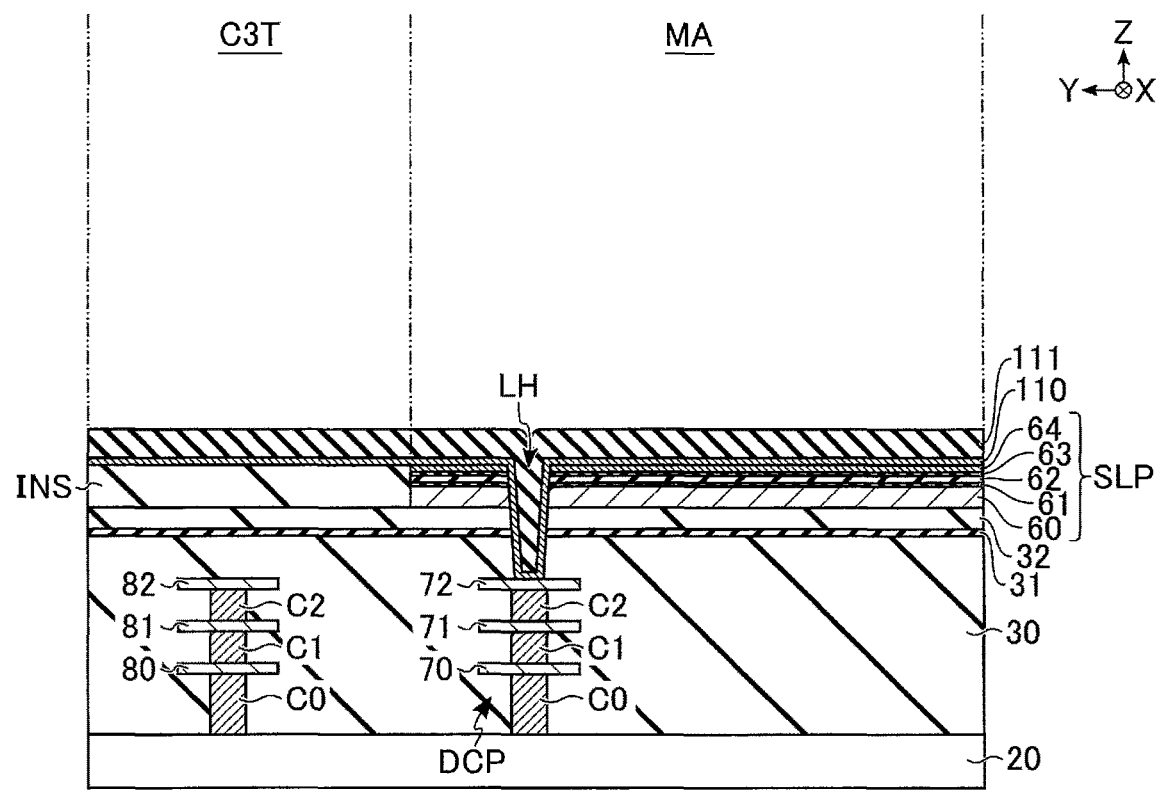
F I G. 31
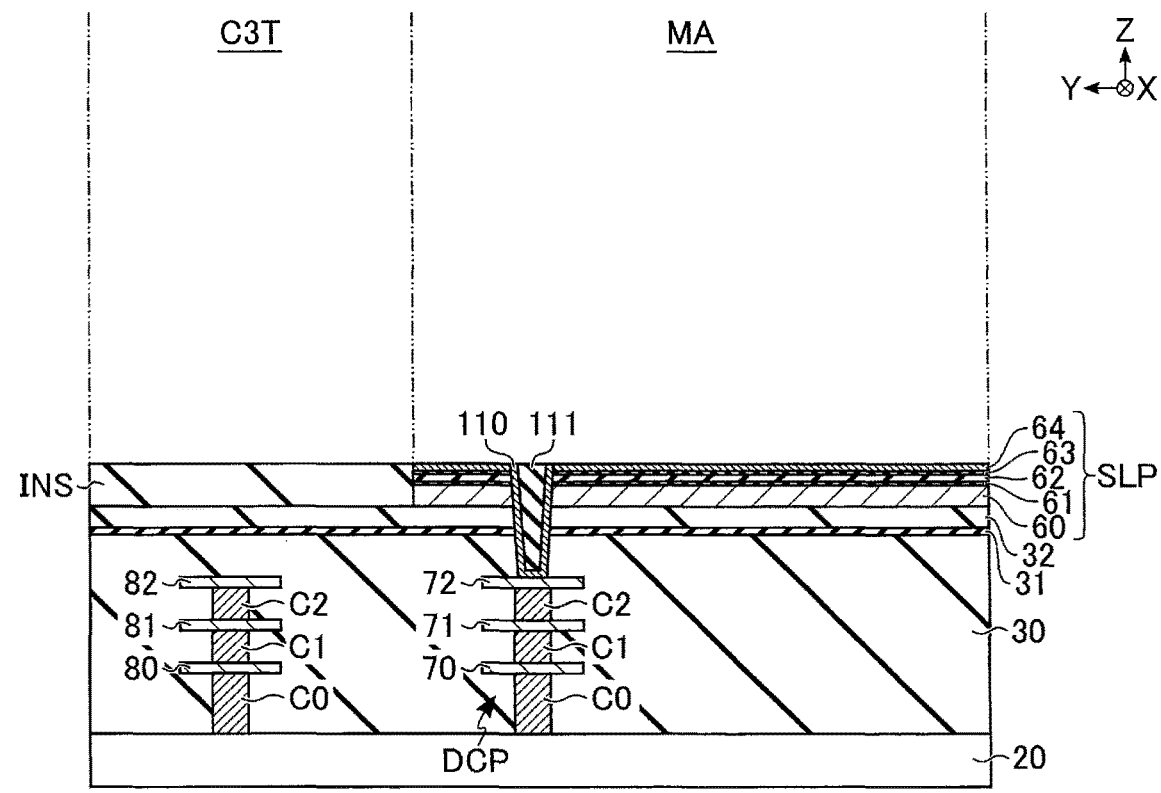
F I G. 32

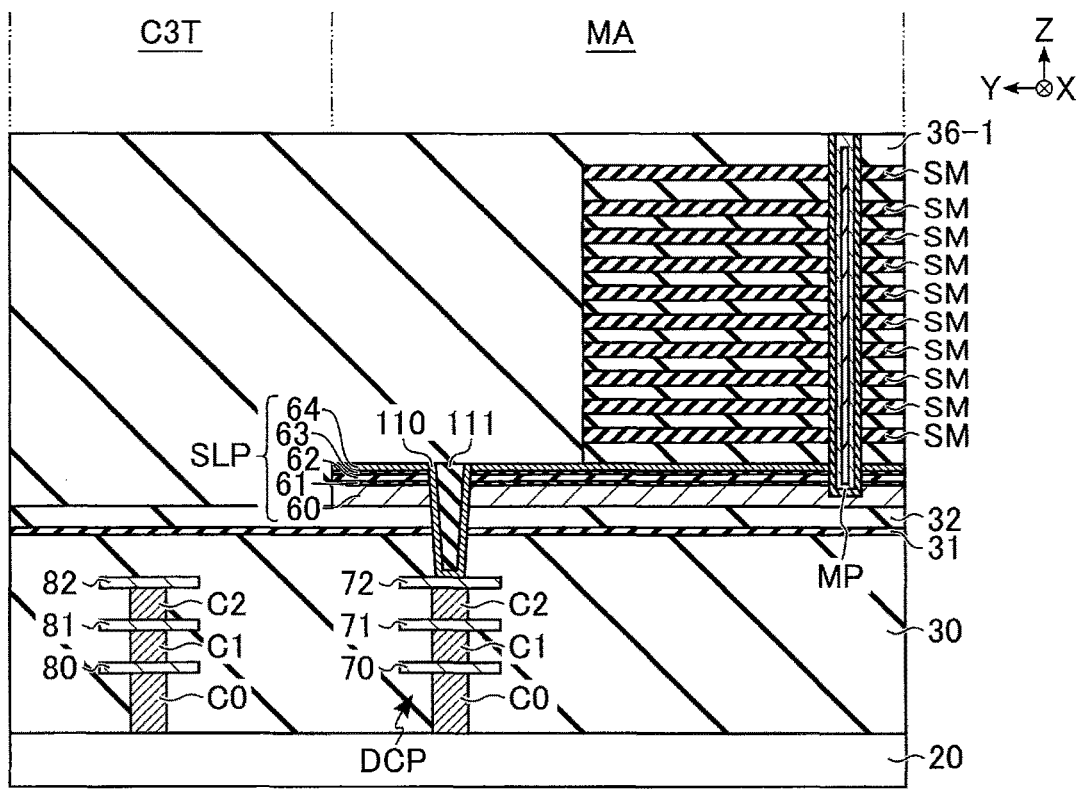
F I G. 33
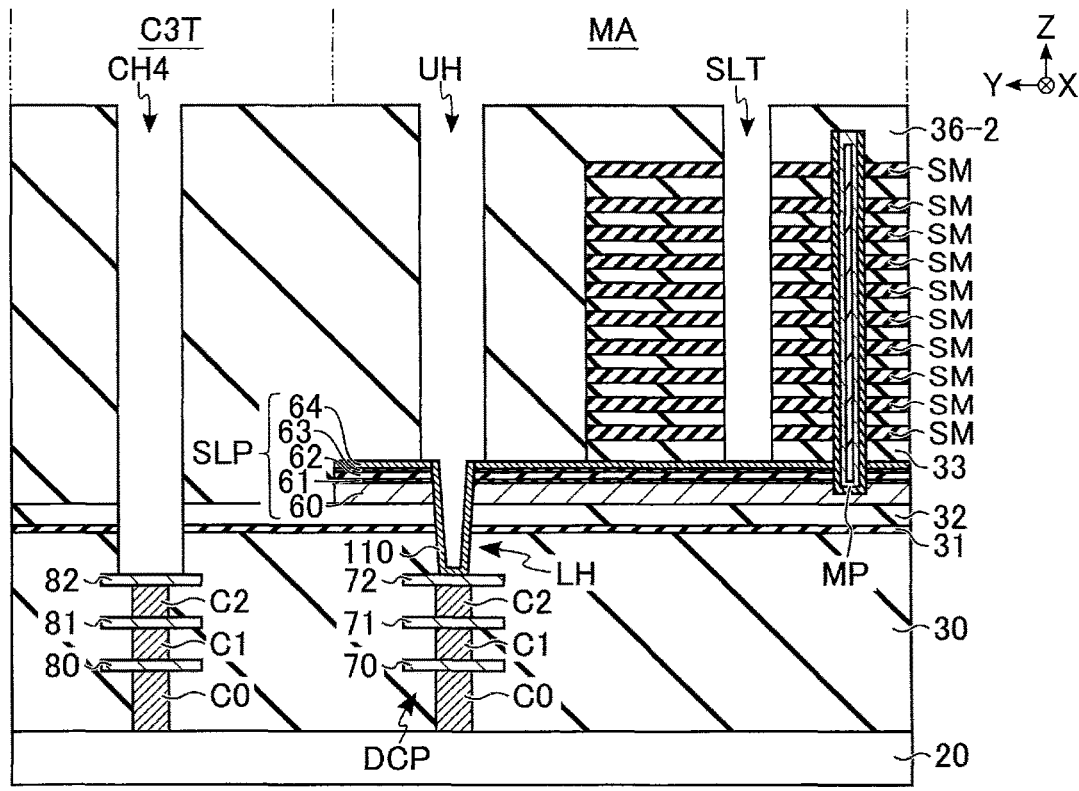
F I G. 34

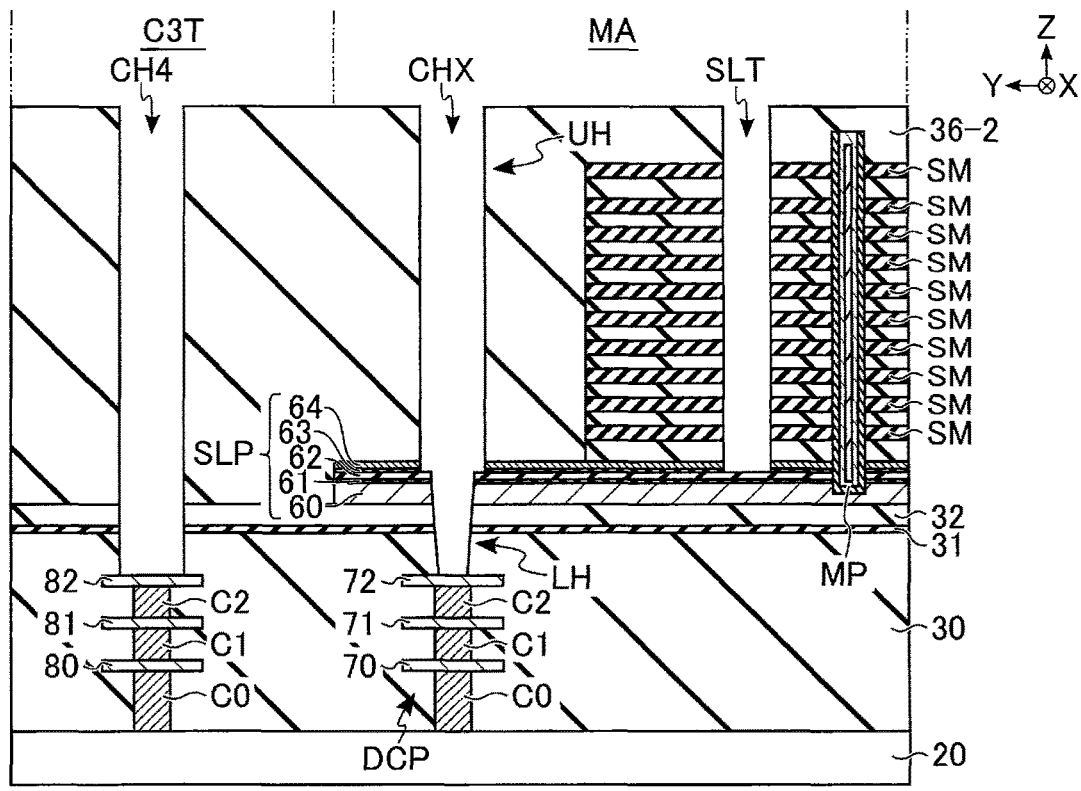
F I G. 35
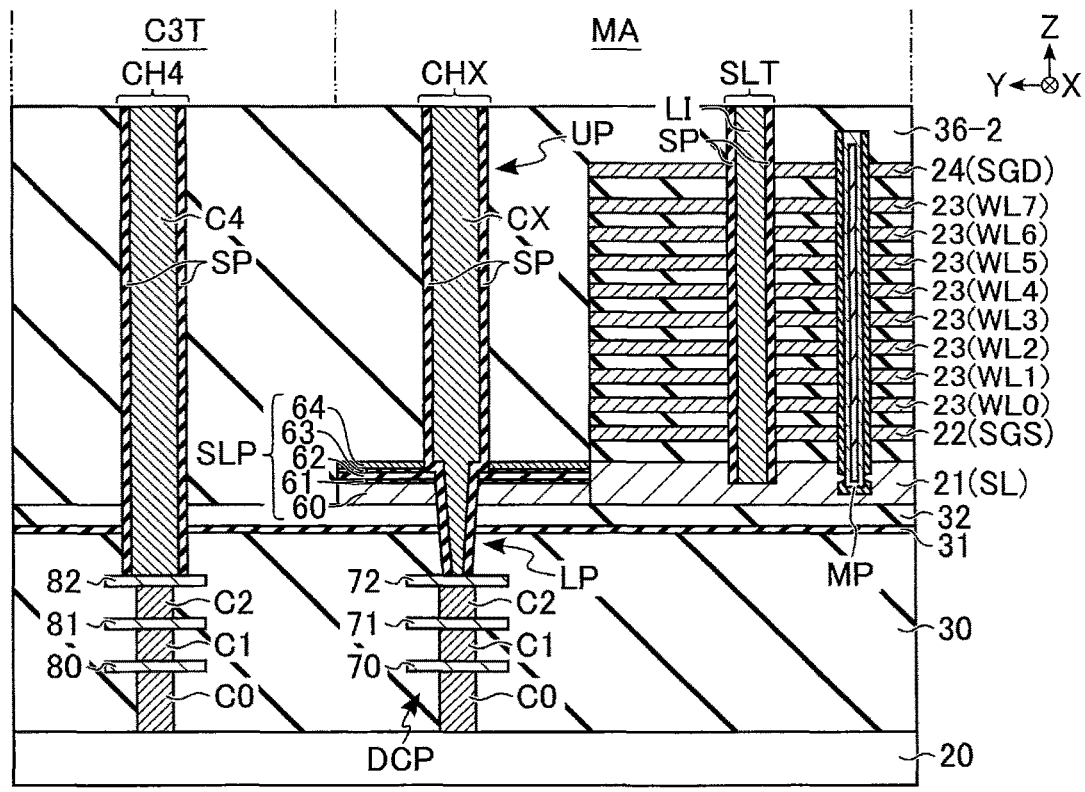
F I G. 36

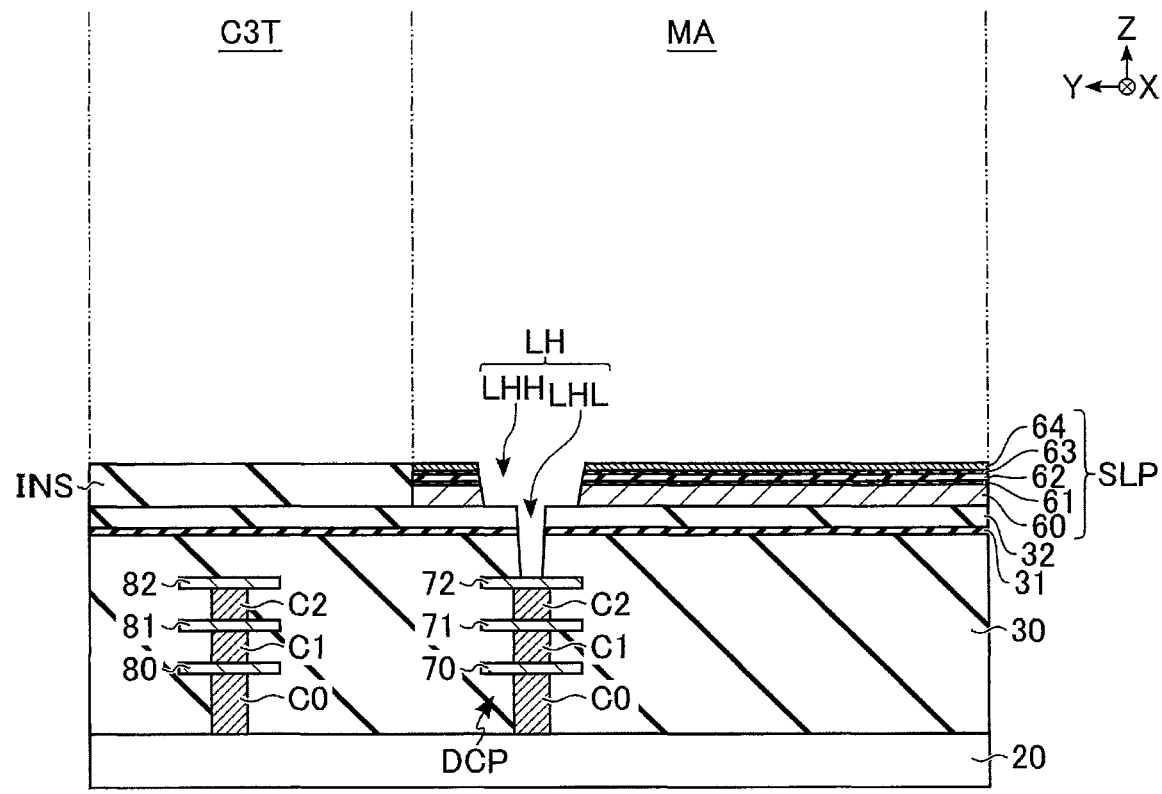
F I G. 39
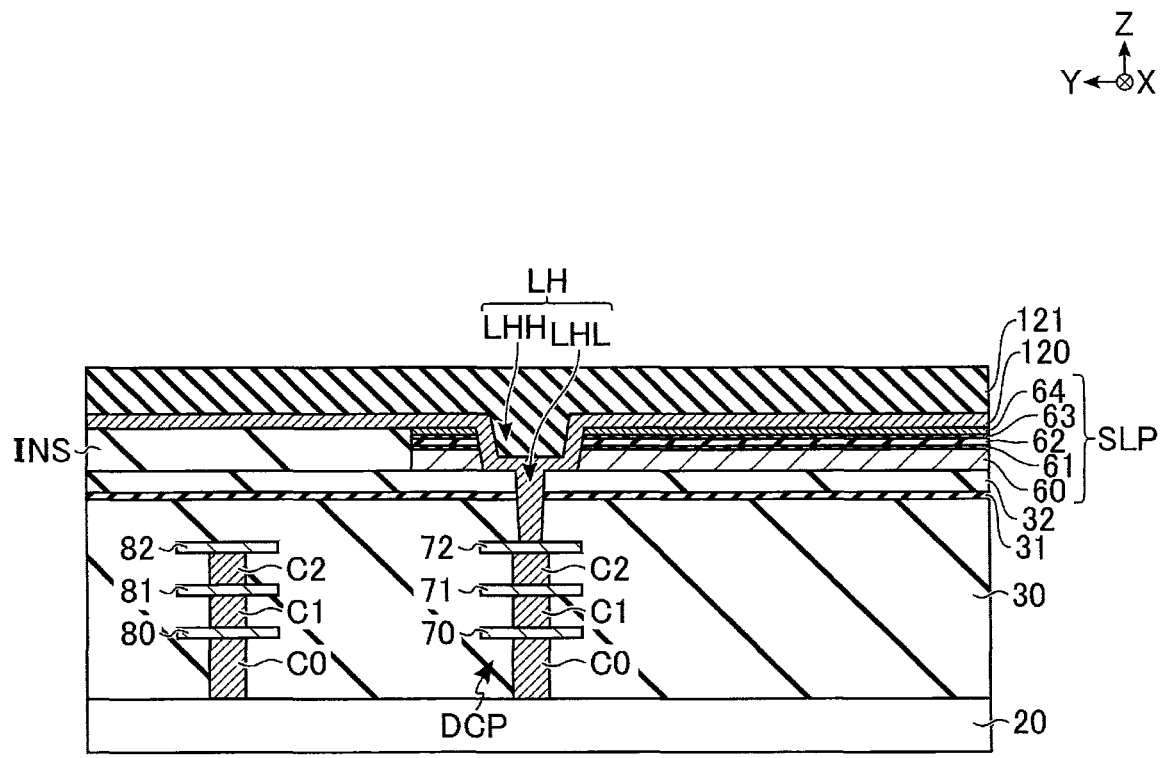
F I G. 40

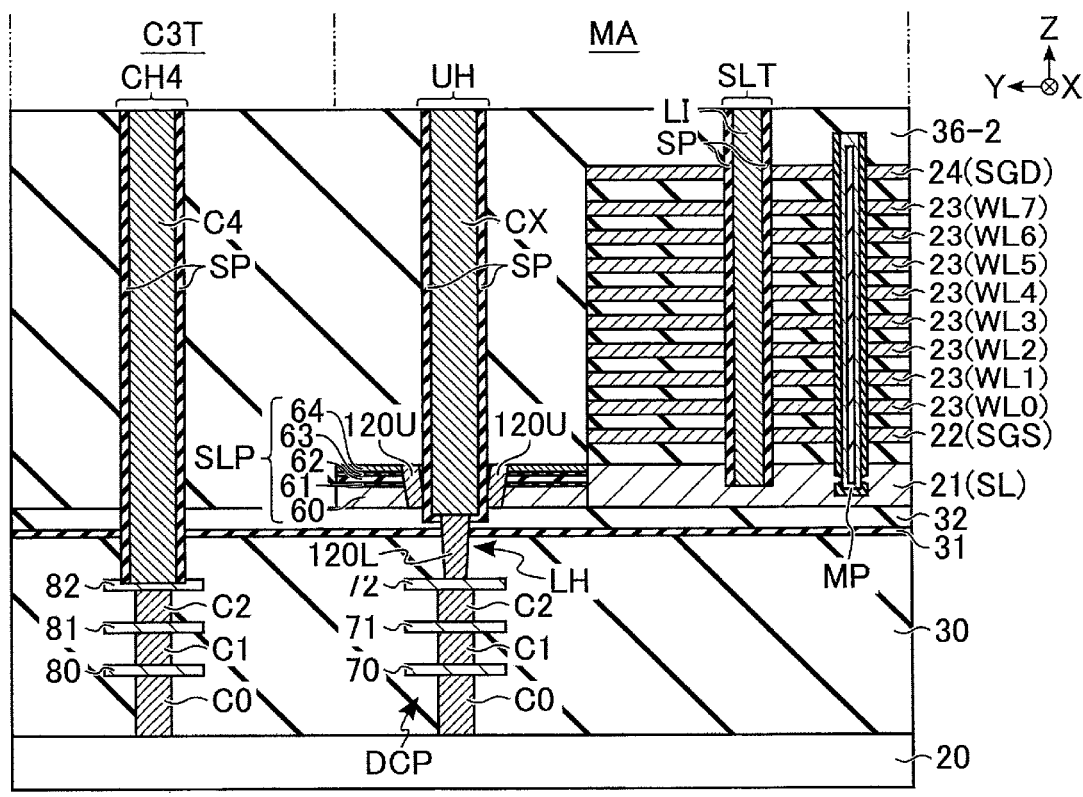
F I G. 45

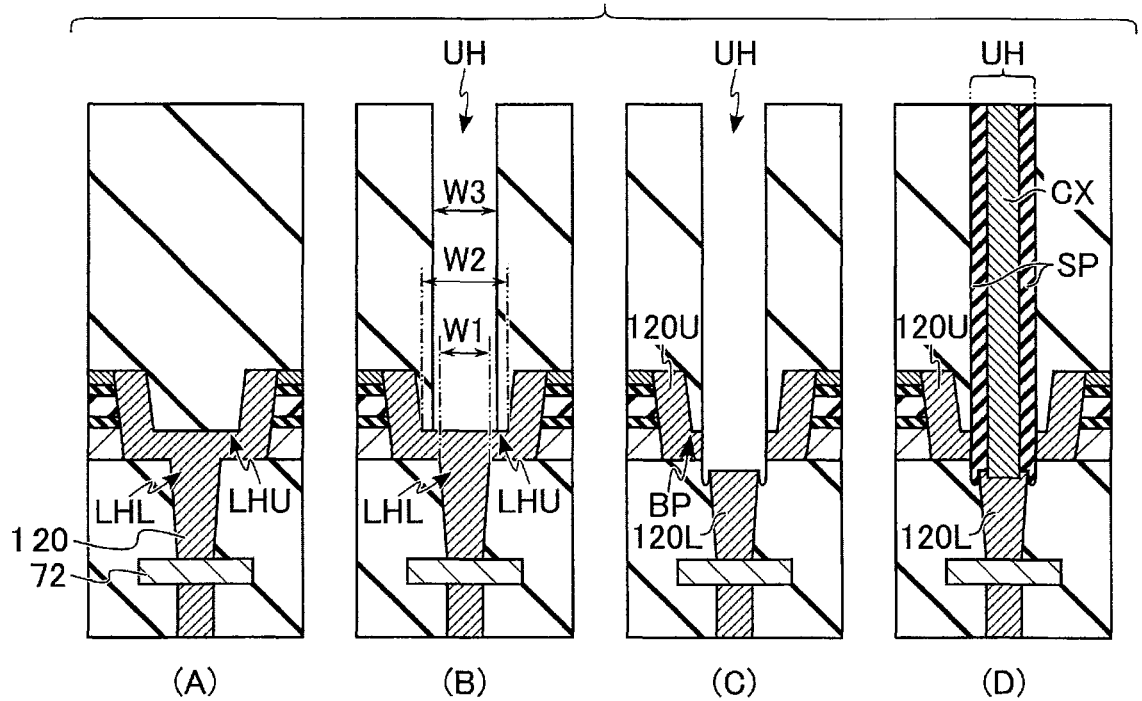
F I G. 46
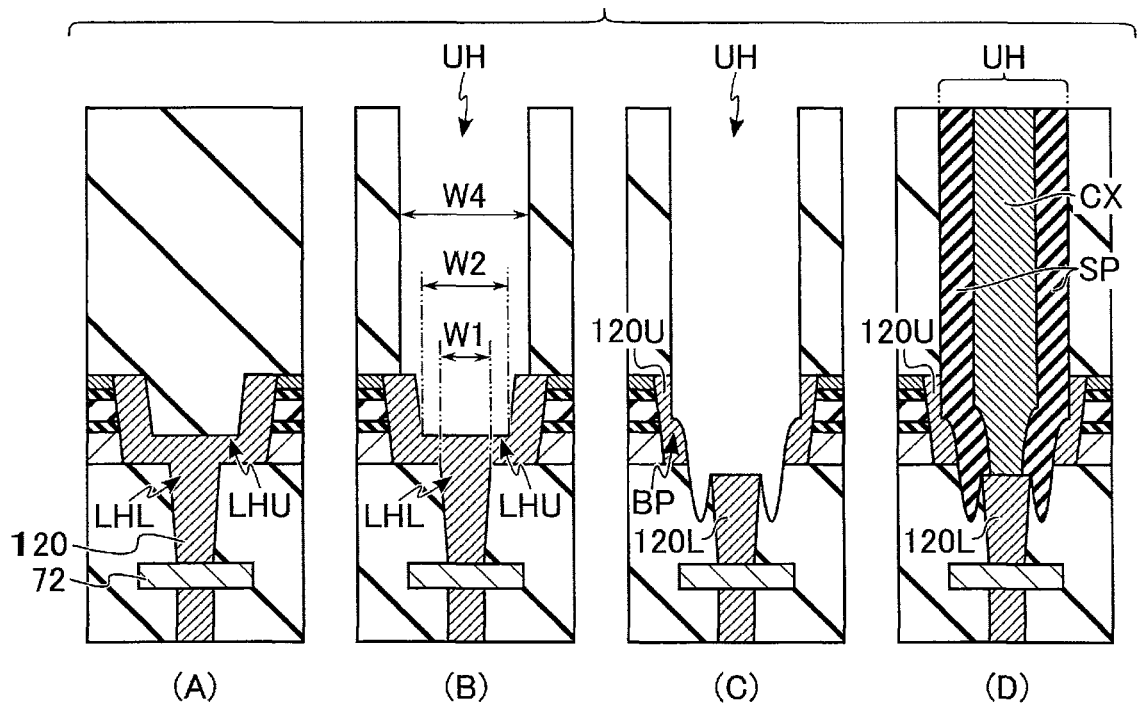
F I G. 47

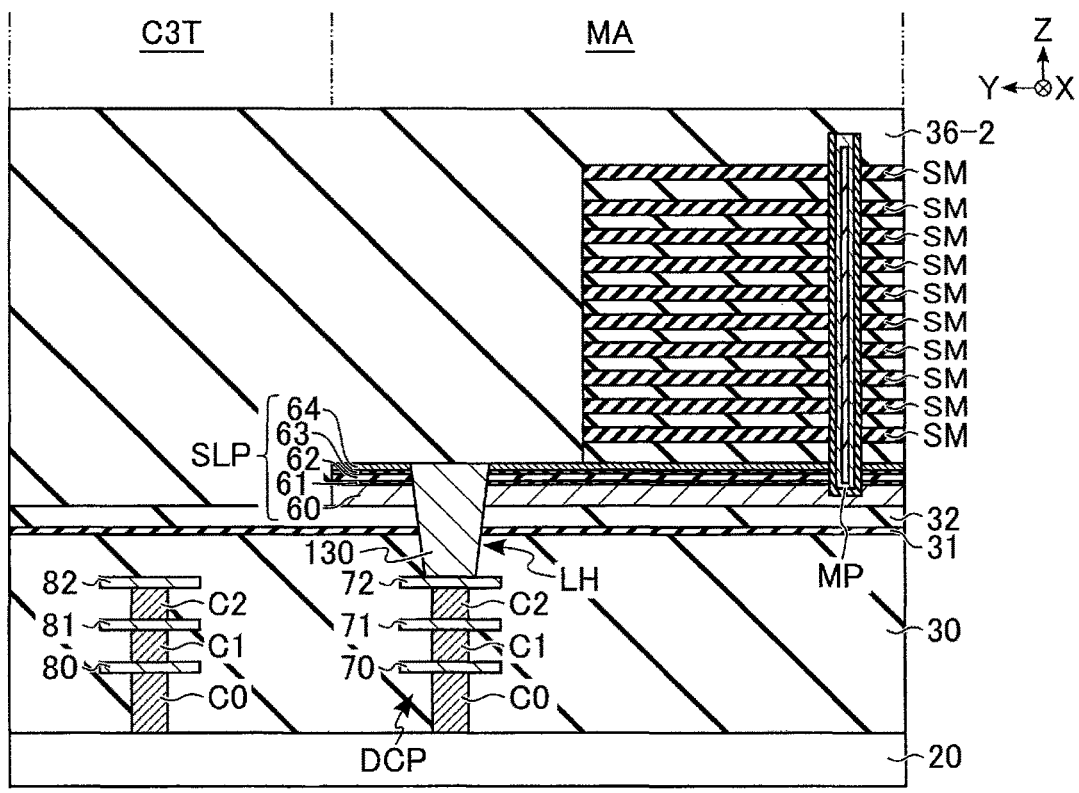
F I G. 49
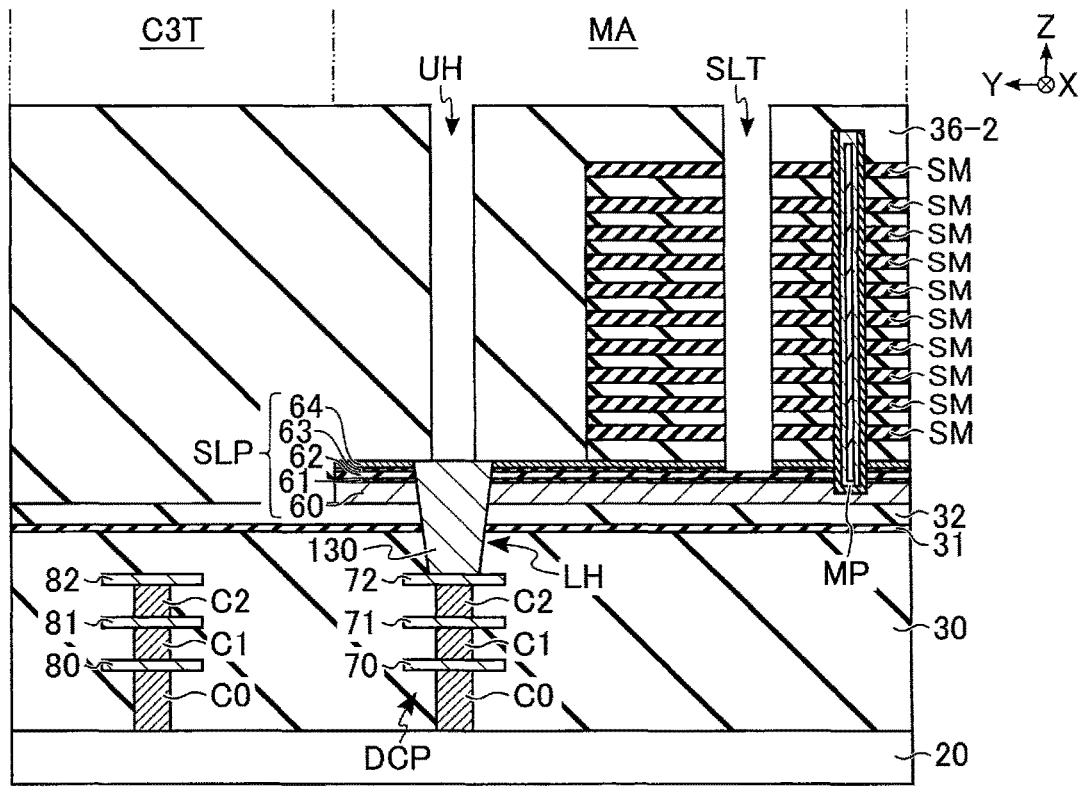
F I G. 50

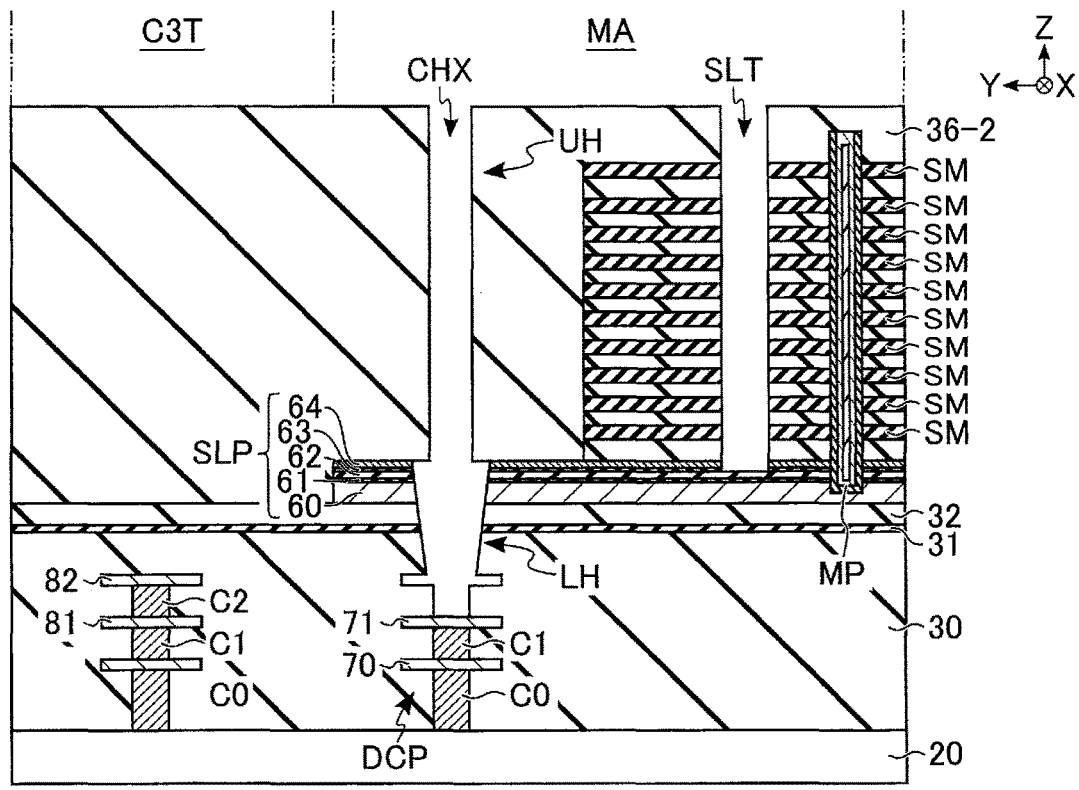
F I G. 51
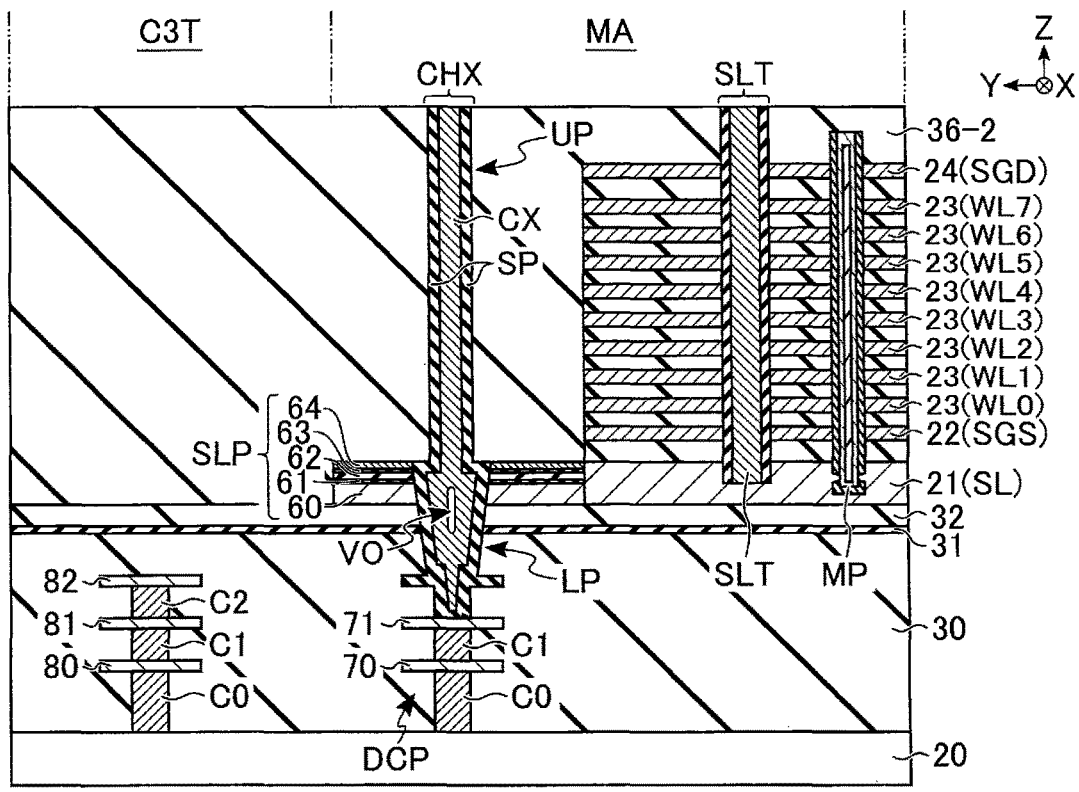
F I G. 52

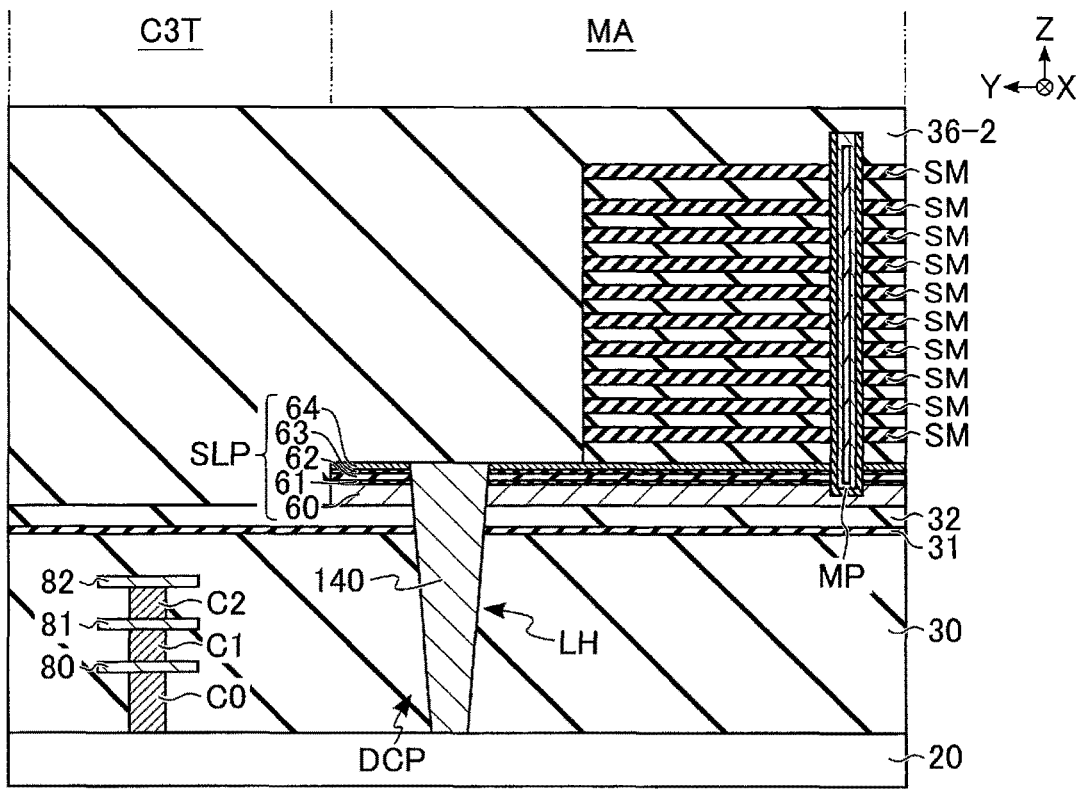
F I G. 54
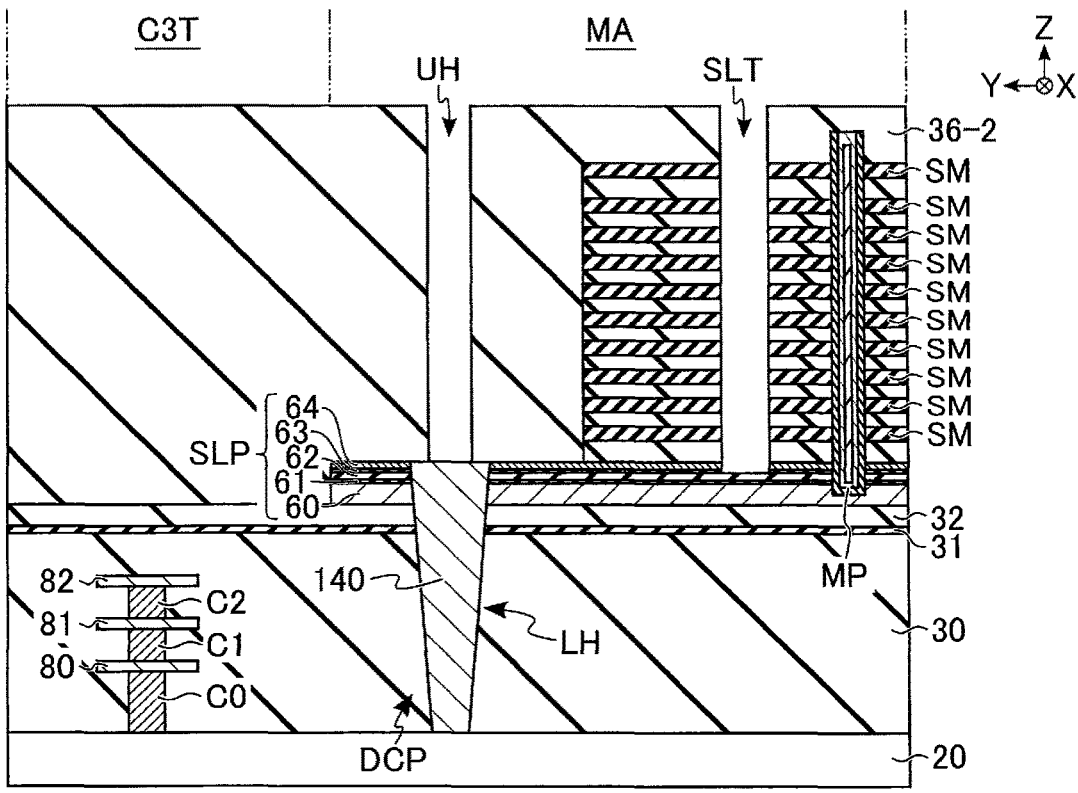
F I G. 55

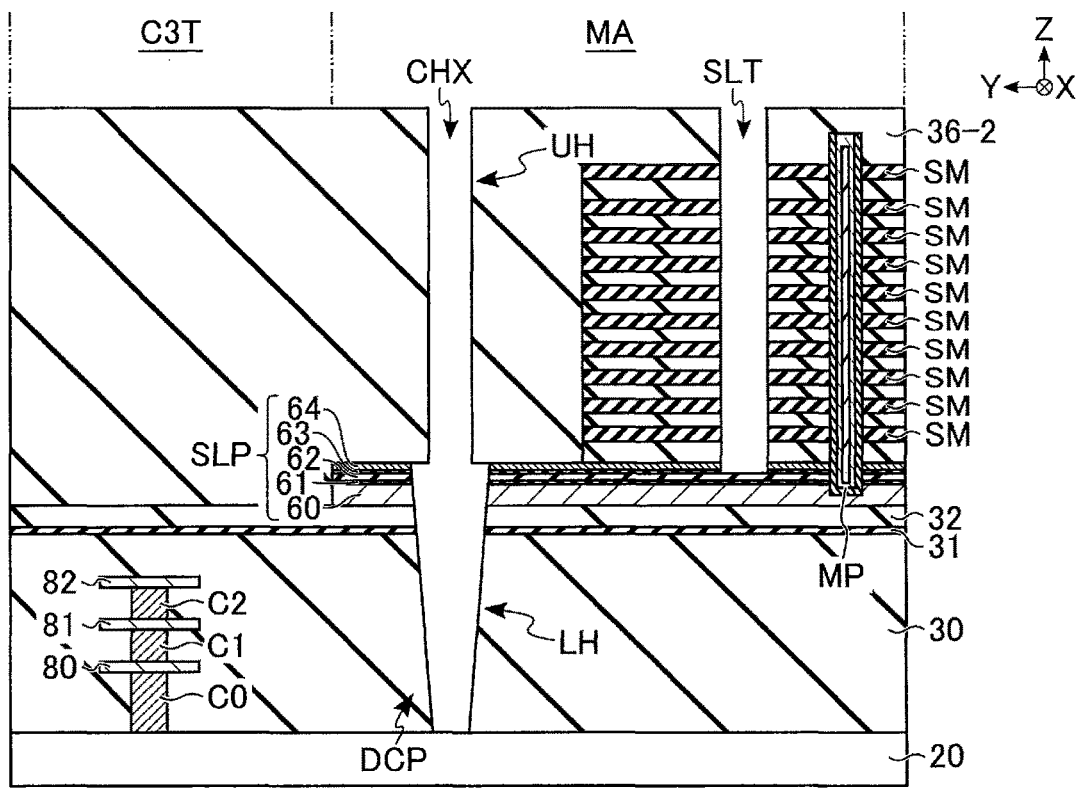
F I G. 56
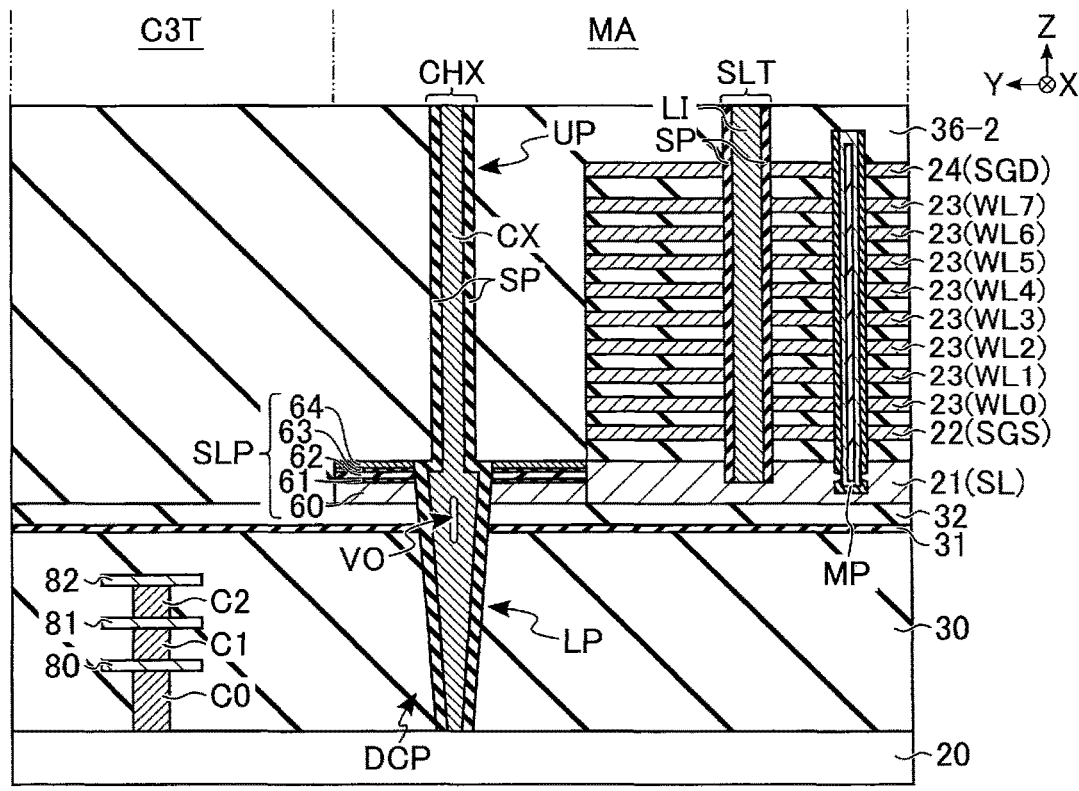
F I G. 57

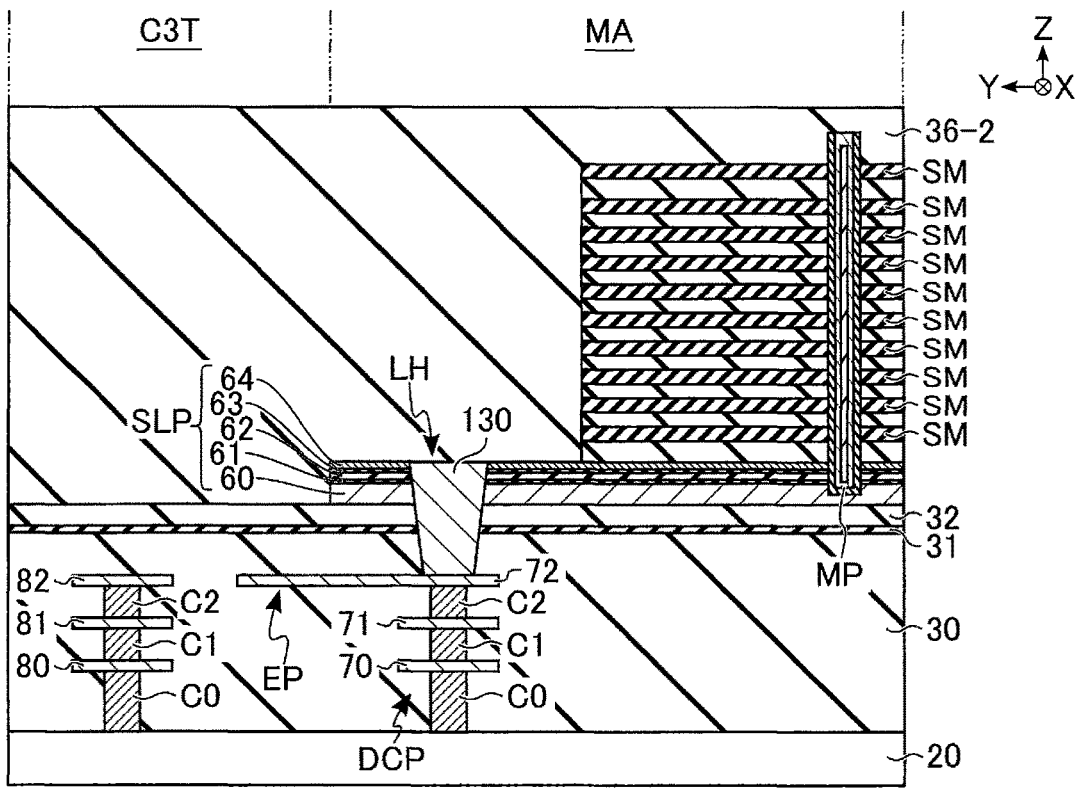
F I G. 59
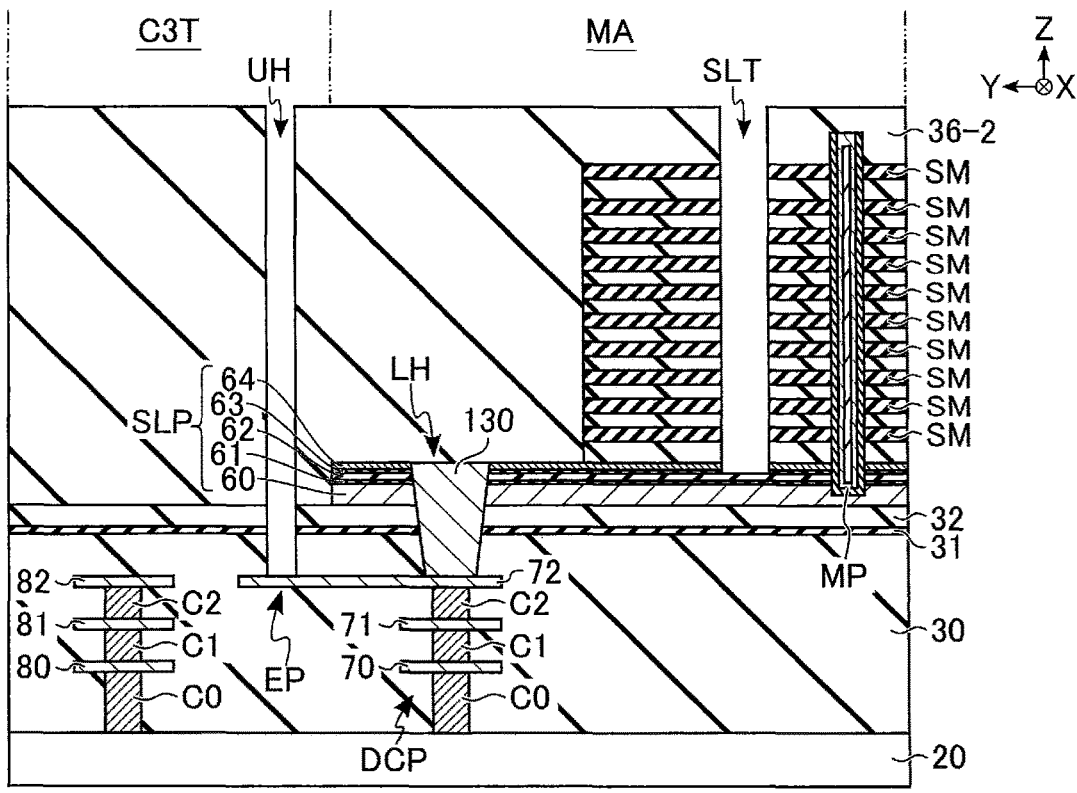
F I G. 60

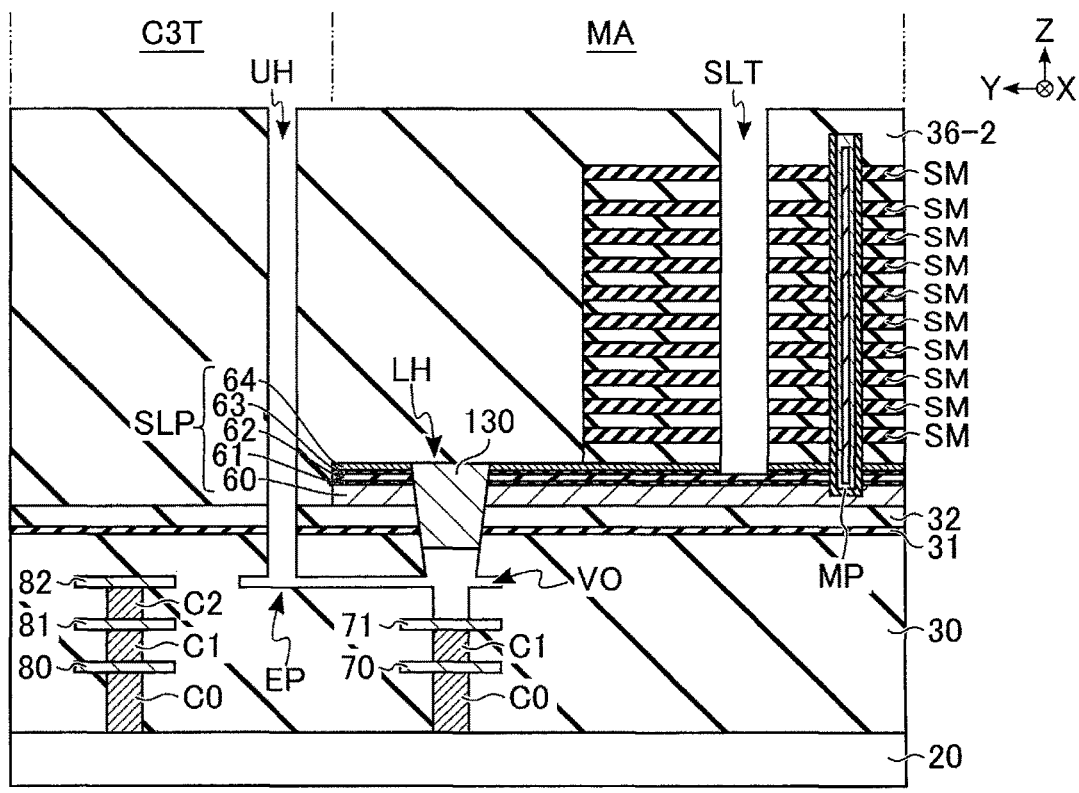
F I G. 61
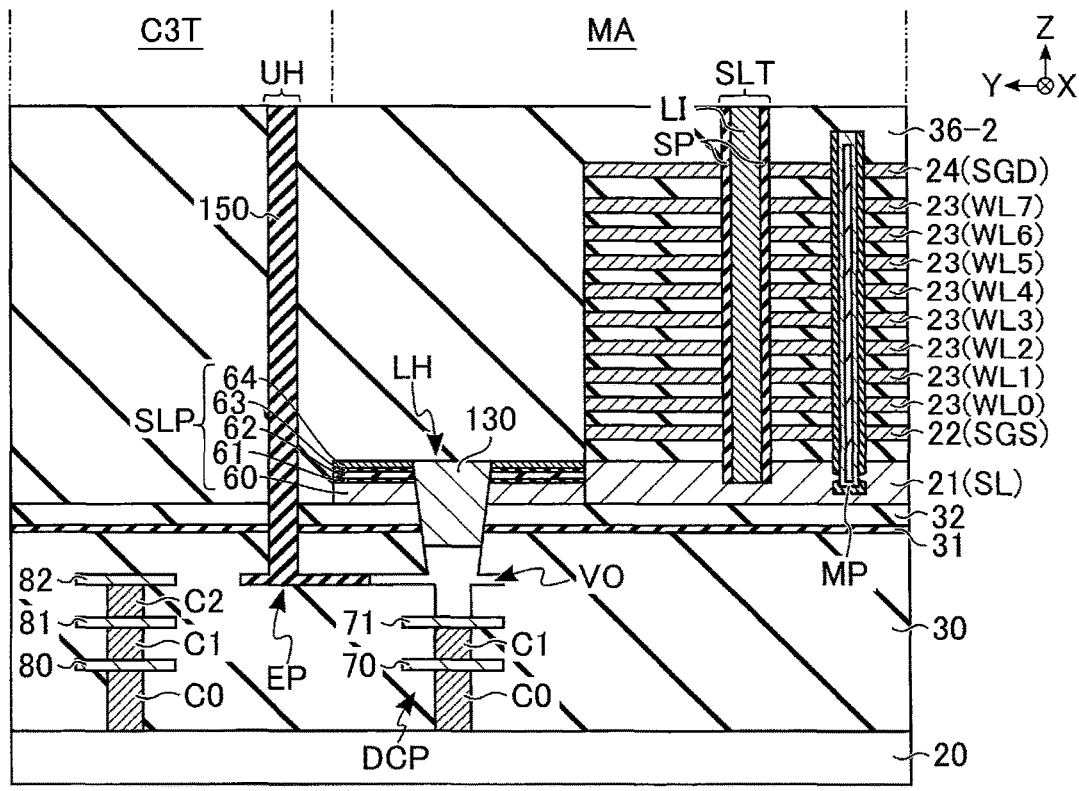
F I G. 62

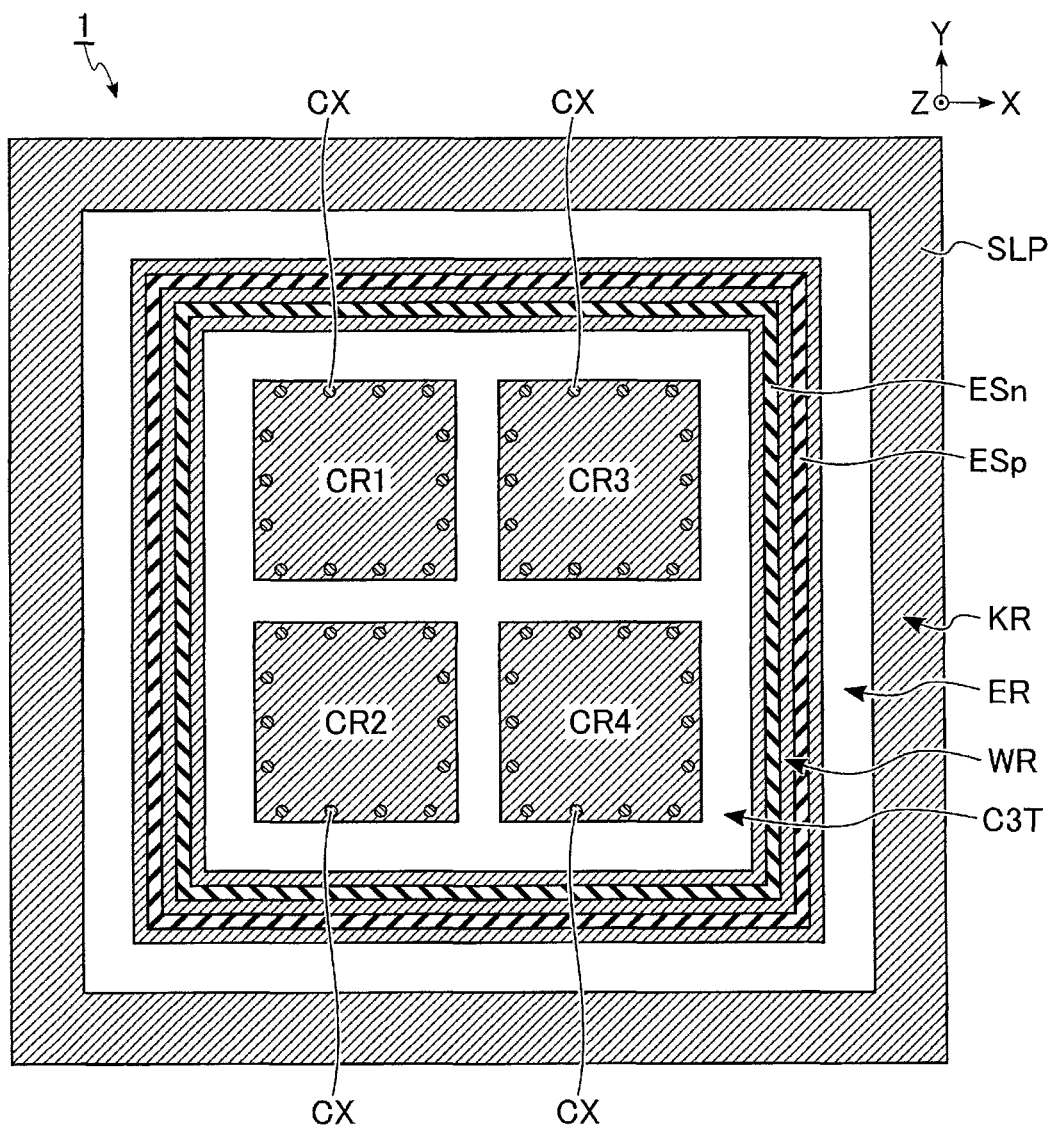
F I G. 63

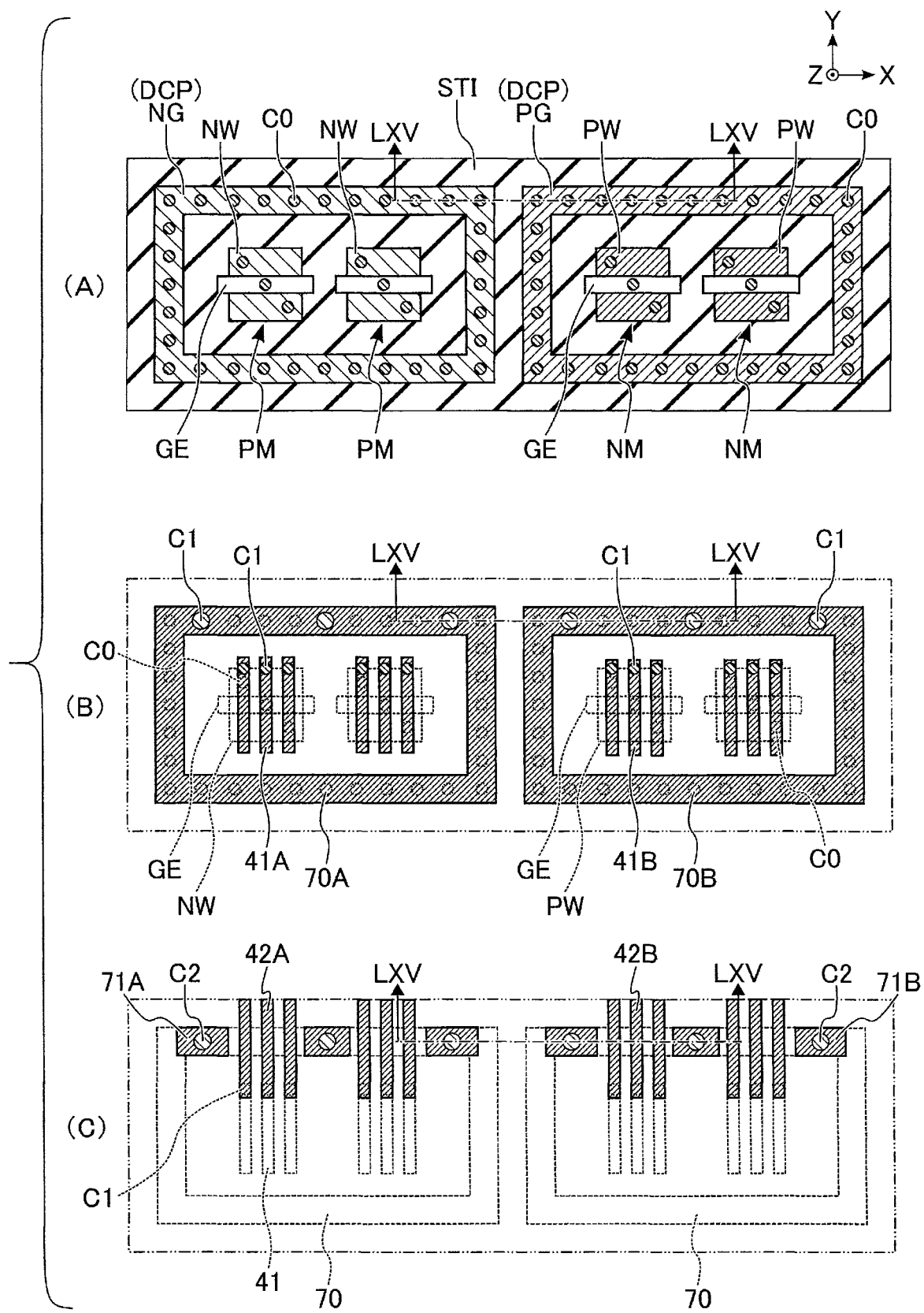
F I G. 64

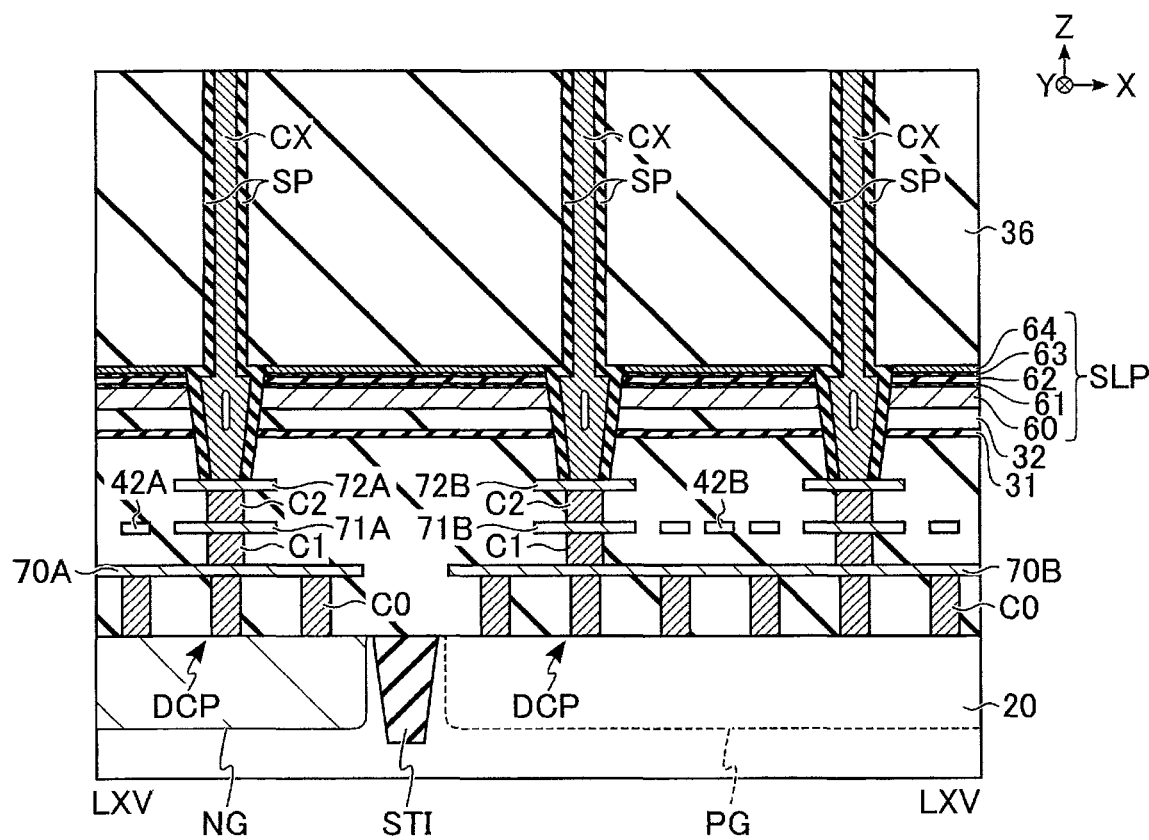
F I G. 65

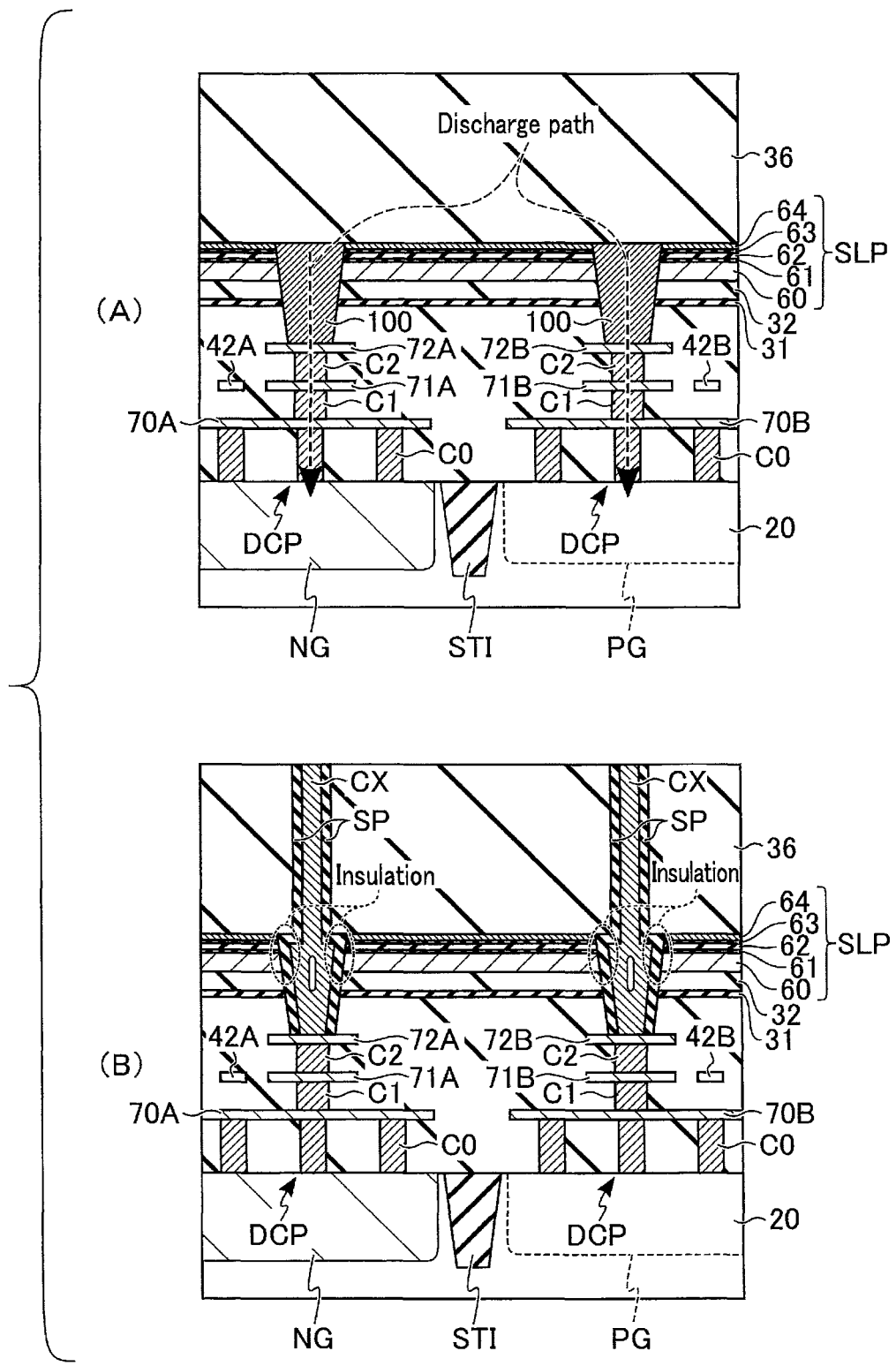
F I G. 66

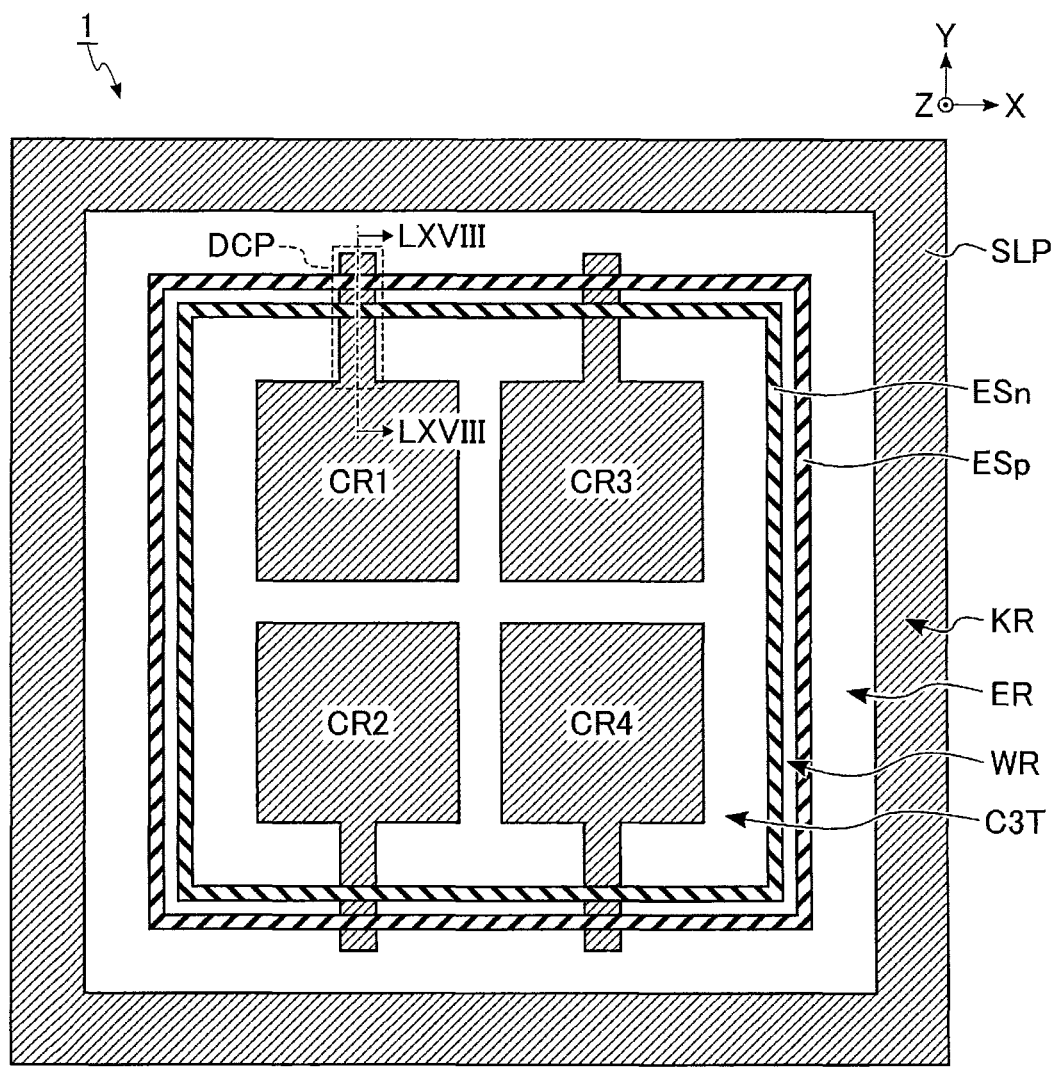
F I G. 67

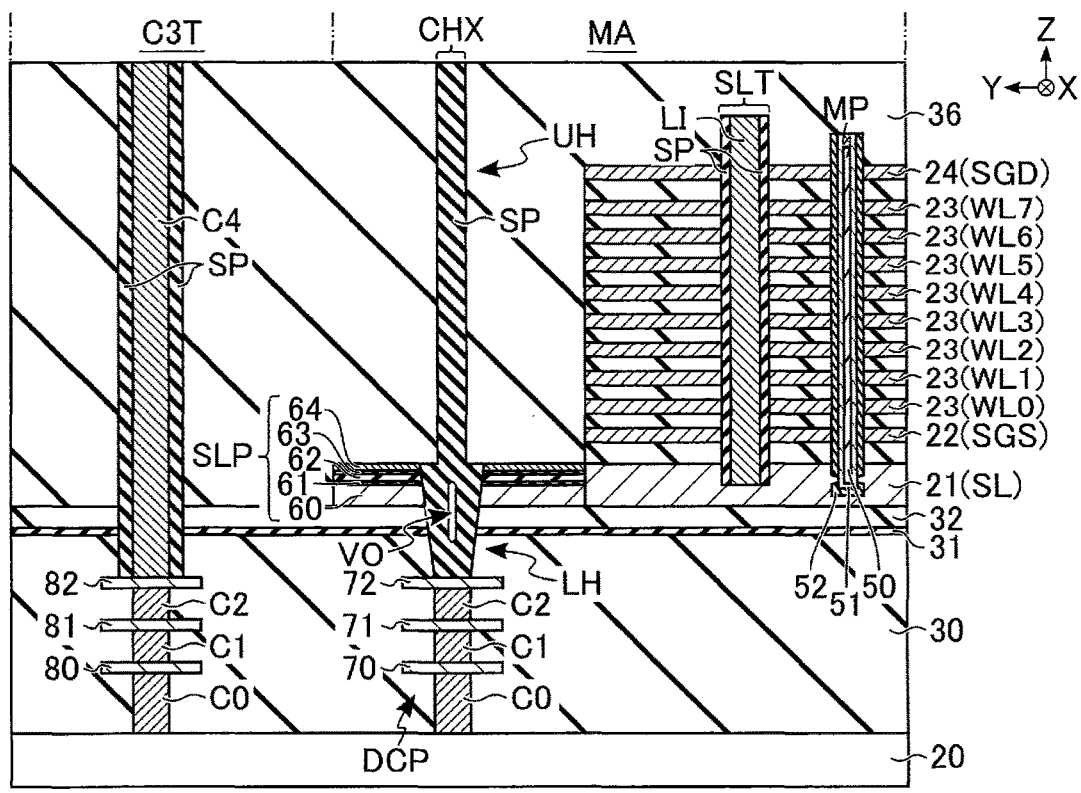
F I G. 70
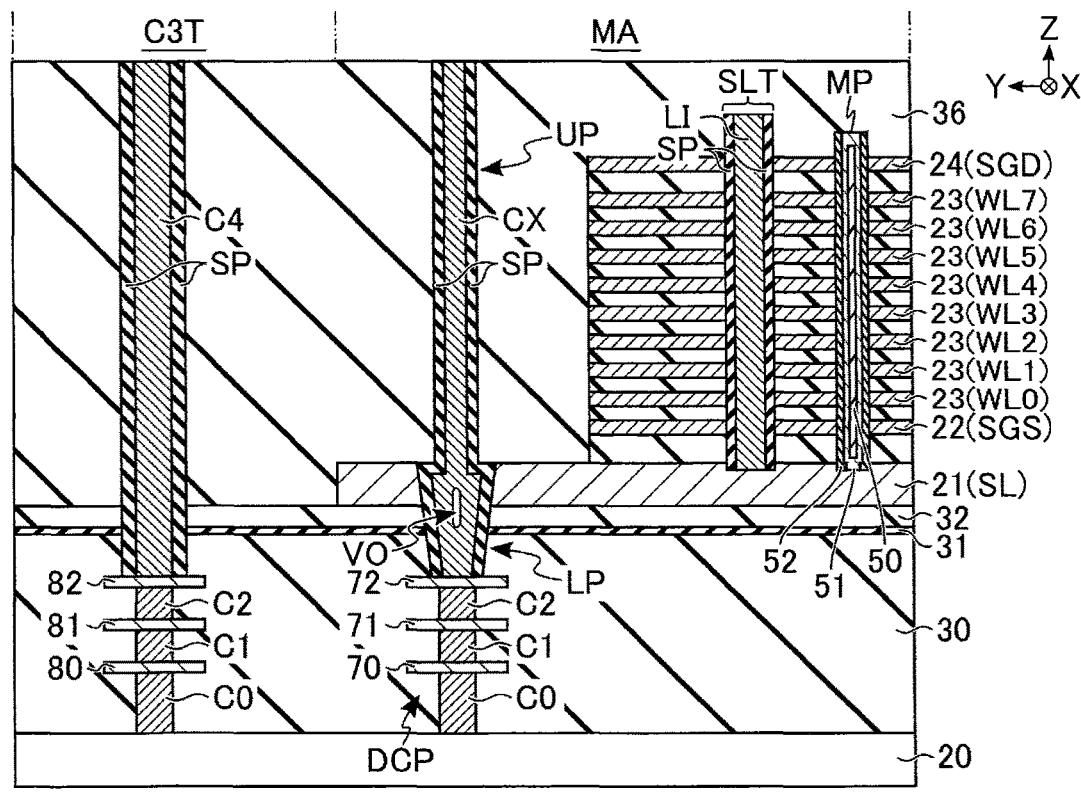
F I G. 71

SEMICONDUCTOR MEMORY DEVICE

CROSS-REFERENCE TO RELATED APPLICATIONS

This application is a continuation of and claims benefit under 35 U.S.C. § 120 to U.S. application Ser. No. 17/470,982, filed Sep. 9, 2021, which is based upon and claims the benefit of priority under 35 U.S.C. § 119 from Japanese Patent Application No. 2021-049130, filed Mar. 23, 2021, the entire contents of each of which are incorporated herein by reference.

FIELD

Embodiments described herein relate generally to a semiconductor memory device.

BACKGROUND

There is known a NAND-type flash memory capable of storing data in a nonvolatile manner.

BRIEF DESCRIPTION OF THE DRAWINGS

FIG. 2 is a circuit diagram illustrating an example of a circuit configuration of a memory cell array included in the semiconductor memory device according to the first embodiment;

FIG. 3 is a plan view illustrating an example of a plan layout of the semiconductor memory device according to the first embodiment;

FIG. 4 is a plan view illustrating an example of a plan layout in a core region of the semiconductor memory device according to the first embodiment;

FIG. 5 is a plan view illustrating an example of a plan layout in a memory region of the semiconductor memory device according to the first embodiment;

FIG. 6 is a cross-sectional view taken along a line VI-VI of FIG. 5, FIG. 6 illustrating an example of cross-sectional structure in the memory region of the semiconductor memory device according to the first embodiment;

FIG. 9 is a cross-sectional view taken along a line IX-IX of FIG. 8, FIG. 9 illustrating an example of cross-sectional structure in the hookup region and the contact region of the semiconductor memory device according to the first embodiment;

FIG. 10 is a plan view illustrating an example of a plan layout in a wiring layer including a source line of the semiconductor memory device according to the first embodiment;

FIGS. 14, 15, 16, 17, 18, 19, 20, 21, 22, 23, 24, 25, 26, 27 and 28 are cross-sectional views illustrating an example of cross-sectional structure during manufacturing of the semiconductor memory device according to the first embodiment;

FIGS. 31, 32, 33, 34, 35 and 36 are cross-sectional views illustrating an example of cross-sectional structure during manufacturing of the semiconductor memory device according to the second embodiment;

FIGS. 39, 40, 41, 42, 43, 44 and 45 are cross-sectional views illustrating an example of cross-sectional structure during manufacturing of the semiconductor memory device according to the third embodiment;

FIGS. 46 and 47 are cross-sectional views illustrating an example of cross-sectional structure during manufacturing of the semiconductor memory device according to the third embodiment;

FIGS. 49, 50, 51 and 52 are cross-sectional views illustrating an example of cross-sectional structure during manufacturing of the semiconductor memory device according to the fourth embodiment;

FIGS. 54, 55, 56 and 57 are cross-sectional views illustrating an example of cross-sectional structure during manufacturing of the semiconductor memory device according to the fifth embodiment;

FIGS. 59, 60, 61 and 62 are cross-sectional views illustrating an example of cross-sectional structure during manufacturing of the semiconductor memory device according to the sixth embodiment;

FIG. 63 is a plan view illustrating an example of a plan layout in a wiring layer including a source line of a semiconductor memory device according to a seventh embodiment;

FIG. 64 is a plan view illustrating an example of a plan layout of an element formation region of the semiconductor memory device according to the seventh embodiment;

FIG. 65 is a cross-sectional view taken along a line LXV-LXV of FIG. 64, FIG. 65 illustrating an example of cross-sectional structure of the element formation region of the semiconductor memory device according to the seventh embodiment;

FIG. 66 is a cross-sectional view illustrating an example of cross-sectional structure during manufacturing of the semiconductor memory device according to the seventh embodiment;

FIG. 67 is a plan view illustrating an example of a plan layout in a wiring layer including a source line of a semiconductor memory device according to an eighth embodiment;

FIG. 70 is a cross-sectional view illustrating an example of cross-sectional structure in a memory region and a contact region of a semiconductor memory device according to a first modification; and FIG. 71 is a cross-sectional view illustrating an example of cross-sectional structure of a memory region and a contact region of a semiconductor memory device according to a second modification.

DETAILED DESCRIPTION

In general, according to one embodiment, a semiconductor memory device includes a substrate, a source line, a plurality of word lines, a pillar, and a first member. The source line is provided above the substrate. The word lines are provided above the source line. The word lines are spaced apart from each other in a first direction intersecting a surface of the substrate. The pillar is provided to extend in the first direction. A bottom portion of the pillar reaches the source line. Each of intersection portions between the pillar and the word lines functions as a memory cell. The first member is provided to extend in the first direction and to penetrate the source line. The first member includes a first portion which is far from the substrate, and a second portion which is near the substrate. The first member includes a first contact and a first insulating film. The first contact is provided to extend in the first direction from the first portion to the second portion. The first contact is electrically connected to the substrate. The first insulating film is provided continuously on a side surface portion of the first contact. The first insulating film insulates the source line from the first contact. The first member includes a stepped portion at a boundary part between the first portion and the second portion.

Hereinafter, embodiments will be described with reference to the drawings. Each embodiment exemplifies a device or method for embodying a technical idea of the invention. The drawings are schematic or conceptual, and the dimensions and ratios of each drawing are not always the same as the actual ones. The technical idea of the present invention is not specified by the shape, structure, arrangement, and the like of constituent elements.

Note that, in the following description, constituent elements having substantially the same functions and configurations are denoted by the same signs. A number after a character constituting a reference sign is used for distinguishing between elements that are referred to by a reference sign including the same character and have similar configurations. When it is not necessary to distinguish between elements indicated by a reference sign including the same character, each of these elements is referred to by the reference sign including only the character.

[1] First Embodiment

Hereinafter, a semiconductor memory device 1 according to a first embodiment will be described.

[1-1] Configuration of Semiconductor Memory Device 1

[1-1-1] Overall Configuration of Semiconductor Memory Device 1

Figure 1:
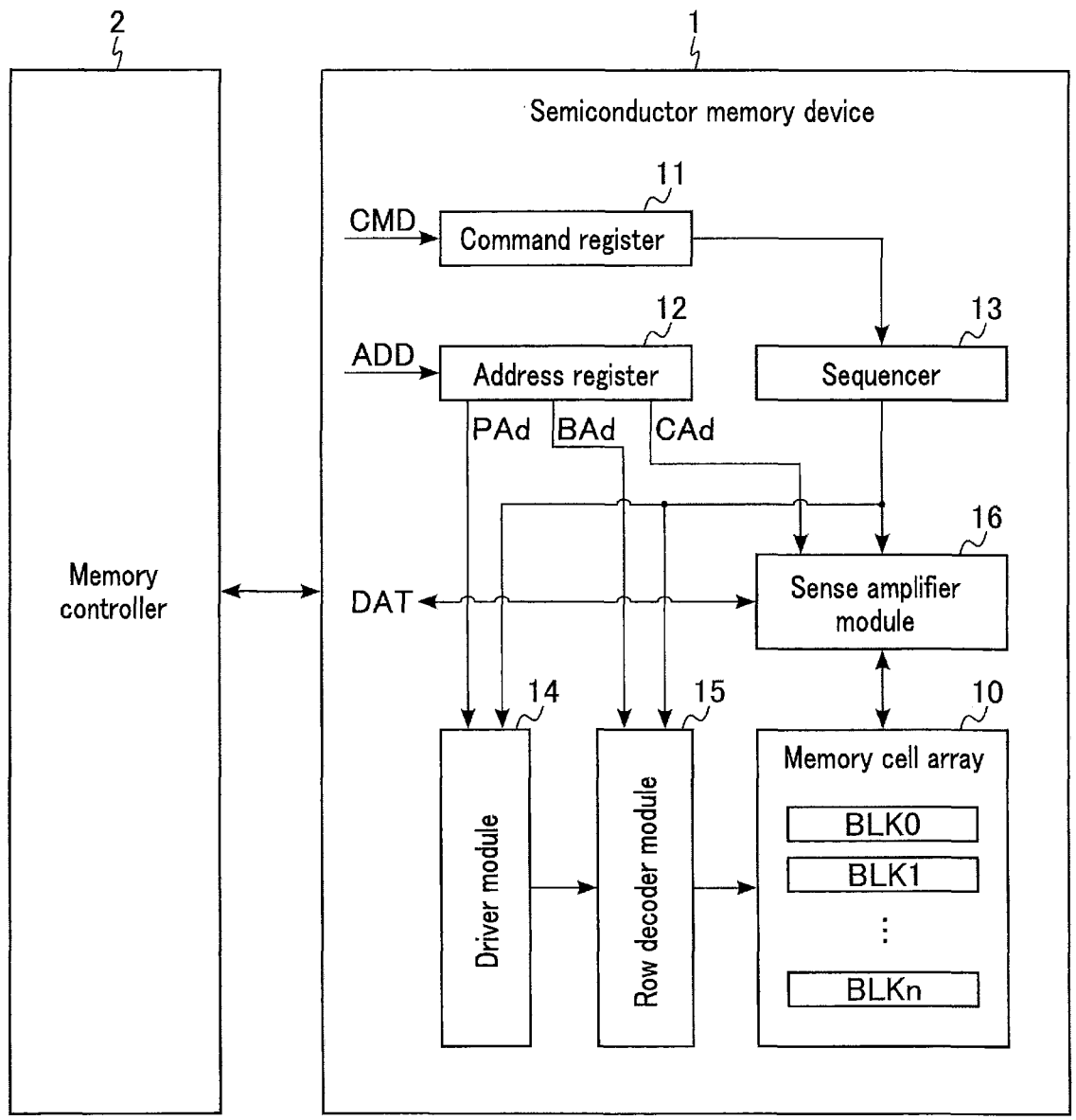
FIG. 1 is a block diagram illustrating an example of an overall configuration of a semiconductor memory device according to a first embodiment.

FIG. 1 is a block diagram illustrating a configuration example of the semiconductor memory device 1 according to the first embodiment. The semiconductor memory device 1 is a NAND-type flash memory capable of storing data in a nonvolatile manner, and can be controlled by an external memory controller 2. As illustrated in FIG. 1, the semiconductor memory device 1 includes, for example, a memory cell array 10, a command register 11, an address register 12, a sequencer 13, a driver module 14, a row decoder module 15, and a sense amplifier module 16.

The memory cell array 10 includes a plurality of blocks BLK0 to BLKn (n is an integer of 1 or more). Each block BLK is a set of a plurality of memory cells capable of storing data in a nonvolatile manner, and is used, for example, as a unit of data erasure. Furthermore, the memory cell array 10 is provided with a plurality of bit lines and a plurality of word lines. Each memory cell is associated with, for example, one bit line and one word line. A detailed configuration of the memory cell array 10 will be described later.

The command register 11 holds a command CMD received by the semiconductor memory device 1 from the memory controller 2. The command CMD includes, for example, an instruction to cause the sequencer 13 to execute a read operation, a write operation, an erase operation, and the like.

The address register 12 holds address information ADD received by the semiconductor memory device 1 from the memory controller 2. The address information ADD includes, for example, a block address BAd, a page address PAd, and a column address CAd. For example, the block address BAd, the page address PAd, and the column address CAd are used for selecting the block BLK, word line, and bit line, respectively.

The sequencer 13 controls the operation of the entire semiconductor memory device 1. For example, the sequencer 13 controls the driver module 14, the row decoder module 15, the sense amplifier module 16, and the like, based on the command CMD held in the command register 11, and executes the read operation, the write operation, the erase operation, and the like.

The driver module 14 generates a voltage used in the read operation, the write operation, the erase operation, or the like. In addition, the driver module 14 applies a generated voltage to a signal line corresponding to a selected word line, based on, for example, the page address PAd held in the address register 12.

The row decoder module 15 selects a corresponding one block BLK in the memory cell array 10, based on the block address BAd held in the address register 12. Then, the row decoder module 15 transfers, for example, the voltage applied to the signal line corresponding to the selected word line to the selected word line in the selected block BLK.

In the write operation, the sense amplifier module 16 applies a desired voltage to each bit line, depending on write data DAT received from the memory controller 2. Furthermore, in the read operation, the sense amplifier module 16 determines data stored in the memory cell, based on the voltage of the bit line, and reads and transfers a determination result as read data DAT to the memory controller 2.

The semiconductor memory device 1 and the memory controller 2 described above may constitute one semiconductor device by a combination thereof. Examples of such a semiconductor device include a memory card such as an SD™ card, a solid state drive (SSD), and the like.

[1-1-2] Circuit Configuration of Memory Cell Array 10

FIG. 2 is a circuit diagram illustrating an example of a circuit configuration of the memory cell array 10 included in the semiconductor memory device 1 according to the first embodiment. FIG. 2 illustrates one block BLK of the blocks BLK included in the memory cell array 10. As illustrated in FIG. 2, the block BLK includes, for example, five string units SU0 to SU4.

Each string unit SU includes a plurality of NAND strings NS which are associated with bit lines BL0 to BLm (m is an integer of 1 or more), respectively. Each NAND string NS includes, for example, memory cell transistors MT0 to MT7, and select transistors STD and STS. Each memory cell transistor MT includes a control gate and a charge storage layer, and holds data in a nonvolatile manner. Each of the select transistors STD and STS is used for selecting the string unit SU during various operations.

In each NAND string NS, the memory cell transistors MT0 to MT7 are connected in series. The drain of the select transistor STD is connected to each bit line BL associated. The source of the select transistor STD is connected to one end of the memory cell transistors MT0 to MT7 connected together in series. The drain of the select transistor STS is connected to the other end of the memory cell transistors MT0 to MT7 connected in series. The source of the select transistor STS is connected to a source line SL.

In the same block BLK, the control gates of the memory cell transistors MT0 to MT7 are connected to the word lines WL0 to WL7, respectively. The gates of the select transistors STD in the string unit SU0 are connected to a select gate line SGD0. The gates of the select transistors STD in the string unit SU1 are connected to a select gate line SGD1. The gates of the select transistors STD in the string unit SU2 are connected to a select gate line SGD2. The gates of the select transistors STD in the string unit SU3 are connected to a select gate line SGD3. The gates of the select transistors STD in the string unit SU4 are connected to a select gate line SGD4. The gates of the select transistors STS are connected to a select gate line SGS.

Different column addresses are assigned to the bit lines BL0 to BLm, respectively. Each bit line BL is shared by the NAND strings NS to which the same column address is assigned among the blocks BLK. Each of the word lines WL0 to WL7 is provided for each block BLK. The source line SL is shared among the blocks BLK, for example.

A set of the memory cell transistors MT connected to a common word line WL in one string unit SU is referred to as, for example, a cell unit CU. For example, a storage capacity of the cell unit CU including the memory cell transistors MT each storing 1-bit data is defined as "1 page data". The cell unit CU can have a storage capacity of 2 page data or more, depending on the number of bits of data stored in the memory cell transistor MT.

Note that the circuit configuration of the memory cell array 10 included in the semiconductor memory device 1 according to the first embodiment is not limited to the configuration described above. For example, the number of string units SU included in each block BLK, the number of memory cell transistors MT included in each NAND string NS, and the number of select transistors STD and STS included in each NAND string NS, may be freely selected.

[1-1-3] Structure of Memory Cell Array 10

Hereinafter, an example will be described of structure of the memory cell array 10 included in the semiconductor memory device 1 according to the embodiment. Note that, in the drawings referred to below, an X direction corresponds to an extending direction of the word line WL, a Y direction corresponds to an extending direction of the bit line BL, and a Z direction corresponds to the vertical direction with respect to a surface of a semiconductor substrate 20 used for formation of the semiconductor memory device 1. In the plan view, hatching is appropriately added to make it easier to see the figure. The hatching added to the plan view is not necessarily related to a material and characteristics of a constituent element to which the hatching is added. In the cross-sectional view, illustration of the configuration is appropriately omitted to make it easier to see the figure.

(Plan Layout of Semiconductor Memory Device 1)

FIG. 3 is a plan view illustrating an example of a plan layout of the semiconductor memory device 1 according to the first embodiment. As illustrated in FIG. 3, the plan layout of the semiconductor memory device 1 is divided into, for example, core regions CR1, CR2, CR3 and CR4, a wall region WR, a kerf region KR, a contact region C3T, and an end region ER.

Each of the core regions CR1, CR2, CR3 and CR4 is, for example, a rectangular region provided in a central portion of the semiconductor substrate 20. The core regions CR1, CR2, CR3 and CR4 are arranged, for example, in a matrix. Specifically, the core regions CR1 and CR2 neighbor each other in the Y direction. The core regions CR3 and CR4 neighbor each other in the Y direction. The core regions CR1 and CR2 neighbor the core regions CR3 and CR4 in the X direction. The memory cell array 10 is arranged in each core region CR. The shape and the number of core regions CR can be freely designed. It suffices that each core region CR is, at least, surrounded by the wall region WR.

The wall region WR is a square ring region provided to surround the outer periphery of the core regions CR1 to CR4. Sealing members ESn and ESp to be described later are arranged in the wall region WR. The wall region WR may be provided to collectively surround the core regions CR, or may be provided for each core region CR. Peripheral circuits such as the row decoder module 15 and sense amplifier module 16 are arranged in a region surrounded by the wall region WR. Note that the peripheral circuits include portions arranged to overlap the memory cell array 10 in the Z direction.

The contact region C3T is a region which is surrounded by the wall region WR and excludes the core regions CR1 to CR4. In the contact region C3T, for example, a contact is arranged for connecting the memory cell array 10 to the peripheral circuits. For example, the row decoder module 15 is electrically connected to a wiring line (the word line WL or the like) in the memory cell array 10 via the contact provided in the contact region C3T.

The kerf region KR is a square ring region provided to surround the outer periphery of the wall region WR, and is in contact with the outermost periphery of the semiconductor substrate 20. The kerf region KR is provided with, for example, an alignment mark used during manufacturing of the semiconductor memory device 1, a guard ring, and the like. A structure in the kerf region KR may be removed by a dicing process of cutting a plurality of the semiconductor memory devices 1 formed on a wafer into chips.

The end region ER is a region between the kerf region KR and the wall region WR. The kerf region KR and the wall region WR are spaced apart via the end region ER.

FIG. 4 is a plan view illustrating an example of a plan layout in the core region CR of the semiconductor memory device 1 according to the first embodiment. FIG. 4 illustrates regions corresponding to four blocks BLK0 to BLK3 included in the memory cell array 10. As illustrated in FIG. 4, the core region CR is divided into a memory region MA and hookup regions HA1 and HA2 in the X direction, for example. In addition, the memory cell array 10 includes a plurality of slits SLT and SHE.

The memory region MA includes the NAND strings NS. The memory region MA is sandwiched in the X direction by the hookup regions HA1 and HA2. Each of the hookup regions HA1 and HA2 is a region used for connection between stacked wiring lines (for example, the word lines WL and the select gate lines SGD and SGS) and the row decoder module 15.

The slits SLT include portions extending in the X direction, and are arranged in the Y direction. Each slit SLT crosses the memory region MA and the hookup regions HA1 and HA2 in the X direction. Furthermore, each slit SLT has, for example, such a structure that an insulator or a plate-shaped contact is buried. In addition, each slit SLT divides wiring lines (for example, the word lines WL0 to WL7 and the select gate lines SGD and SGS) neighboring each other via the slit SLT.

The slits SHE include portions extending in the X direction, and are arranged in the Y direction. In this example, four slits SHE are arranged in each of spaces between adjacent slits SLT. Each slit SHE crosses the memory region MA in the X direction, and one end of each slit SHE is included in the hookup region HA1 and the other end is included in the hookup region HA2. Furthermore, each slit SHE has, for example, such a structure that an insulator is buried. In addition, each slit SHE divides wiring lines (at least, the select gate line SGD) neighboring each other via the slit SHE.

In the plan layout of the memory cell array 10 described above, each of regions separated by the slits SLT corresponds to one block BLK. Furthermore, each of regions separated by the slits SLT and SHE corresponds to one string unit SU. In addition, in the memory cell array 10, for example, the layout illustrated in FIG. 4 is repeatedly arranged in the Y direction.

Note that the plan layout of the memory cell array 10 included in the semiconductor memory device 1 according to the first embodiment is not limited to the layout described above. For example, the number of slits SHE arranged between mutually neighboring slits SLT can be freely designed. The number of string units SU formed between mutually neighboring slits SLT can be changed based on the number of slits SHE arranged between the mutually neighboring slits SLT.

(Structure of Semiconductor Memory Device 1 in Memory Region MA)

FIG. 5 is a plan view illustrating an example of a plan layout in the memory region MA of the semiconductor memory device 1 according to the first embodiment. FIG. 5 illustrates a region including one block BLK (i.e. the string units SU0 to SU4). As illustrated in FIG. 5, the semiconductor memory device 1 further includes, for example, a plurality of memory pillars MP, a plurality of contacts CV, and a plurality of bit lines BL in the memory region MA. Furthermore, each slit SLT includes a contact LI and spacers SP.

Each of the memory pillars MP functions, for example, as one NAND string NS. The memory pillars MP are arranged in a staggered pattern of, for example, 24 rows in a region between two adjacent slits SLT. In addition, for example, counting from the upper side of the drawing sheet, each of the memory pillar MP in the fifth row, the memory pillar MP in the tenth row, the memory pillar MP in the 15th row, and the memory pillar MP in the 20th row overlaps one slit SHE.

The bit lines BL include portions extending in the Y direction, and are arranged in the X direction. Each bit line BL is arranged to overlap at least one memory pillar MP for each string unit SU. In this example, two bit lines BL are arranged to overlap one memory pillar MP. One bit line BL of the bit lines BL overlapping the memory pillar MP, and the memory pillar MP are electrically connected via the contact CV.

For example, the contact CV is omitted between the memory pillar MP, which is in contact with the slit SHE, and the bit line BL. In other words, the contact CV is omitted between the memory pillar MP, which is in contact with two different select gate lines SGD, and the bit line BL. The number and arrangement of the memory pillars MP, the slits SHE, and the like between the adjacent slits SLT are not limited to the configuration described with reference to FIG. 5, and can be changed as appropriate. The number of bit lines BL overlapping each memory pillar MP can be designed to be any number.

The contact LI is a conductor having a portion provided to extend in the X direction. The spacers SP are insulators provided on side surfaces of the contact LI. The contact LI is sandwiched by the spacers SP. The contact LI is separated and insulated by the spacers SP from conductors (e.g. the word lines WL0 to WL7, and the select gate lines SGD and SGS) adjacent to the contact LI in the Y direction. The spacer SP is, for example, an oxide film.

FIG. 6 is a cross-sectional view taken along a line VI-VI of FIG. 5, FIG. 6 illustrating an example of cross-sectional structure in the memory region MA of the semiconductor memory device 1 according to the first embodiment. As illustrated in FIG. 6, the semiconductor memory device 1 further includes, for example, the semiconductor substrate 20, conductive layers 21 to 25, and insulating layers 30 to 37 in the memory region MA.

Hereinafter, details will be described of the structure of the semiconductor memory device 1 in the memory region MA. The semiconductor substrate 20 is, for example, a P-type semiconductor substrate. The insulating layer 30 is provided on the semiconductor substrate 20. The insulating layer 30 includes a circuit corresponding to the row decoder module 15, the sense amplifier module 16, and the like. For example, the insulating layer 30 can include conductive layers 40 to 43 and contacts C0 to C2. The conductive layer 40 is provided on the semiconductor substrate 20 via a gate insulating film. The conductive layer 40 functions as a gate electrode of a transistor provided under the memory cell array 10. A plurality of the contacts C0 are provided on each of the conductive layer 40 and the semiconductor substrate 20. The contact C0 provided on the semiconductor substrate 20 is connected to an impurity diffusion region (not illustrated) provided on the semiconductor substrate 20. The conductive layer 41 is provided on the contact C0. The contact C1 is provided on the conductive layer 41. The conductive layer 42 is provided on the contact C1. The contact C2 is provided on the conductive layer 42. The conductive layer 43 is provided on the contact C2.

The insulating layer 31 is provided on the insulating layer 30. The insulating layer 31 contains, for example, silicon nitride. The insulating layer 31 prevents hydrogen, which is generated in, for example, a thermal process for forming a stacked structure of the memory cell array 10, from entering a transistor provided on the semiconductor substrate 20. The insulating layer 31 May be referred to as a barrier film.

The insulating layer 32 is provided on the insulating layer 31. The conductive layer 21 is provided on the insulating layer 32. The conductive layer 21 is formed in a plate shape extending along the XY plane, for example, and is used as the source line SL. The conductive layer 21 contains, for example, phosphorus-doped silicon.

The insulating layer 33 is provided on the conductive layer 21. The conductive layer 22 is provided on the insulating layer 33. The conductive layer 22 is formed in a plate shape extending along the XY plane, for example, and is used as the select gate line SGS. The conductive layer 22 contains, for example, tungsten.

The insulating layers 34 and the conductive layers 23 are alternately stacked on the conductive layer 22. The conductive layer 23 is formed in a plate shape extending along the XY plane, for example. The stacked conductive layers 23 are used as word lines WL0 to WL7 in the named order from the semiconductor substrate 20 side. The conductive layer 23 contains, for example, tungsten.

The insulating layer 35 is provided on the uppermost conductive layer 23. The conductive layer 24 is provided on the insulating layer 35. The conductive layer 24 is formed in a plate shape extending along the XY plane, for example, and is used as the select gate line SGD. The conductive layer 24 contains, for example, tungsten.

The insulating layer 36 is provided on the conductive layer 24. The conductive layer 25 is provided on the insulating layer 36. The conductive layer 25 is formed in a line shape extending in the Y direction, for example, and is used as a bit line BL. Specifically, in a region not illustrated, a plurality of the conductive layers 25 are arranged along the X direction. The conductive layer 25 contains, for example, copper.

The insulating layer 37 is provided on the conductive layer 25. The insulating layer 37 includes a circuit and the like for connecting the memory cell array 10 to the row decoder module 15 and the sense amplifier module 16. For example, the insulating layer 37 can include conductive layers 44 and 45. The conductive layer 44 is provided in a layer of a higher level than the conductive layer 25, and is spaced apart from the conductive layer 25. The conductive layer 45 is provided in a layer of a higher level than the conductive layer 44, and is spaced apart from the conductive layer 44.

Each of the memory pillars MP is provided to extend in the Z direction, and penetrates the insulating layers 33 to 35 and the conductive layers 22 to 24. A bottom portion of the memory pillar MP reaches the conductive layer 21. A portion where the memory pillar MP and the conductive layer 22 intersect functions as the select transistor STS. A portion where the memory pillar MP and one conductive layer 23 intersect functions as one memory cell transistor MT. A portion where the memory pillar MP and the conductive layer 24 intersect functions as the select transistor STD.

In addition, each of the memory pillars MP includes, for example, a core member 50, a semiconductor layer 51, and a stacked film 52. The core member 50 is provided to extend in the Z direction. For example, the upper end of the core member 50 is included in a layer of a higher level than the conductive layer 24, and the lower end of the core member 50 is included in a wiring layer in which the conductive layer 21 is provided. The semiconductor layer 51 covers the periphery of the core member 50. A part of the semiconductor layer 51 is in contact with the conductive layer 21 via side surfaces of the memory pillar MP. The stacked film 52 covers the side surfaces and the bottom surface of the semiconductor layer 51 except for a portion where the semiconductor layer 51 and the conductive layer 21 are in contact with each other. The core member 50 contains an insulator such as silicon oxide. The semiconductor layer 51 contains, for example, silicon.

A columnar contact CV is provided on the semiconductor layer 51 in the memory pillar MP. In the illustrated region, two contacts CV corresponding to two memory pillars MP, among six memory pillars MP, are depicted. In the memory region MA, the memory pillar MP, which does not overlap the slit SHE and is not connected to the contact CV, is connected to a contact CV in a region not illustrated.

An upper part of the contact CV is in contact with one conductive layer 25, that is, one bit line BL. One contact CV is connected to one conductive layer 25 in each of spaces separated by the slits SLT and SHE. Specifically, the memory pillar MP provided between mutually neighboring slits SLT and SHE, and the memory pillar MP provided between two mutually neighboring slits SHE, are electrically connected to each of the conductive layers 25.

The slit SLT includes a portion provided along the XZ plane, for example, and divides the conductive layers 22 to 24 and the insulating layers 33 to 35. The contact LI in the slit SLT is provided along the slit SLT. A part of the upper end of the contact LI is in contact with the insulating layer 36. The lower end of the contact LI is in contact with the conductive layer 21. The contact LI is used, for example, as a part of the source line SL. The spacers SP are provided at least between the contact LI and the conductive layers 22 to 24. The contact LI is separated and insulated by the spacers SP from the conductive layers 22 to 24.

The slit SHE includes a portion provided along the XZ plane, for example, and divides at least the conductive layer 24. The upper end of the slit SHE is in contact with the insulating layer 36. The lower end of the slit SHE is in contact with the insulating layer 35. The slit SHE contains an insulator such as silicon oxide. The upper end of the slit SHE and the upper end of the slit SLT may or may not be aligned. Furthermore, the upper end of the slit SHE and the upper end of the memory pillar MP may or may not be aligned.

Hereinafter, wiring layers in which the conductive layers 41, 42 and 43 are provided are referred to as "D0", "D1" and "D2", respectively. The contact C0 connected to the semiconductor substrate 20, and the conductive layer 41 which are provided on the contact C0, contact C1 . . . , and . . . , are referred to as "contact portion CP". Wiring layers in which the conductive layers 25, 44 and 45 are provided are referred to as "M0", "M1" and "M", respectively.

Figure 7:
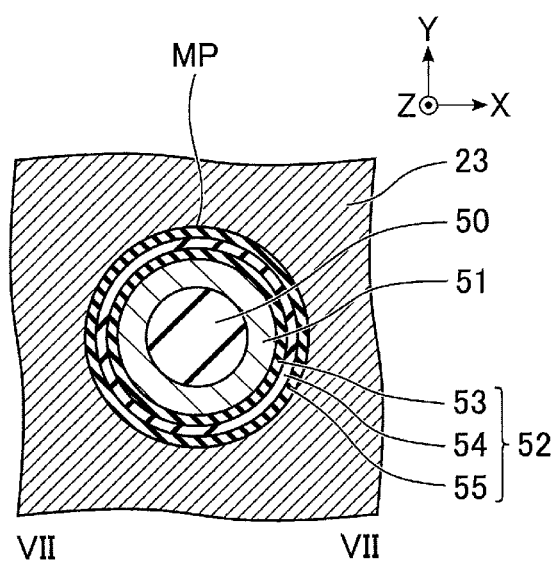
FIG. 7 is a cross-sectional view taken along a line VII-VII of FIG. 6, FIG. 7 illustrating an example of cross-sectional structure of a memory pillar in the semiconductor memory device according to the first embodiment.

FIG. 7 is a cross-sectional view taken along a line VII-VII of FIG. 6, FIG. 7 illustrating an example of cross-sectional structure of the memory pillar MP in the semiconductor memory device 1 according to the first embodiment. FIG. 7 illustrates the cross-sectional structure of the memory pillar MP in a layer parallel to the surface of the semiconductor substrate 20 and including the conductive layer 23. As illustrated in FIG. 7, the stacked film 52 includes, for example, a tunnel insulating film 53, an insulating film 54, and a block insulating film 55.

In a cross section including the conductive layer 23, the core member 50 is provided in a central portion of the memory pillar MP. The semiconductor layer 51 surrounds the side surface of the core member 50. The tunnel insulating film 53 surrounds the side surface of the semiconductor layer 51. The insulating film 54 surrounds the side surface of the tunnel insulating film 53. The block insulating film 55 surrounds the side surface of the insulating film 54. The conductive layer 23 surrounds the side surface of the block insulating film 55. Each of the tunnel insulating film 53 and the block insulating film 55 contains, for example, silicon oxide. The insulating film 54 contains, for example, silicon nitride.

In each of the memory pillars MP described above, the semiconductor layer 51 is used as a channel (current path) of the memory cell transistors MT0 to MT7 and the select transistors STD and STS. The insulating film 54 is used as a charge storage layer of the memory cell transistor MT. The semiconductor memory device 1 can cause a current to flow via the memory pillar MP between the bit line BL and the contact LI (source line SL) by turning on the memory cell transistors MT0 to MT7 and the select transistors STD and STS.

(Structure of Semiconductor Memory Device 1 in Hookup Region HA1 and Contact Region C3T)

Figure 8:
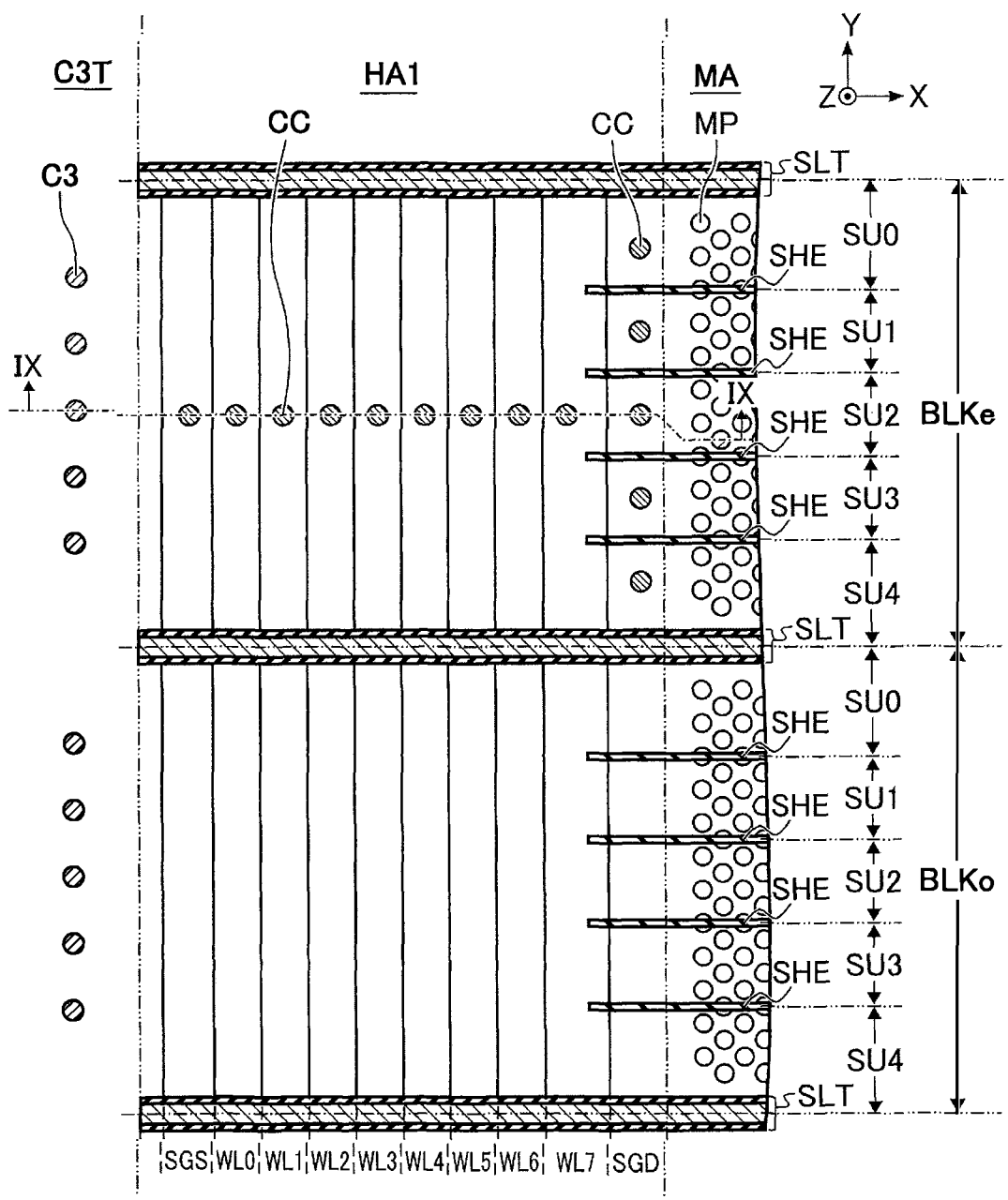
FIG. 8 is a plan view illustrating an example of a plan layout in a hookup region and a contact region of the semiconductor memory device according to the first embodiment.

FIG. 8 is a plan view illustrating an example of a plan layout in the hookup region HA1 and the contact region C3T of the semiconductor memory device 1 according to the first embodiment. FIG. 8 illustrates a region corresponding to mutually neighboring blocks BLKe and BLKo in the hookup region HA1, and a part of the memory region MA and contact region C3T. "BLKe" corresponds to an even-numbered block BLK. "BLKo" corresponds to an odd-numbered block BLK.

As illustrated in FIG. 8, the semiconductor memory device 1 includes a plurality of contacts CC in the hookup region HA1, and a plurality of contacts C3 in the contact region C3T. The contact CC is connected to any one of the conductive layers 22 to 24 provided in the memory cell array 10. The contact C3 is used, for example, for connection between the contact CC and the row decoder module 15.

In addition, in the hookup region HA1, each of the select gate line SGS, the word lines WL0 to WL7, and the select gate line SGD includes a portion (terrace portion) that does not overlap an upper wiring layer (conductive layer). In this example, a plurality of the terrace portions of the select gate line SGD are provided.

In the hookup region HA1, the shape of the portion that does not overlap the upper wiring layer is similar to that of a step, a terrace, a rimstone, or the like. Specifically, level differences are respectively provided between the select gate line SGS and the word line WL0, between the word line WL0 and the word line WL1, . . . , between the word line WL6 and the word line WL7, and between the word line WL7 and the select gate line SGD. In this example, a staircase structure having a level difference in the X direction is formed by an end portion of the select gate line SGS, end portions of the word lines WL0 to WL7, and an end portion of the select gate line SGD.

In a region where the hookup region HA1 and the block BLKe overlap, the plurality of contacts CC are provided on the terrace portions of the select gate line SGS, the word lines WL0 to WL7, and the select gate lines SGD0 to SGD4, respectively. Besides, in a region where the hookup region HA1 and the block BLKo overlap, the contacts CC for the stacked wiring lines are omitted.

Although illustration is omitted, in a region where the hookup region HA2 and the block BLKo overlap, a plurality of contacts CC are provided on terrace portions of the select gate line SGS, the word lines WL0 to WL7, and the select gate lines SGD0 to SGD4, respectively. Besides, in a region where the hookup region HA2 and the block BLKe overlap, the contacts CC for the stacked wiring lines are omitted.

Specifically, in the semiconductor memory device 1 according to the first embodiment, a plan layout of the block BLKo in the hookup region HA2 is similar to a layout in which the structure of the block BLKe in the hookup region HA1 is inverted in each of the X direction and the Y direction. A plan layout of the block BLKe in the hookup region HA2 is similar to a layout in which the structure of the block BLKo in the hookup region HA1 is inverted in each of the X direction and the Y direction.

FIG. 9 is a cross-sectional view taken along a line IX-IX of FIG. 8, FIG. 9 illustrating an example of cross-sectional structure in the hookup region HA1 and the contact region C3T of the semiconductor memory device 1 according to the first embodiment. As illustrated in FIG. 9, the semiconductor memory device 1 further includes a plurality of conductive layers 26 in the hookup region HA1, and a conductive layer 27 in the contact region C3T. An end portion of a stacked wiring structure corresponding to the memory cell array 10 is provided in a staircase pattern by the end portion of each of the select gate line SGS, the word lines WL0 to WL7, and the select gate line SGD.

The contacts CC are provided on the terrace portions of the select gate line SGS, the word lines WL0 to WL7, and the select gate line SGD, respectively. One conductive layer 26 is provided on each contact CC. The conductive layer 26 is included in the same wiring layer as the conductive layer 25, for example. A contact V0 is provided on the conductive layer 26. FIG. 9 illustrates the contact V0 which corresponds to the select gate line SGS among the contacts V0. The conductive layer 44 is provided on the contact V0.

The contact C3 is provided on the conductive layer 43, and penetrates the insulating layers 31, 32, and 36. The conductive layer 27 is provided on the contact C3. FIG. 9 illustrates one set of the conductive layer 27 and the contact C3, which is associated with the select gate line SGS, among the sets of the conductive layer 27 and the contact C3. The conductive layer 27 is included in the same wiring layer as the conductive layer 26. The contact V0 is provided on the conductive layer 27 associated with the select gate line SGS. The conductive layer 44 is provided on the contact V0.

Thereby, the conductive layer 22 corresponding to the select gate line SGS is electrically connected to a transistor provided in a lower layer than the insulating layer 31 via one set of the contacts CC and C3. Each of the conductive layers 23 and 24 included in the stacked wiring structure corresponding to the memory cell array 10 is also electrically connected to a transistor provided in a lower layer than the insulating layer 31 via one set of the contacts CC and C3, similarly to the conductive layer 22. Specifically, each of the select gate line SGS, the word lines WL0 to WL7, and the select gate lines SGD0 to SGD4 is electrically connected to the row decoder module 15 via a corresponding set of the contacts CC and C3.

Note that it suffices that the semiconductor memory device 1 has a configuration in which a voltage can be applied to each of the select gate line SGS, the word lines WL0 to WL7, and the select gate lines SGD0 to SGD4 from the contact CC disposed in at least one of the hookup regions HA1 or HA2. The contact CC may be connected to each wiring layer in each of the hookup region HA1 and the hookup region HA2. In this case, for example, a voltage is applied to the word line WL from each of the contact CC in the hookup region HA1 and the contact CC in the hookup region HA2. Furthermore, the hookup region HA may be inserted in an intermediate portion of the memory region MA. In this case, for example, the word line WL is electrically connected to a transistor provided in a lower layer than the insulating layer 31 via a contact penetrating the stacked wiring structure of the memory cell array 10.

(Configuration of Semiconductor Memory Device 1 Including Source Line SL)

FIG. 10 is a plan view illustrating an example of a configuration in a wiring layer including the source line SL of the semiconductor memory device 1 according to the first embodiment. FIG. 10 illustrates the same region as the plan layout of the semiconductor memory device 1 according to the first embodiment illustrated in FIG. 3. As illustrated in FIG. 10, the semiconductor memory device 1 includes a source line portion SLP and sealing members ESn and ESp.

The source line portion SLP is a stacked structure used for formation of the source line SL. The source line portion SLP is provided on entire surfaces of, for example, the core region CR, the wall region WR, and the kerf region KR. The source line portion SLP in the core region CR includes the conductive layer 21, and functions as the source line SL. Note that it suffices that the source line portion SLP is provided at least in the core region CR. The source line portion SLP provided outside the core region CR can be utilized in the manufacturing process of the semiconductor memory device 1.

The sealing member ESn is a structure capable of releasing positive charge generated inside and outside the wall region WR to the semiconductor substrate 20. The sealing member ESp is a structure capable of releasing negative charge generated inside and outside the wall region WR to the semiconductor substrate 20. Each of the sealing members ESn and ESp is provided in a square ring shape in a manner to surround the outer periphery of the core regions CR1 to CR4 in the wall region WR. The sealing member ESp surrounds the outer periphery of the sealing member ESn and is spaced apart from the sealing member ESn. Each of the sealing members ESn and ESp divides the source line portion SLP provided in the wall region WR.

In addition, each of the sealing members ESn and ESp can suppress permeation of moisture or the like from the outside of the wall region WR into the core region CR. Each of the sealing members ESn and ESp can suppress stress generated in an interlayer insulating film (for example, tetraethoxysilane (TEOS)) of the semiconductor memory device 1. Furthermore, each of the sealing members ESn and ESp can also be used as a crack stopper. Specifically, each of the sealing members ESn and ESp can suppress a crack from reaching the inside of the semiconductor memory device 1 when the crack occurs in the peripheral portion of a chip on which the semiconductor memory device 1 is formed in the dicing process. Each of the sealing members ESn and ESp may be referred to as an "edge seal" or a "crack stopper".

Figure 11:
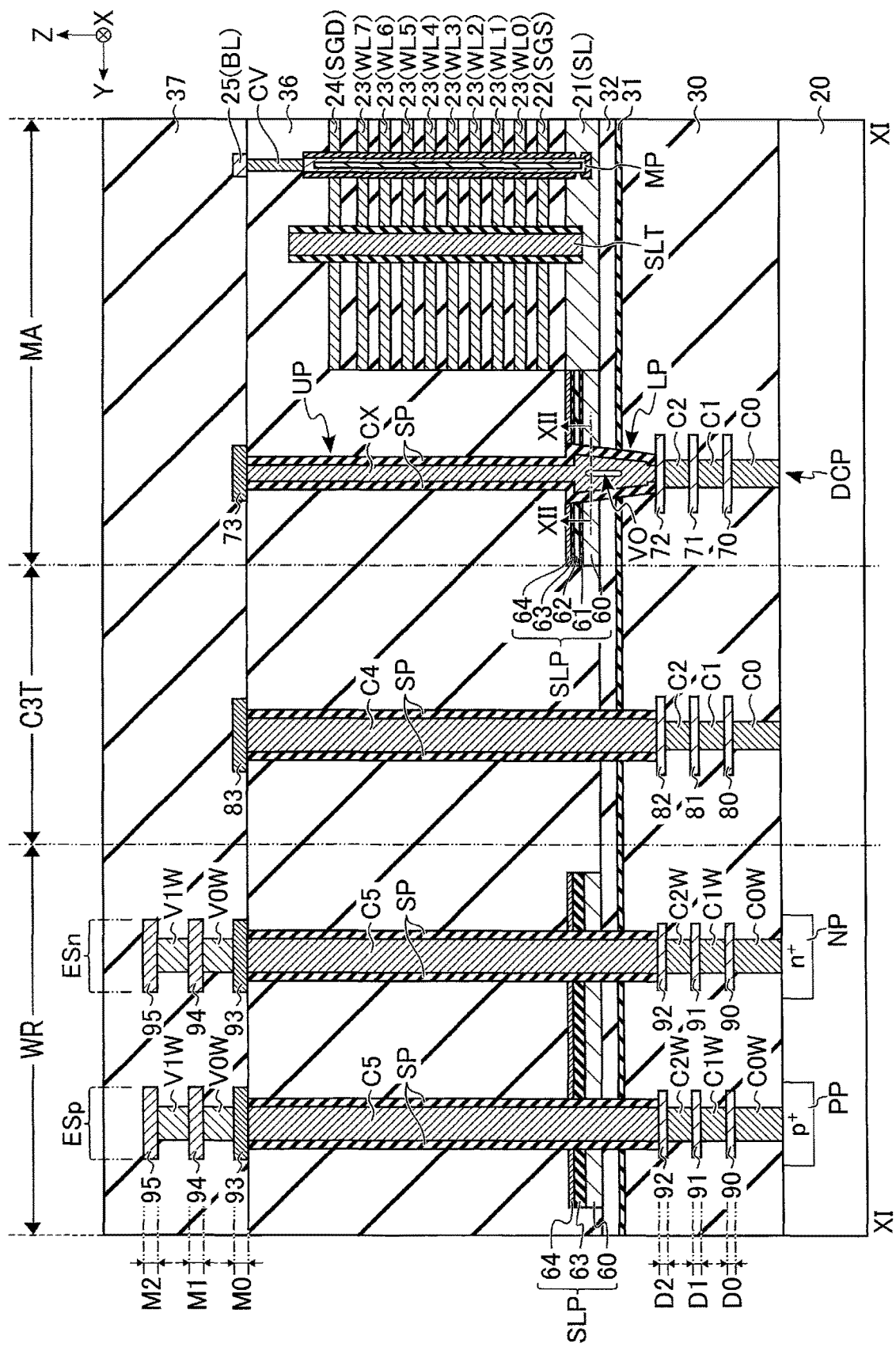
FIG. 11 is a cross-sectional view taken along a line XI-XI of FIG. 10, FIG. 11 illustrating an example of cross-sectional structure in the memory region, the contact region and a wall region of the semiconductor memory device according to the first embodiment.

FIG. 11 is a cross-sectional view taken along a line XI-XI of FIG. 10, FIG. 11 illustrating an example of cross-sectional structure in the memory region MA, the contact region C3T and the wall region WR of the semiconductor memory device 1 according to the first embodiment. As illustrated in FIG. 11, the semiconductor memory device 1 can include a conductive layer 60, an insulating layer 61, a sacrificial member 62, an insulating layer 63 and a conductive layer 64, which correspond to the source line portion SLP. The semiconductor memory device 1 includes, in the memory region MA, conductive layers 70 to 73, a spacer SP, and a contact CX. The semiconductor memory device 1 includes, in the contact region C3T, conductive layers 80 to 83, a spacer SP, and a contact C4. The semiconductor memory device 1 includes, in the wall region WR, conductive layers 90 to 95, and contacts C0W, C1W, C2W, C5, V0W and V1W. The semiconductor substrate 20 includes an N-type impurity diffusion region NP and a P-type impurity diffusion region PP.

For example, in an end portion of the memory region MA, the conductive layer 60, insulating layer 61, sacrificial member 62, insulating layer 63 and conductive layer 64 are stacked in the named order on the insulating layer 32. A lower surface of the conductive layer 60 and a lower surface of the conductive layer 21 are aligned. In the memory region MA, an upper surface of the conductive layer 64 and an upper surface of the conductive layer 21 are aligned. Specifically, in the memory region MA, a set of the conductive layer 60, insulating layer 61, sacrificial member 62, insulating layer 63 and conductive layer 64 is provided at the same height as the source line SL. In the memory region MA, each of the conductive layers 60 and 64 is electrically connected to the conductive layer 21. Each of the conductive layers 60 and 64 contains, for example, phosphorus-doped silicon.

In addition, in the source line portion SLP in the wall region WR, the conductive layer 60, insulating layer 63 and conductive layer 64 are stacked in the named order on the insulating layer 32. In other words, the insulating layer 61 and sacrificial member 62 can be omitted in the source line portion SLP in the wall region WR. An upper surface of the conductive layer 64 in the wall region WR and an upper surface of the conductive layer 64 in the memory region MA are aligned. Specifically, in the wall region WR, a set of the conductive layer 60, insulating layer 63 and conductive layer 64 is provided at the same height as the source line SL. Note that the stacked structure of the source line portion SLP may be identical between the memory region MA and the wall region WR.

In the memory region MA, the conductive layer 70 is provided on the semiconductor substrate 20 via the contact C0. The conductive layer 71 is provided on the conductive layer 70 via the contact C1. The conductive layer 72 is provided on the conductive layer 71 via the contact C2. The conductive layer 73 is provided on the conductive layer 72 via the contact CX. The conductive layers 70, 71, 72 and 73 are included in the wiring layers D0, D1, D2 and M0, respectively. Some other contact or wiring line may be connected to a top portion of the conductive layer 73. The spacer SP is provided on the side surface of the contact CX. The contact CX is in contact with the source line SLP via the spacer SP, and is insulated from the source line SL. In the present embodiment, the contact CX is electrically connected to the semiconductor substrate 20 via the contacts C0 to C2 and the conductive layers 70 to 72.

The contact CX includes a lower portion LP and an upper portion UP. The lower portion LP of the contact CX is provided on the conductive layer 72, and penetrates the source line portion SLP. The height of the surface of the conductive layer 64 corresponds to the height of a boundary plane between the lower portion LP and upper portion UP of the contact CX. The upper portion UP of the contact CX is provided on the lower portion LP, and penetrates the insulating layer 36. In the vicinity of the boundary plane between the lower portion LP and upper portion UP of the contact CX, the outside diameter of the lower portion LP of the contact CX is greater than the outside diameter of the upper portion UP. In addition, in the vicinity of the boundary plane between the lower portion LP and upper portion UP of the contact CX, the cross-sectional area of the lower portion LP in a plane parallel to the surface of the semiconductor substrate 20 is greater than the cross-sectional area of the upper portion UP in the plane parallel to the surface of the semiconductor substrate 20. Thus, the lower portion LP of the contact CX can include a void VO.

In other words, in the first embodiment, the set of the contact CX and the spacer SP may be regarded as a member formed in a hole CHX (to be described later). This member is provided to extend in the Z direction and to penetrate the source line portion SLP, and includes a first portion (UP) which is far from the semiconductor substrate 20, and a second portion (LP) which is near the semiconductor substrate 20. This member includes the contact CX and spacer (insulating film) SP. The contact CX is provided to extend in the Z direction, and is electrically connected to the semiconductor substrate 20. The spacer SP is continuously provided on the side surface portion of the contact CX, and insulates the source line portion SLP from the contact CX. In addition, this member includes a stepped portion at a boundary part between the first portion (UP) and the second portion (LP). The height of this boundary part is aligned with the height of the upper surface of the source line portion SLP. In the vicinity of the boundary part, the diameter of the first portion (UP) is less than the diameter of the second portion (LP), and the cross-sectional area of the first portion (UP) is less than the cross-sectional area of the second portion (LP). The void VO can be formed in the contact CX included in the second portion (LP).

In the contact region C3T, the conductive layer 80 is provided on the contact C0. The conductive layer 81 is provided on the conductive layer 80 via the contact C1. The conductive layer 82 is provided on the conductive layer 81 via the contact C2. The conductive layer 83 is provided on the conductive layer 82 via the contact C4. The conductive layers 80, 81, 82 and 83 are included in the wiring layers D0, D1, D2 and M0, respectively. Some other contact or wiring line may be connected to a top portion of the conductive layer 83. The spacer SP is provided on the side surface of the contact C4. The contact C4 is used to connect circuitry formed on the lower side of the memory cell array 10 (e.g. in the insulating layer 30) and a wiring formed on the upper side of the memory cell array 10 (e.g. in the insulating layer 37).

In the wall region WR, the conductive layer 90 is provided on the semiconductor substrate 20 via the contact C0W. The conductive layer 91 is provided on the conductive layer 90 via the contact C1W. The conductive layer 92 is provided on the conductive layer 91 via the contact C2W. The conductive layer 93 is provided on the conductive layer 92 via the contact C5. The conductive layer 94 is provided on the conductive layer 93 via the contact V0W. The conductive layer 95 is provided on the conductive layer 94 via the contact V1W. The conductive layers 90, 91, 92, 93, 94 and 95 are included in the wiring layers D0, D1, D2, M0, M1 and M2. The set of the contacts C0W, C1W, C2W and C5 and the conductive layers 90, 91 and 92 divide the insulating layer 30. In addition, the contact C5 divides the insulating layers 31 and 32, conductive layer 60, insulating layer 63, conductive layer 64 and insulating layer 36. The set of the contacts V0W and V1W and the conductive layers 93, 94 and 95 divide a part of the insulating layer 37. For example, an upper surface of the contact C5, an upper surface of the contact C4 and an upper surface of the contact CX are aligned. The spacer SP is provided on the side surface of the contact C5. The contact C5 is in contact with the source line portion SLP via the spacer SP.

In a region not illustrated, the set of the contacts C0W, C1W, C2W, C5, V0W and V1W and the conductive layers 90 to 95 includes a portion extending in the Y direction. In addition, the set of the contacts C0W, C1W, C2W, C5, V0W and V1W and the conductive layers 90 to 95 includes a portion extending in the X direction. Thereby, the set of the contacts C0W, C1W, C2W, C5, V0W and V1W and the conductive layers 90 to 95 is provided, for example, in a square ring shape, and surrounds a plurality of the core regions CR.

Each of the contacts C0W, C1W, C2W, C5, V0W and V1W is, for example, a metal. The spacer SP is, for example, a silicon oxide film. The set of the conductive layers 90 to 95 and the contacts C0W, C1W, C2W, C5, V0W and V1W corresponds to either the sealing member ESn or the sealing member ESp. The set of the conductive layers 90 to 95 and the contacts C0W, C1W, C2W, C5, V0W and V1W corresponding to the sealing member ESn is connected to the N-type impurity diffusion region NP of the semiconductor substrate 20. The set of the conductive layers 90 to 95 and the contacts C0W, C1W, C2W, C5, V0W and V1W corresponding to the sealing member ESp is connected to the P-type impurity diffusion region PP of the semiconductor substrate 20. Each of the sealing members ESn and ESp can be regarded as a wall between the core region CR and the kerf region KR.

Note that it suffices that the sealing member ESn is connected to at least the N-type impurity diffusion region NP. If the N-type impurity diffusion region NP has a sufficient area as a discharge path, the N-type impurity diffusion region NP may not necessarily be provided in a square ring shape. The N-type impurity diffusion region NP is formed, for example, in a P-type well region of the semiconductor substrate 20. Similarly, it suffices that the sealing member ESp is connected to at least the P-type impurity diffusion region PP. If the P-type impurity diffusion region PP has a sufficient area as a discharge path, the P-type impurity diffusion region PP may not necessarily be provided in a square ring shape. The P-type impurity diffusion region PP is formed, for example, in a P-type well region of the semiconductor substrate 20.

In the first embodiment, as will be described later, the contacts CX and C4 are formed batchwise. Thus, in the first embodiment, the heights of the contacts CX and C4 are aligned. In other words, the height of the upper end of the contact CX and the height of the upper end of the contact C4 are substantially equal.

Hereinafter, a part in which the contact CX is provided is referred to as "discharge portion DCP". In the discharge portion DCP, in the manufacturing process of the semiconductor memory device 1, a structure, which can be a current path between the source line portion SLP and the semiconductor substrate 20, is formed. This structure in the discharge portion DCP can suppress the influence of arcing that occurs during manufacturing of the semiconductor memory device 1.

Figure 12:
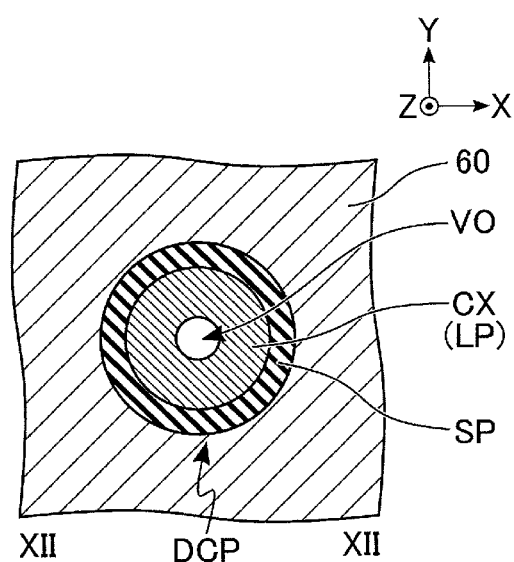
FIG. 12 is a cross-sectional view taken along a line XII-XII of FIG. 11, FIG. 12 illustrating an example of cross-sectional structure of a contact provided in a discharge portion in the semiconductor memory device according to the first embodiment.

FIG. 12 is a cross-sectional view taken along a line XII-XII of FIG. 11, FIG. 12 illustrating an example of cross-sectional structure of the contact CX provided in the discharge portion DCP in the semiconductor memory device 1 according to the first embodiment. FIG. 12 illustrates a cross-sectional structure of the contact CX in the layer which is parallel to the surface of the semiconductor substrate 20 and includes the conductive layer 60. As illustrated in FIG. 12, in the cross section including the conductive layer 60, the void VO is surrounded by the lower portion LP of the contact CX. In this manner, the lower portion LP of the contact CX can include a portion provided in a columnar shape. The spacer SP surrounds the side surface of the contact CX. The conductive layer 60 surrounds the side surface of the spacer SP. Note that the void VO may not be formed, depending on a manufacturing process used in the formation of the contact CX.

[1-2] Manufacturing Method of Semiconductor Memory Device 1

Figure 13:
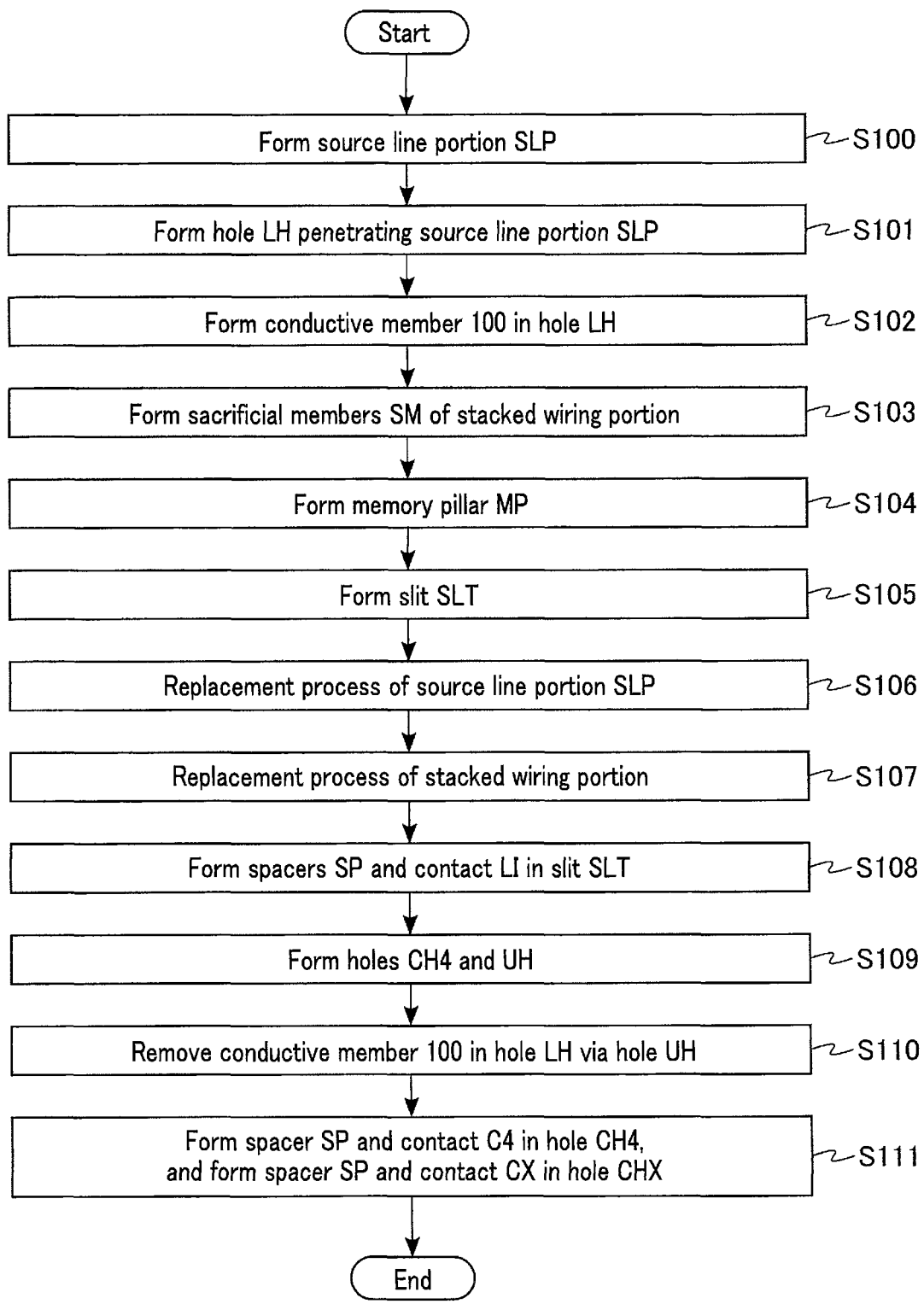
FIG. 13 is a flowchart illustrating an example of a method of manufacturing the semiconductor memory device according to the first embodiment.

FIG. 13 is a flowchart illustrating an example of a method of manufacturing the semiconductor memory device 1 according to the first embodiment, FIG. 13 illustrating an example of manufacturing steps relating to the formation of the discharge portion DCP and the memory cell array 10. FIGS. 14 to 27 are cross-sectional views illustrating an example of cross-sectional structure during manufacturing of the semiconductor memory device 1 according to the first embodiment. Each of FIG. 14 to FIG. 27 illustrates a region in which the memory region MA and contact region C3T illustrated in FIG. 11 are extracted. Hereinafter, a portion where the select gate lines SGD and SGS and the word lines WL are formed in the memory cell array 10 is referred to as "stacked wiring portion". Referring to FIG. 13 where necessary, forming steps of the discharge portion DCP and memory cell array 10 in the first embodiment will be described below.

Figure 14:
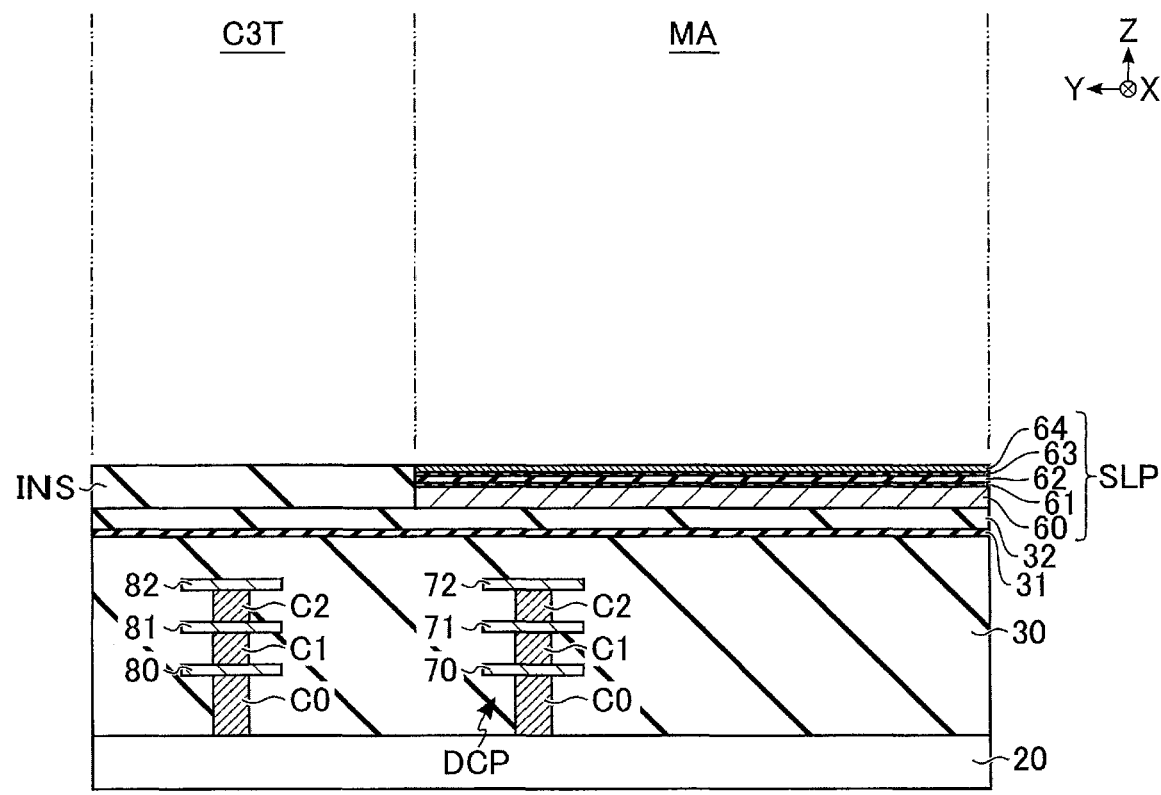

To start with, as illustrated in FIG. 14, the source line portion SLP is formed (step S100). In brief, a structure of the wiring layers D0 to D2 is formed, and, after the insulating layer 30 is formed, the insulating layers 31 and 32, conductive layer 60, insulating layer 61 and sacrificial member 62 are formed in the named order on the insulating layer 30. Then, for example, the insulating layer 61 and sacrificial member 62 provided outside the memory region MA are removed, and the insulating layer 63 and conductive layer 64 are formed in the named order. Subsequently, in the contact region C3T and end region ER, a structure formed in the source line portion SLP is removed, and an insulator INS is buried in the portion from which this structure is removed.

Figure 15:
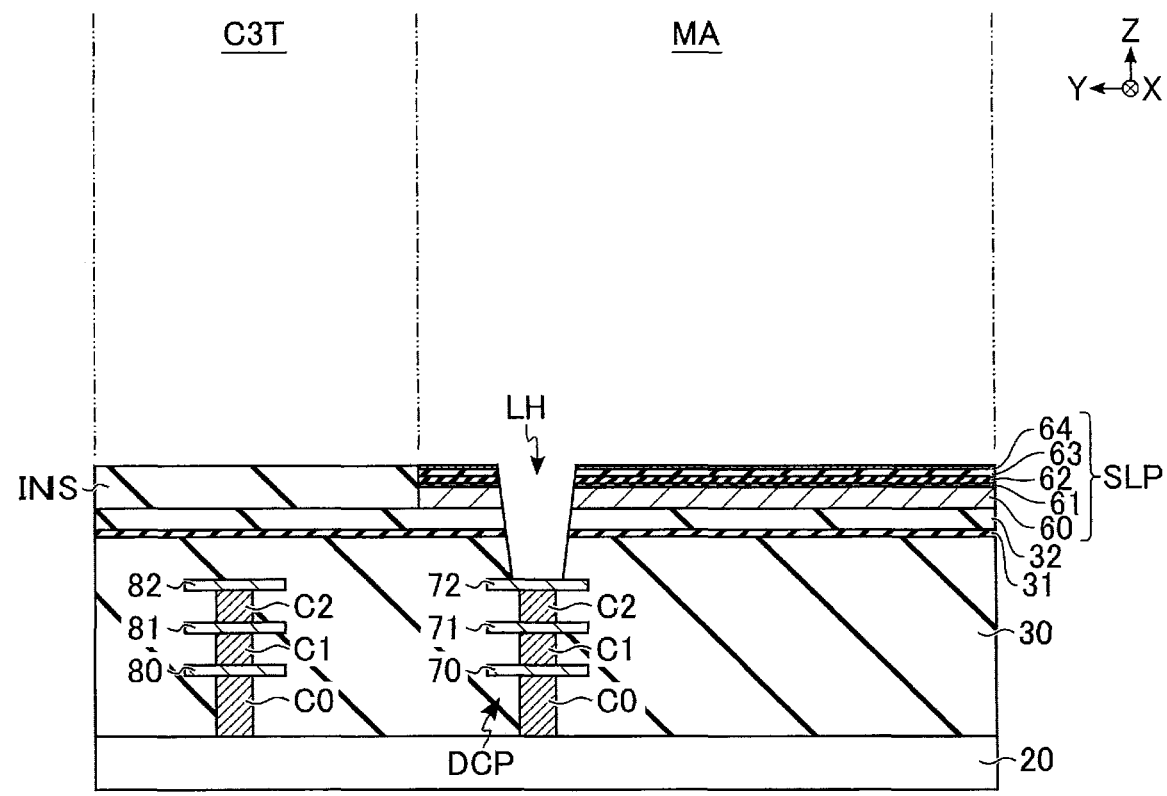

Next, as illustrated in FIG. 15, a hole LH penetrating the source line portion SLP is formed (step S101). Specifically, at first, by photolithography, for example, a mask, in which a portion where the discharge portion DCP is formed is opened, is formed. Then, an anisotropic etching process using this mask is executed, and the hole LH is formed. As the anisotropic etching process, for example, RIE (Reactive Ion Etching) is used. The hole LH penetrates the conductive layer 64, insulating layer 63, sacrificial member 62, insulating layer 61, conductive layer 60, insulating layers 32 and 31 and a part of the insulating layer 30, and a surface of the conductive layer 72 is exposed in a bottom portion of the hole LH.

Figure 16:
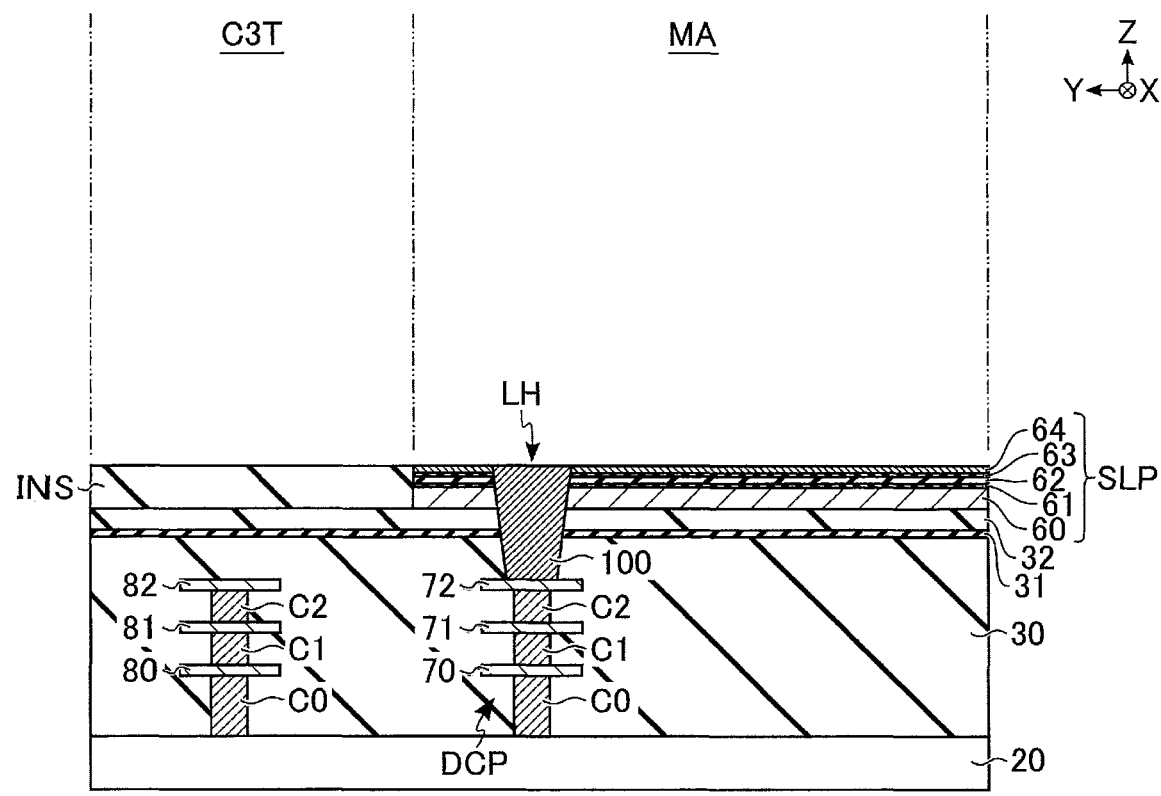

Subsequently, as illustrated in FIG. 16, a conductive member 100 is formed in the hole LH (step S102). Specifically, at first, the conductive member 100 is formed in a manner to fill the hole LH. Then, an etch-back process or CMP (Chemical Mechanical Polishing) is executed, and a structure in which the conductive member 100 remains in the hole LH is formed. The conductive member 100 is, for example, ruthenium or molybdenum. It is preferable that the conductive member 100 is a material capable of increasing an etching selectivity to the source line SL and the conductive layer 72.

Figure 17:
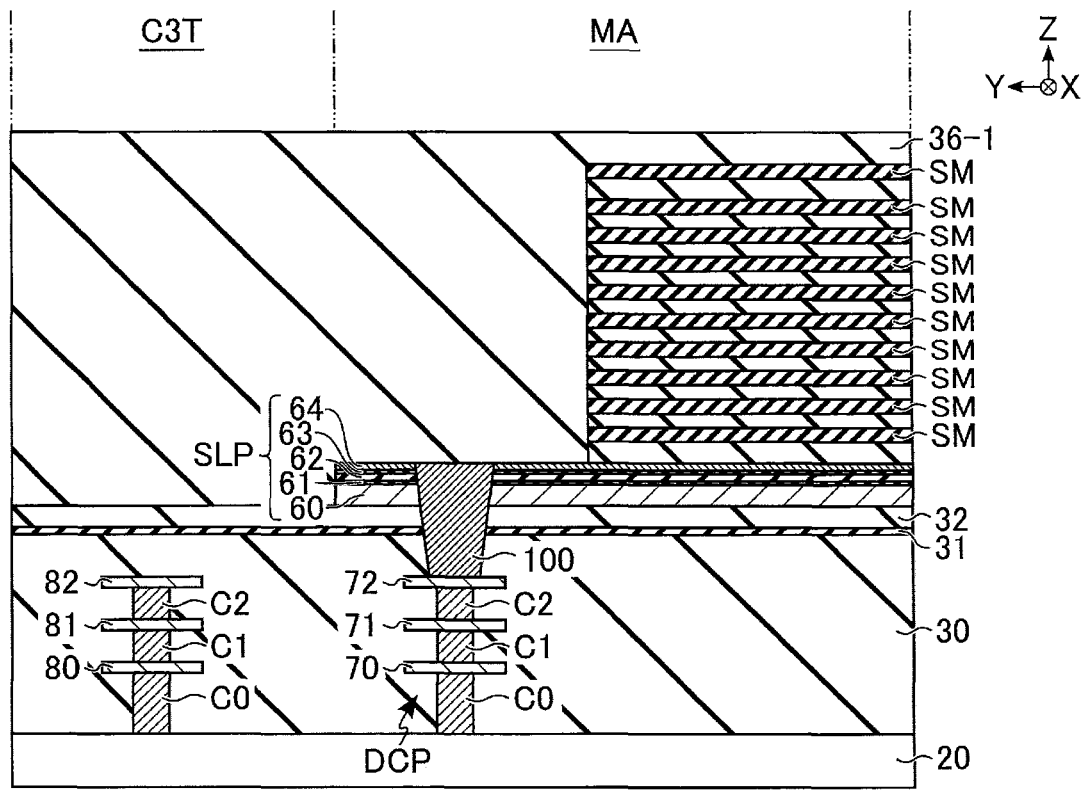

Next, as illustrated in FIG. 17, sacrificial members SM of the stacked wiring portion are formed (step S103). Specifically, on the conductive layer 64, insulating layers and sacrificial members SM are alternately stacked. Thereafter, although illustration is omitted, a staircase structure of the sacrificial members SM is formed in each of the hookup regions HA1 and HA2, for example, by repetition of a slimming process and an etching process. At this time, the sacrificial members SM formed in each of the contact region C3T and the wall region WR are removed. Then, a level difference formed by the staircase structure of the sacrificial members SM is filled with an insulating layer 36-1. Thereafter, a surface of the insulating layer 36-1 is planarized by, for example, CMP.

Figure 18:
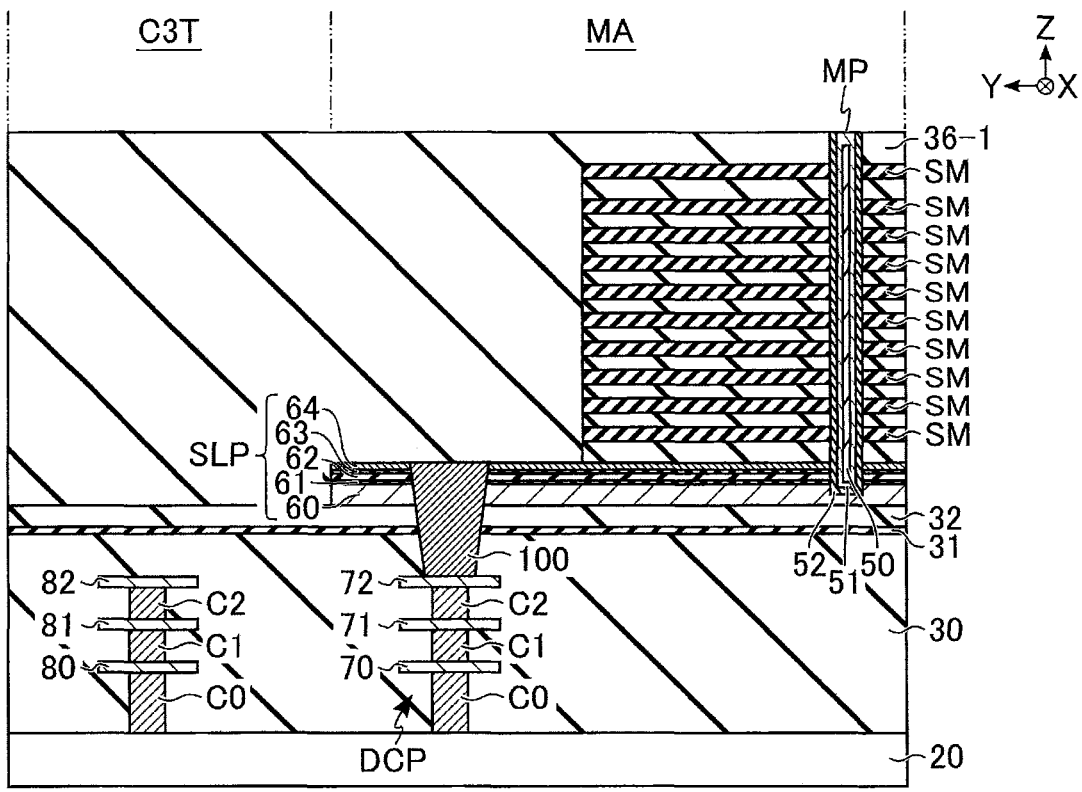

Subsequently, as illustrated in FIG. 18, the memory pillar MP is formed (step S104). Specifically, at first, by photolithography or the like, a mask with an opening in a region corresponding to the memory pillar MP is formed. By anisotropic etching using the mask, a memory hole is formed which penetrates the insulating layer 36-1, the stacked sacrificial members SM, the conductive layer 64, the insulating layer 63, the sacrificial member 62, and the insulating layer 61. At the bottom of the memory hole, a part of the conductive layer 60 is exposed. Then, the stacked film 52 (i.e. the block insulating film 55, insulating film 54, and tunnel insulating film 53), the semiconductor layer 51, and the core member 50 are formed in the named order on the side surface and the bottom surface of the memory hole. Then, a part of the core member 50 provided in the upper part of the memory hole is removed, and the semiconductor layer 51 is formed in a portion from which the core member 50 is removed.

Figure 19:
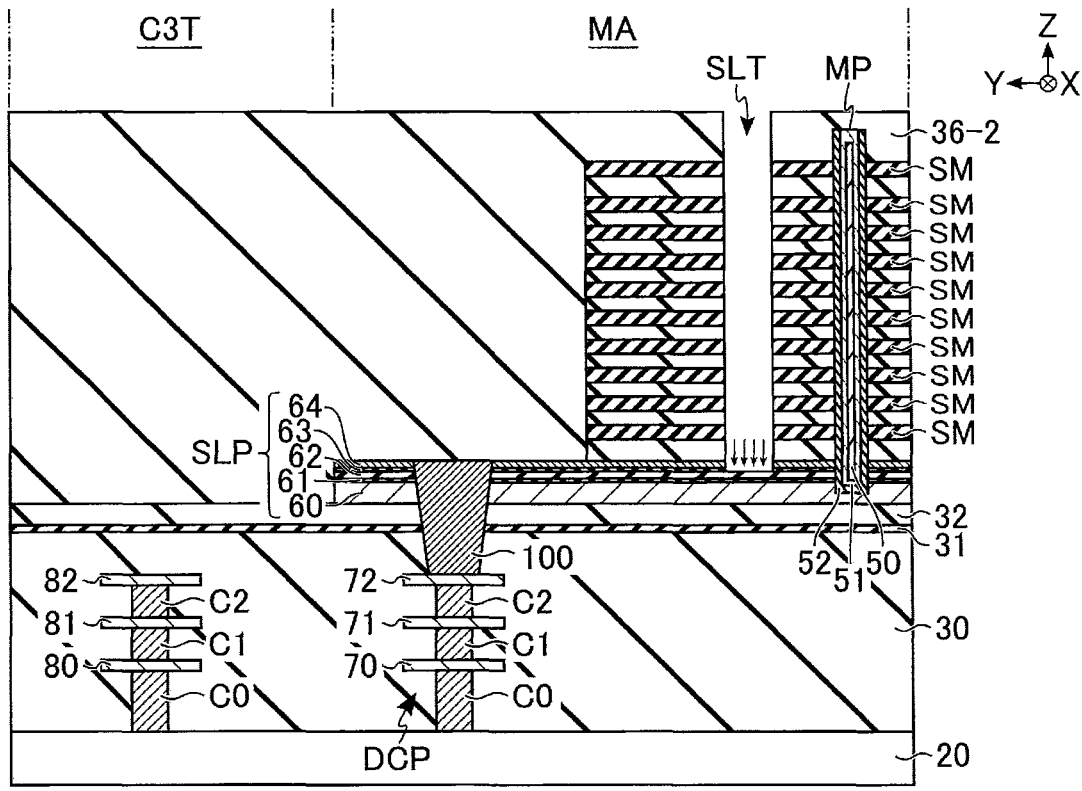

Next, as illustrated in FIG. 19, the slit SLT is formed (step S105). Specifically, at first, a protective film covering an upper part of the memory pillar MP is formed. Hereinafter, a set of this protective film and the insulating layer 36-1 is referred to as "insulating layer 36-2". Then, by photolithography or the like, a mask is formed in which a region corresponding to the slit SLT is opened. By an anisotropic etching process using the mask, the slit SLT is formed which divides the insulating layer 36-2, the stacked sacrificial members SM, the conductive layer 64, and the insulating layer 63. At the bottom portion of the slit SLT, the sacrificial member 62 is exposed.

Figure 20:
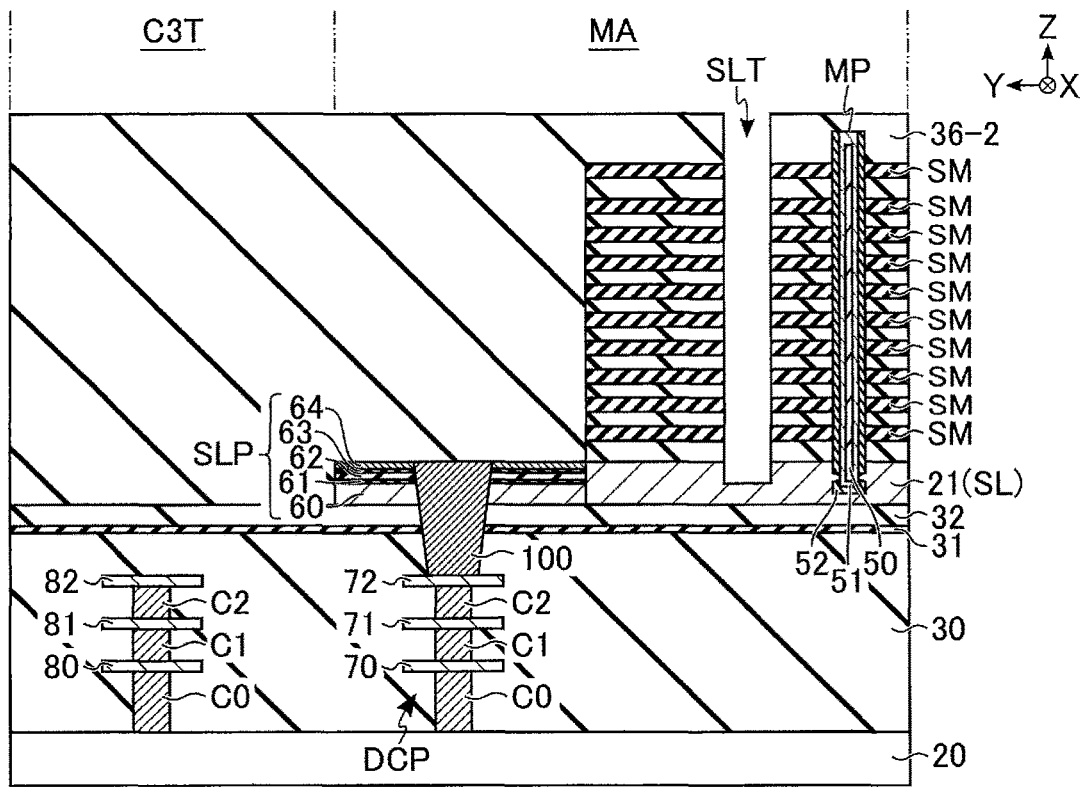

Following the above, as illustrated in FIG. 20, a replacement process of the source line portion SLP is executed (step S106). Specifically, the sacrificial member 62 is selectively removed via the slit SLT, for example, by wet etching. Subsequently, for example, by wet etching, the insulating layers 61 and 63 of the source line portion SLP and a part of the stacked film 52 on the side surface of the memory pillar MP are selectively removed via the slit SLT. Then, a conductor (e.g. silicon) is buried in a space formed in the source line portion SLP. Thereby, the conductive layer 21 is formed by the conductor and the conductive layers 60 and 64, and the conductive layer 21 and the semiconductor layer 51 in the memory pillar MP are electrically connected.

Figure 21:
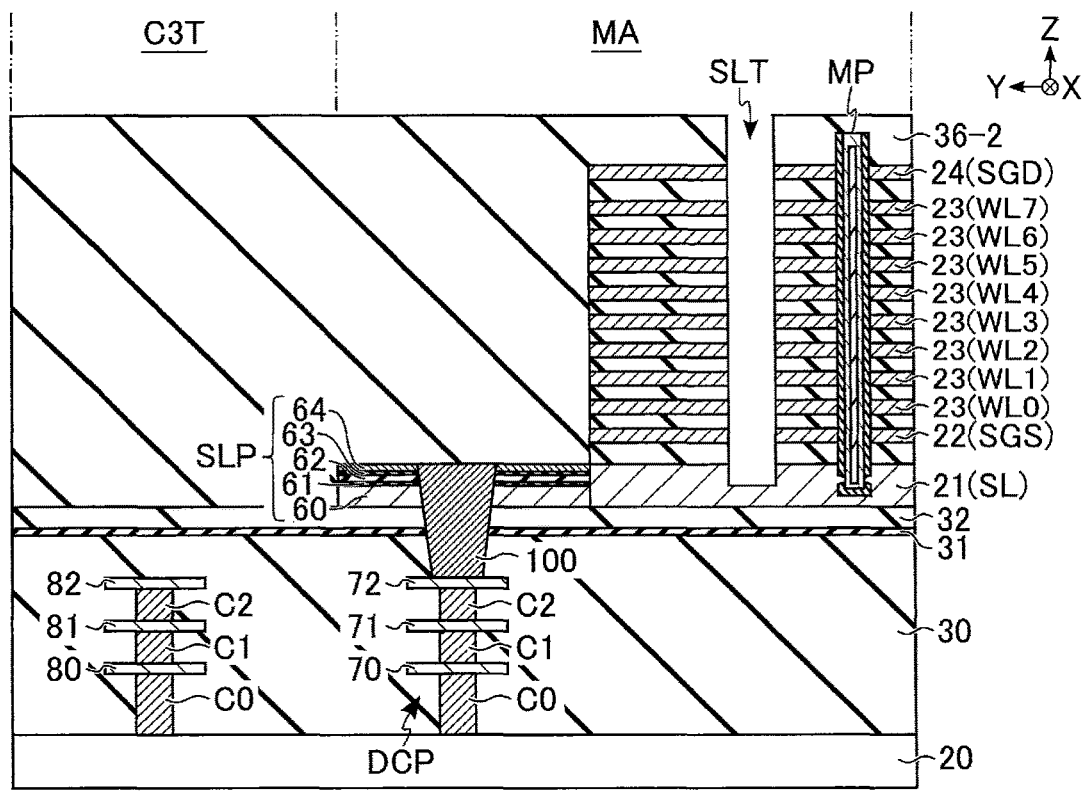

Next, as illustrated in FIG. 21, a replacement process of the stacked wiring portion is executed (step S107). Specifically, the stacked sacrificial members SM are selectively removed via the slit SLT by wet etching with hot phosphoric acid or the like. Then, a conductor is buried in a space from which the sacrificial members SM have been removed, via the slit SLT. For example, CVD (Chemical Vapor Deposition) is used for formation of the conductor in this manufacturing step. Thereafter, the conductor formed inside the slit SLT is removed by an etch-back process, and the conductor formed in the adjacent wiring layer is separated. Thereby, the conductive layer 22 functioning as the select gate line SGS, the conductive layers 23 each functioning as the word line WL, and the conductive layer 24 functioning as the select gate line SGD are formed. The conductive layers 22 to 24 formed in this step may contain a barrier metal. In this case, in the formation of the conductor after the removal of the sacrificial members SM, for example, a film of titanium nitride is formed as a barrier metal, and then tungsten is formed.

Subsequently, as illustrated in FIG. 22, spacers SP and the contact LI are formed in the slit SLT (step S108). Specifically, at first, an insulating film corresponding to the spacers SP is formed by CVD or the like. The insulating film is formed not only on the side surfaces of the slit SLT but also on the bottom portion of the slit SLT. Subsequently, an etch-back process is executed, and the insulating film formed on the bottom portion of the slit SLT is removed. Thereby, the conductive layer 21 is exposed at the bottom portion of the slit SLT. Then, a conductor is buried in the slit SLT, and the conductor outside the slit SLT is removed. The conductor formed in the slit SLT corresponds to the contact LI. Thereafter, when an insulating layer is formed on the insulating layer 36-2, the structure of the insulating layer 36 illustrated in FIG. 11 is formed.

Next, as illustrated in FIG. 23, holes CH4 and UH are formed (step S109). By photolithography or the like, a mask is formed in which a region corresponding to the contact C4 and a region corresponding to the upper portion UP of the contact CX are opened. Then, by an anisotropic etching process using the mask, the hole CH4 corresponding to the contact C4 and the hole UH corresponding to the upper portion UP of the contact CX are formed. The hole CH4 penetrates the insulating layers 36, 32 and 31 and a part of the insulating layer 30, and a surface of the conductive layer 82 is exposed in the bottom portion of the hole CH4. The hole UH penetrates the insulating layer 36, and a surface of the conductive member 100 is exposed in the bottom portion of the hole UH. Specifically, the hole UH is provided in a manner to overlap the conductive member 100.

Subsequently, as illustrated in FIG. 24, the conductive member 100 in the hole LH is removed (step S110). Specifically, wet etching is executed, and the conductive member 100 in the hole LH is removed via the hole UH. Hereinafter, the combination of the hole UH and the hole LH is referred to as "hole CHX".

Figure 26:
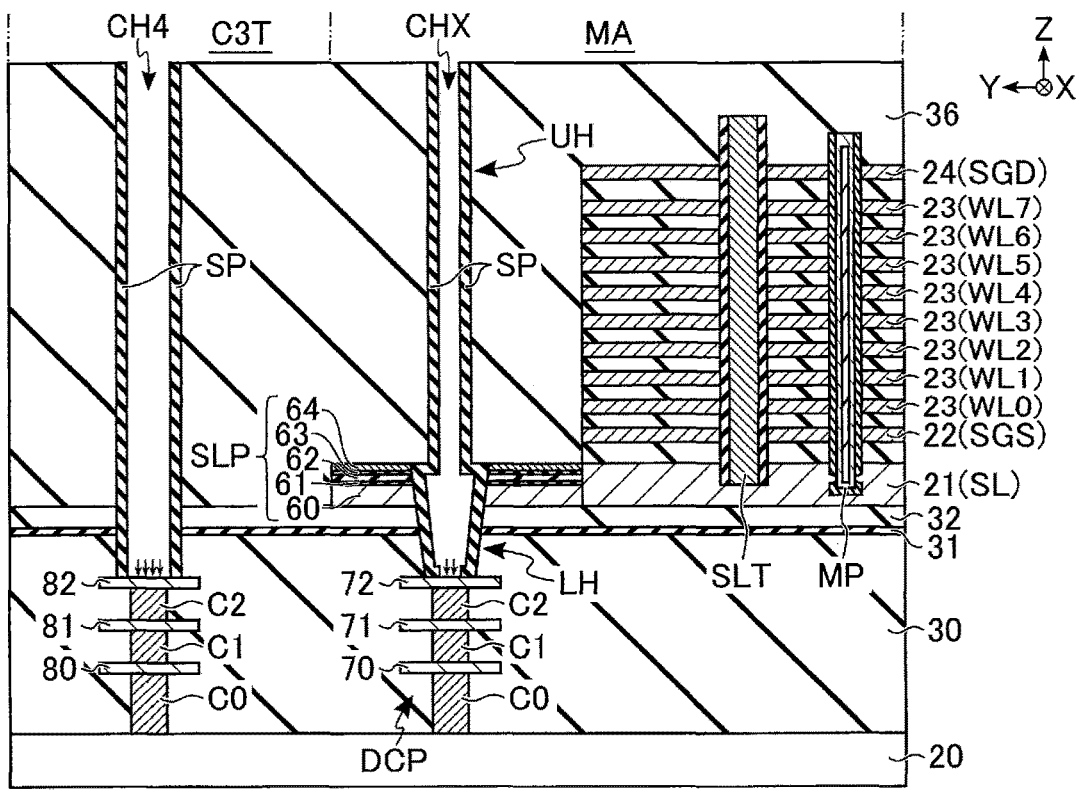
Figure 27:
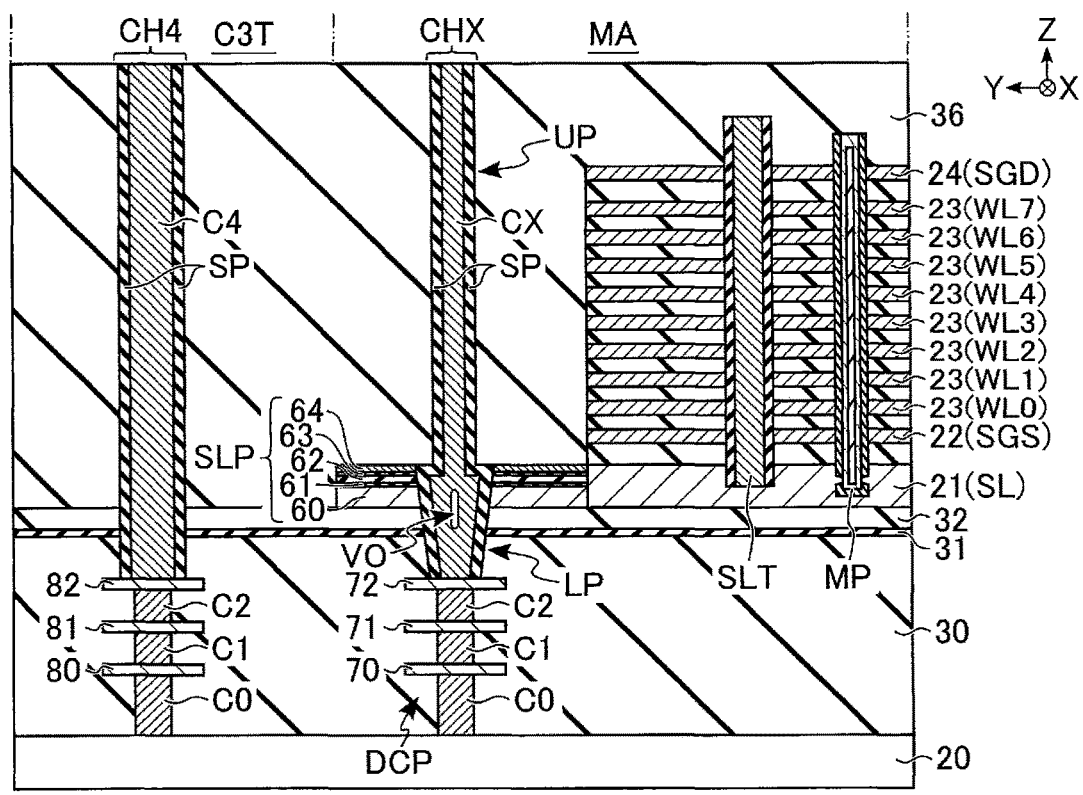

Next, the spacer SP and contact C4 are formed in the hole CH4, and the spacer SP and contact CX are formed in the hole CHX (step S111). Specifically, at first, as illustrated in FIG. 25, spacers SP are formed on side surfaces and bottom surfaces of the hole CH4 and hole CHX. Then, as illustrated in FIG. 26, the spacers SP formed on the bottom portions of the hole CH4 and hole CHX are removed by anisotropic etching. Subsequently, conductors are formed in a manner to fill the hole CH4 and the hole CHX. At this time, due to the difference in diameter between the hole LH and the hole UH, a void VO can be formed in the hole LH. Thereafter, the conductors formed outside the holes CH4 and CHX are removed by, for example, an etch-back process. Thereby, as illustrated in FIG. 27, the spacer SP and contact C4 are formed in the hole CH4, and the spacer SP and contact CX are formed in the hole CHX.

[1-3] Advantageous Effects of the First Embodiment

According to the semiconductor memory device 1 of the first embodiment described above, a yield of the semiconductor memory device 1 can be improved. Hereinafter, the details of advantageous effects of the semiconductor memory device 1 according to the first embodiment will be described.

In a manufacturing process of a semiconductor memory device in which memory cells are three-dimensionally stacked, for example, a memory hole is formed in a structure in which sacrificial members and insulating members are alternately stacked, and a semiconductor member and the like corresponding to the memory cell and the like are formed in the memory hole. In an etching process of forming the memory hole, positive charge is accumulated in the bottom portion of the memory hole as the etching progresses, and a conductor (e.g. the source line SL) reached by the bottom portion of the memory hole may be positively charged. Then, a voltage difference between the positively charged conductor and the negatively charged wafer becomes large, and arcing due to the voltage difference may occur between the conductor and the wafer. Such arcing can occur, in particular, during processing of high aspect ratio memory holes and slits.

By contrast, the semiconductor memory device 1 according to the first embodiment includes a discharge path via the discharge portion DCP in the high aspect ratio etching process. FIG. 28 is a cross-sectional view illustrating an example of cross-sectional structure during manufacturing of the semiconductor memory device 1 according to the first embodiment. Part (A) of FIG. 28 exemplarily illustrates a state of formation of the slit SLT. Part (B) of FIG. 28 exemplarily illustrates a structure after the contact CX is formed in the same region as in part (A) of FIG. 28.

As illustrated in part (A) of FIG. 28, when the slit SLT is formed, the conductive layers 64 and 60 are electrically connected to the semiconductor substrate 20 via the conductive member 100 of the discharge portion DCP. Thus, when the slit SLT is formed, positive charge accumulated in the bottom portion of the slit SLT can be discharged to the semiconductor substrate 20 via the conductive member 100 of the discharge portion DCP. In other words, in the semiconductor memory device 1 according to the first embodiment, the conductive member 100 connected to the conductive layers 64 and 60, and the contacts C0 to C2 and conductive layers 70 to 72 between the conductive member 100 and the semiconductor substrate 20, function as the discharge path at the time of the high aspect ratio etching.

In this manner, the semiconductor memory device 1 according to the first embodiment suppresses a voltage difference between the source line portion SLP and the semiconductor substrate 20 by discharging the positive charge to the semiconductor substrate 20 in the high aspect ratio etching process. As a result, the semiconductor memory device 1 according to the first embodiment can suppress the occurrence of a defect due to the influence of arcing, and can improve the yield.

Note that when the source line SL and the semiconductor substrate 20 are electrically connected, a loss of electric power can occur due to the release of the voltage applied to the source line SL into the semiconductor substrate 20. It is thus preferable that the source line SL and the semiconductor substrate 20 are separated when the semiconductor memory device 1 is operated.

Taking the above into account, in the semiconductor memory device 1 according to the first embodiment, as illustrated in part (B) of FIG. 28, after the replacement process of the source line portion SLP and the stacked wiring portion is completed, the conductive member 100 is removed, and the contacts C0 to C2, and CX of the discharge portion DCP are electrically insulated from the source line SL by the spacer SP. As a result, the semiconductor memory device 1 according to the first embodiment can suppress the loss at a time of applying a voltage to the source line SL.

In addition, in the semiconductor memory device 1 according to the first embodiment, the structure of the discharge portion DCP is formed at the same time as other contacts (e.g. contact C4) or the like. As a result, the semiconductor memory device 1 according to the first embodiment can suppress an increase in the number of manufacturing steps due to the addition of the discharge portion DCP, and can hold down the manufacturing cost of the semiconductor memory device 1.

Furthermore, the semiconductor memory device 1 according to the first embodiment can independently drive the contact CX and the like provided in the discharge portion DCP, and the source line SL, at the time of various operations. As a result, in the semiconductor memory device 1 according to the first embodiment, the contact CX and the like provided in the discharge portion DCP can be used for the connection of wiring lines, and the like. For example, the discharge portion DCP may be used as a wiring connected to a guard ring, or a part of the sealing member. Concrete examples of these will be described in a seventh embodiment and an eighth embodiment.

Besides, in the first embodiment, the case was exemplified in which the slit SLT and the contacts CX and C4 are formed in different manufacturing steps, but the first embodiment is not limited to this case. The slit SLT and the contacts CX and C4 may be formed batchwise. In this case, too, a material capable of increasing an etching selectivity to the source line SL and the conductive layer 72 is used for the conductive member 100.

[2] Second Embodiment

A semiconductor memory device 1 according to a second embodiment has such a structure that the source line SL and the discharge portion DCP are separated by using dry etching. Hereinafter, the semiconductor memory device 1 according to the second embodiment will be described with respect to different points from the first embodiment.

[2-1] Structure of Semiconductor Memory Device 1

Figure 29:
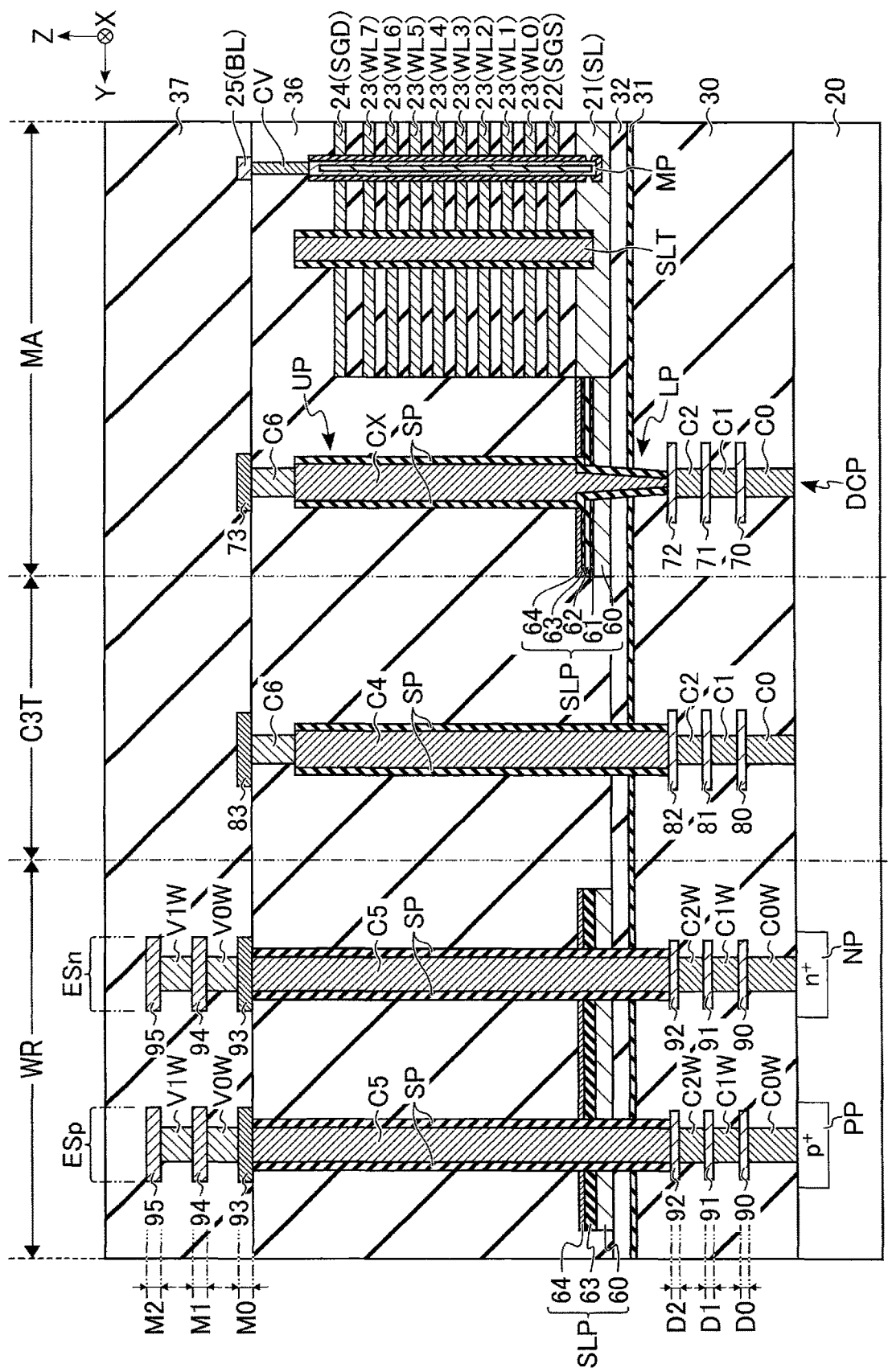
FIG. 29 is a cross-sectional view illustrating an example of cross-sectional structure of a memory region, a contact region and a wall region of a semiconductor memory device according to a second embodiment.

FIG. 29 is a cross-sectional view illustrating an example of cross-sectional structure in a memory region MA, a contact region C3T and a wall region WR of the semiconductor memory device 1 according to the second embodiment. FIG. 29 illustrates the same region as the cross-sectional structure of the semiconductor memory device 1 according to the first embodiment illustrated in FIG. 11. As illustrated in FIG. 29, the semiconductor memory device 1 according to the second embodiment includes a discharge portion DCP of a different structure from the first embodiment. The discharge portion DCP of the second embodiment includes, for example, contacts C0 to C2, CX and C6, conductive layers 70 to 73, and a spacer SP.

Specifically, like the first embodiment, the contacts C0 to C2 and conductive layers 70 to 72 are provided on the semiconductor substrate 20. The contact CX is provided on the conductive layer 72. The conductive layer 73 is provided on the contact CX via the contact C6. The spacer SP is provided on the side surface of the contact CX. The contact CX is in contact with the source line portion SLP via the spacer SP, and is insulated from the source line SL. In the second embodiment, the contact CX can be electrically connected to the semiconductor substrate 20 via the contacts C0 to C2 and the conductive layers 70 to 72.

The lower portion LP of the contact CX of the second embodiment is provided on the conductive layer 72, and penetrates the source line portion SLP. The upper portion UP of the contact CX is provided on the lower portion LP, and penetrates a part of the insulating layer 36. A boundary plane (boundary part) between the lower portion LP and upper portion UP of the contact CX is included in the range of the height of the layer in which the source line SL is provided. In the vicinity of the boundary part between the lower portion LP and upper portion UP of the contact CX, the outside diameter of the upper portion UP of the contact CX is greater than the outside diameter of the lower portion LP. In addition, in the vicinity of the boundary part between the lower portion LP and upper portion UP of the contact CX, the cross-sectional area of the upper portion UP in a plane parallel to the surface of the semiconductor substrate 20 is greater than the cross-sectional area of the lower portion LP in the plane parallel to the surface of the semiconductor substrate 20. The spacer SP includes a stepped portion at the boundary part between the upper portion UP and the lower portion LP.

The contact C4 of the second embodiment is connected to the conductive layer 83 via, for example, a contact C6. In addition, in the second embodiment, as will be described later, the slit SLT and the contacts CX and C4 are formed batchwise. Thus, in the second embodiment, the height of the slit SLT and the height of the contacts CX and C4 are aligned. In other words, the height of the upper end of the slit SLT, the height of the upper end of the contact CX and the height of the upper end of the contact C4 are substantially equal. The other structure of the semiconductor memory device 1 according to the second embodiment is the same as in the first embodiment.

[2-2] Manufacturing Method of Semiconductor Memory Device 1

Figure 30:
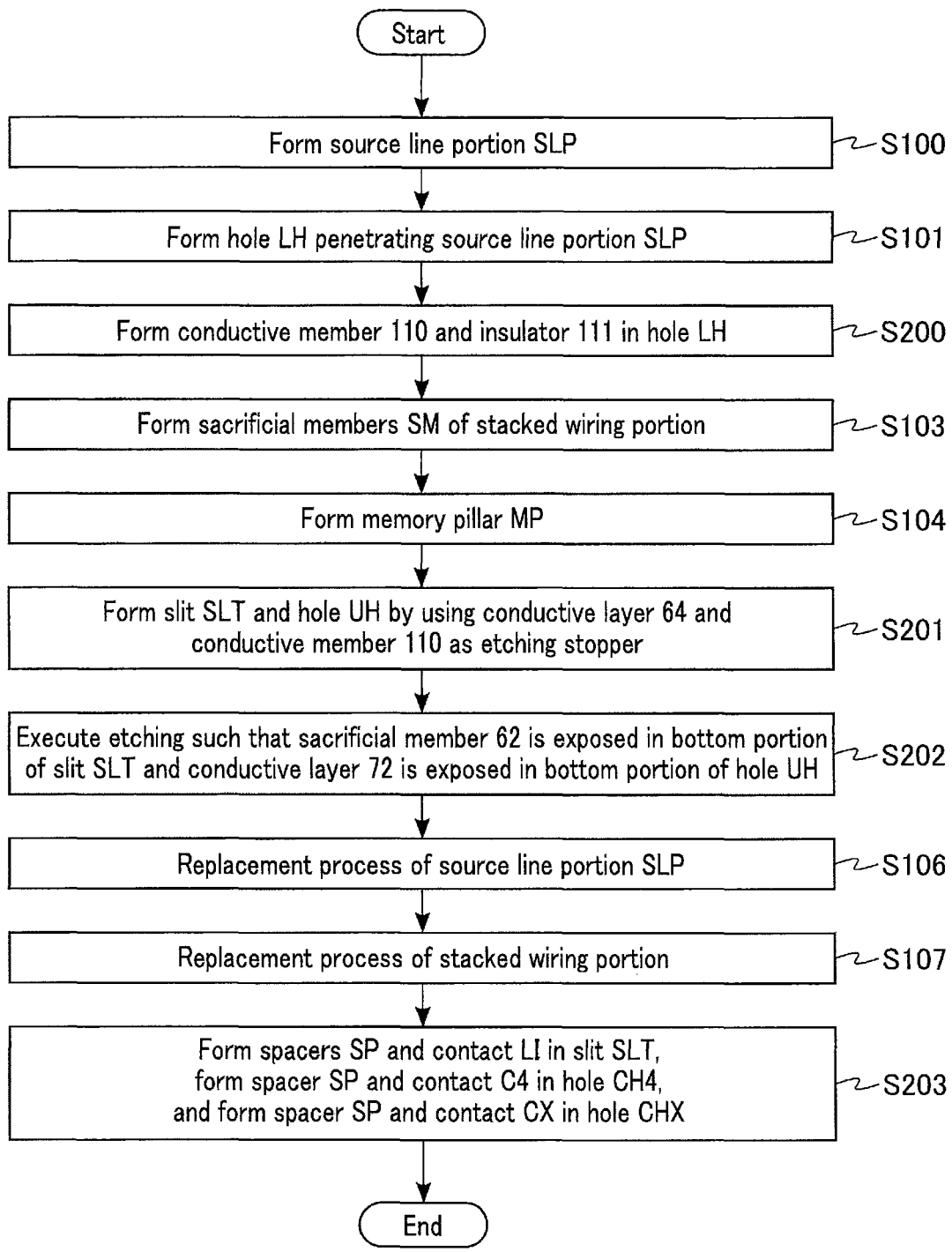
FIG. 30 is a flowchart illustrating an example of a method of manufacturing the semiconductor memory device according to the second embodiment.

FIG. 30 is a flowchart illustrating an example of a method of manufacturing the semiconductor memory device 1 according to the second embodiment, FIG. 30 illustrating an example of manufacturing steps relating to the formation of the discharge portion DCP and the memory cell array 10. FIGS. 31 to 36 are cross-sectional views illustrating an example of cross-sectional structure during manufacturing of the semiconductor memory device 1 according to the second embodiment. Each of FIG. 31 to FIG. 36 illustrates a region in which the memory region MA and contact region C3T illustrated in FIG. 29 are extracted. Hereinafter, referring to FIG. 30 where necessary, forming steps of the discharge portion DCP and memory cell array 10 in the second embodiment will be described.

To start with, like the first embodiment, the source line portion SLP is formed (step S100).

Next, like the first embodiment, the hole LH penetrating the source line portion SLP is formed (step S101).

Subsequently, a conductive member 110 and an insulator 111 are formed in the hole LH (step S200). Specifically, at first, as illustrated in FIG. 31, the conductive member 110 and insulator 111 are formed in the named order in a manner to fill the hole LH. Thereafter, an etch-back process or CMP is executed, and, as illustrated in FIG. 32, a structure in which the conductive member 110 and insulator 111 remain in the hole LH is formed. The conductive member 110 is formed in a layer shape along the side surface and bottom surface of the hole LH. The conductive member 110 is, for example, polysilicon. Note that when the conductive member 110 is the same material as the conductive layer 64, the conductive member 110 may be formed at the same time as the conductive layer 64.

Next, as illustrated in FIG. 33, like the first embodiment, the sacrificial members SM of the stacked wiring portion are formed (step S103).

Then, like the first embodiment, the memory pillar MP is formed (step S104).

Next, as illustrated in FIG. 34, a slit SLT and a hole UH are formed by using the conductive layer 64 and conductive member 110 as an etching stopper (step S201). Specifically, at first, by photolithography, for example, a mask with openings in portions, in which the slit SLT and hole UH are formed, is formed. Then, an anisotropic etching process using the mask is executed. In this step, the slit SLT divides the insulating layer 36-2, stacked sacrificial members SM and insulating layer 33, and a part of the conductive layer 64 is exposed in the bottom portion of the slit SLT. In the present step, the hole UH is provided to penetrate the insulating layer 36-2, and the insulator 111 in the hole LH is removed. Thereby, a surface of the conductive member 110 in the hole LH is exposed via the hole UH. Note that, in the present step, as illustrated in FIG. 34, a hole CH4 may be formed. The hole CH4 penetrates the insulating layers 36-2, 32 and 31, and a surface of the conductive layer 82 is exposed in the bottom portion of the hole CH4.

Subsequently, as illustrated in FIG. 35, an etching process is executed such that the sacrificial member 62 is exposed in the bottom portion of the slit SLT, and the conductive layer 72 is exposed in the bottom portion of the hole UH (step S202). Specifically, an anisotropic etching process (dry etching process) is executed, and portions exposed in the bottom portions of the slit SLT, hole UH and hole CH4 are etched. In the present step, the bottom portion of the slit SLT divides at least the insulating layer 63, and does not divide the insulating layer 61. In this step, the conductive member 110 provided on the side surface and bottom surface of the hole LH is removed. Note that, in the present step, it suffices that the source line SL and the conductive layer 72 are electrically insulated by the removal of at least a part of the conductive member 110. In this step, the bottom portion of the hole CH4 is designed not to penetrate the conductive layer 82.

Next, like the first embodiment, the replacement process of the source line portion SLP is executed (step S106).

Subsequently, like the first embodiment, the replacement process of the stacked wiring portion is executed (step S107).

Next, the spacers SP and contact LI are formed in the slit SLT, the spacer SP and contact C4 are formed in the hole CH4, and the spacer SP and contact CX are formed in the hole CHX (step S203). Specifically, at first, spacers SP are formed on side surfaces and bottom surfaces of the slit SLT, hole CH4 and hole CHX. Then, the spacers SP formed on the bottom portions of the slit SLT, hole CH4 and hole CHX are removed by anisotropic etching. Subsequently, conductors are formed in a manner to fill the slit SLT, hole CH4 and hole CHX. Thereafter, the conductors formed outside the slit SLT, hole CH4 and hole CHX are removed by, for example, an etch-back process. Thereby, as illustrated in FIG. 36, the spacers SP and contact LI are formed in the slit SLT, the spacer SP and contact C4 are formed in the hole CH4, and the spacer SP and contact CX are formed in the hole CHX.

[2-3] Advantageous Effects of the Second Embodiment

In the semiconductor memory device 1 according to the second embodiment, for example, when the slit SLT is formed, the conductive layers 64 and 60 are electrically connected to the semiconductor substrate 20 via the conductive member 110 of the discharge portion DCP. Thus, when the slit SLT is formed, the positive charge accumulated in the bottom portion of the slit SLT can be discharged to the semiconductor substrate 20 via the conductive member 110 of the discharge portion DCP. In other words, in the semiconductor memory device 1 according to the second embodiment, the conductive member 110 connected to the conductive layers 64 and 60, and the contacts C0 to C2 and conductive layers 70 to 72 between the conductive member 110 and the semiconductor substrate 20, function as the discharge path at the time of the high aspect ratio etching.

Thereby, like the first embodiment, the semiconductor memory device 1 according to the second embodiment can suppress the voltage difference between the source line SL and the semiconductor substrate 20. Accordingly, the semiconductor memory device 1 according to the second embodiment can suppress the occurrence of a defect due to the influence of arcing, and can improve the yield.

In addition, in the semiconductor memory device 1 according to the second embodiment, after the replacement process of the source line SLP and the stacked wiring portion is completed, the conductive member 110 is removed, and the contacts C0 to C2, CX and C6 of the discharge portion DCP are electrically insulated from the source line SL by the spacer SP. As a result, like the first embodiment, the semiconductor memory device 1 according to the second embodiment can suppress the loss at a time of applying a voltage to the source line SL.

Moreover, in the semiconductor memory device 1 according to the second embodiment, the structure of the discharge portion DCP is formed at the same time as the slit SLT. As a result, the semiconductor memory device 1 according to the second embodiment can suppress an increase in the number of manufacturing steps due to the addition of the discharge portion DCP, and can hold down the manufacturing cost of the semiconductor memory device 1.

Besides, the semiconductor memory device 1 according to the second embodiment can independently drive the contact CX and the like provided in the discharge portion DCP, and the source line SL, at the time of various operations. As a result, in the semiconductor memory device 1 according to the second embodiment, like the first embodiment, the contact CX and the like provided in the discharge portion DCP can be used for the connection of wiring lines, and the like.

[3] Third Embodiment

A semiconductor memory device 1 according to a third embodiment has such a structure that the source line SL and the discharge portion DCP are separated by using dry etching, by a different structure from the second embodiment. Hereinafter, the semiconductor memory device 1 according to the third embodiment will be described with respect to different points from the first and second embodiments.

[3-1] Structure of Semiconductor Memory Device 1

Figure 37:
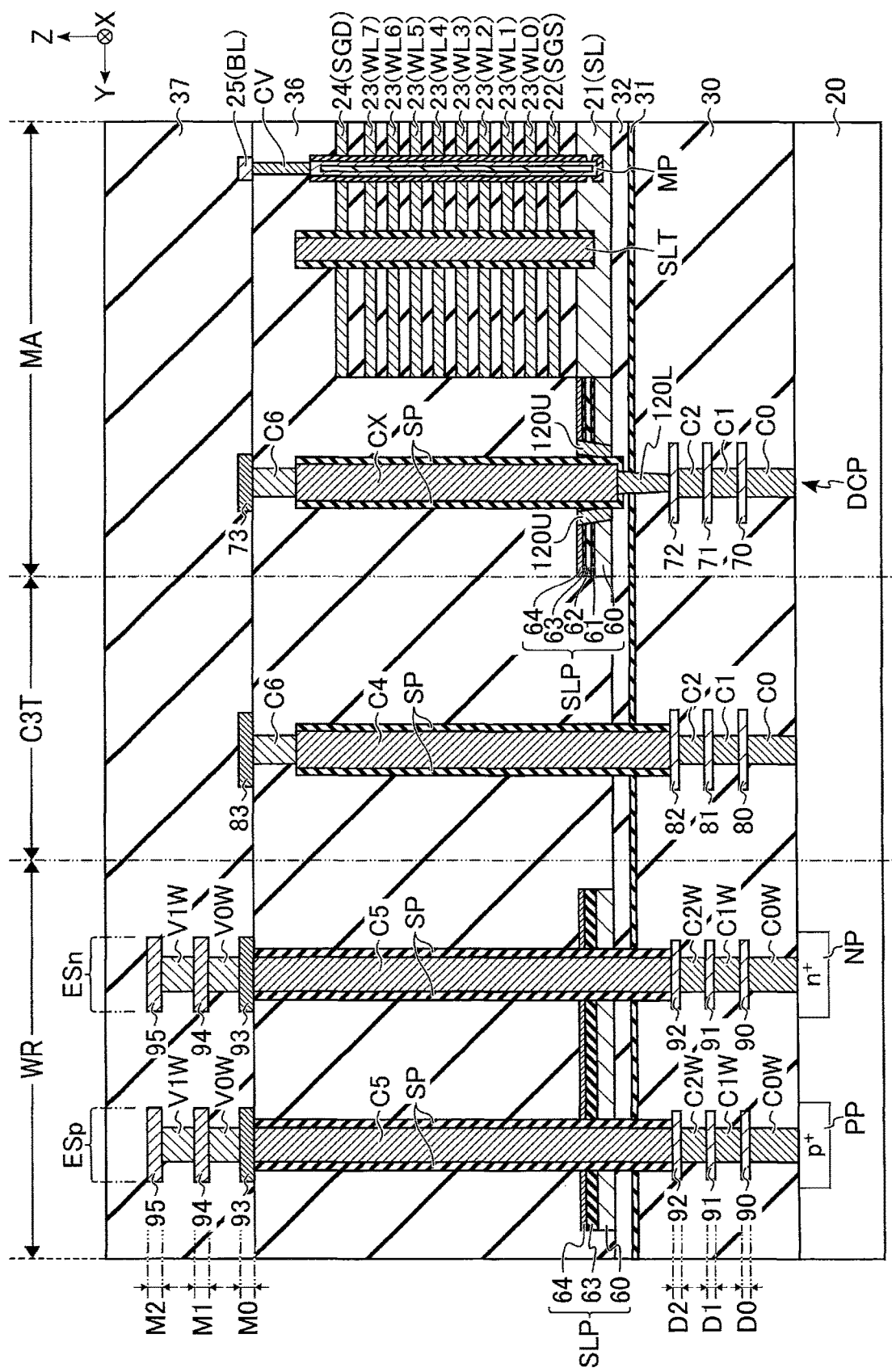
FIG. 37 is a cross-sectional view illustrating an example of cross-sectional structure in a memory region, a contact region and a wall region of a semiconductor memory device according to a third embodiment.

FIG. 37 is a cross-sectional view illustrating an example of cross-sectional structure in a memory region MA, a contact region C3T and a wall region WR of the semiconductor memory device 1 according to the third embodiment. FIG. 37 illustrates the same region as the cross-sectional structure of the semiconductor memory device 1 according to the first embodiment illustrated in FIG. 11. As illustrated in FIG. 37, the semiconductor memory device 1 according to the third embodiment includes a discharge portion DCP of a different structure from the first embodiment. The discharge portion DCP of the third embodiment includes, for example, contacts C0 to C2, CX and C6, conductive layers 70 to 73, conductive members 120L and 120U, and a spacer SP.

Specifically, like the first embodiment, the contacts C0 to C2 and conductive layers 70 to 72 are provided on the semiconductor substrate 20. The conductive member 120L is provided on the conductive layer 72. The contact CX is provided on the conductive member 120L. The conductive layer 73 is provided on the contact CX via the contact C6. The spacer SP is provided on the side surface of the contact CX. The contact CX is in contact with the source line portion SLP via the spacer SP and the conductive member 120U, and is insulated from the source line SL. The conductive member 120U is provided between the spacer SP on the side surface of the contact CX and the source line portion SLP at the same height as the source line portion SLP. In the third embodiment, the contact CX can be electrically connected to the semiconductor substrate 20 via the contacts C0 to C2 and the conductive layers 70 to 72. A connection interface can be formed between the conductive member 120L and the contact CX. The connection interface is included in the range of the height between the semiconductor substrate 20 and the source line SL.

In the third embodiment, the set of the contact CX, spacer SP and conductive member 120L may be regarded as a member formed in holes UH and LHL, which will be described later. In the third embodiment, this member includes a first portion (the contact CX and spacer SP) which is far from the semiconductor substrate 20, and a second portion (the conductive member 120L) which is near the semiconductor substrate 20, with reference to the boundary part between the contact CX and the conductive member 120L. The spacer SP is continuously provided on the side surface portion of the contact CX, and a part of the spacer SP can be in contact with an upper part of the conductive member 120L. The spacer SP insulates the source line portion SLP from the set of the contact CX and the conductive member 120L. In addition, this member includes a stepped portion at the boundary part between the first portion (the contact CX and spacer SP) and the second portion (the conductive member 120L). The height of the boundary part is included in the range of the height between the semiconductor substrate 20 and the source line SL. In the vicinity of the boundary part, the diameter of the contact CX is greater than the diameter of the conductive member 120L. In addition, in the vicinity of the boundary part between the contact CX and the conductive member 120L in this member, the cross-sectional area of the contact CX in a plane parallel to the surface of the semiconductor substrate 20 is greater than the cross-sectional area of the conductive member 120L in the plane parallel to the surface of the semiconductor substrate 20.

The conductive members 120L and 120U are formed of the same material. The conductive member 120L penetrates the insulating layer 31 and a part of the insulating layer 30. The shape of the conductive member 120L is, for example, columnar. The shape of the conductive member 120U is, for example, cylindrical. The outside diameter of the conductive member 120U is greater than the outside diameter of the conductive member 120L. The inside diameter of the conductive member 120U is greater than the outside diameter of the conductive member 120L. The conductive member 120L and the conductive member 120U are spaced apart. In other words, the conductive member 120L and the conductive member 120U are divided by the set of the contact CX and spacer SP. The position of the bottom portion of the spacer SP is closer to the semiconductor substrate 20 than at least the lower surface of the conductive layer 60.

In the third embodiment, as will be described later, the slit SLT, and the contacts CX and C4 are formed batchwise. Thus, in the third embodiment, the height of the slit SLT and the height of the contacts CX and C4 are aligned. In other words, the height of the upper end of the slit SLT, the height of the upper end of the contact CX and the height of the upper end of the contact C4 are substantially equal. The other structure of the semiconductor memory device 1 according to the third embodiment is the same as in the first embodiment.

[3-2] Manufacturing Method of Semiconductor Memory Device 1

Figure 38:
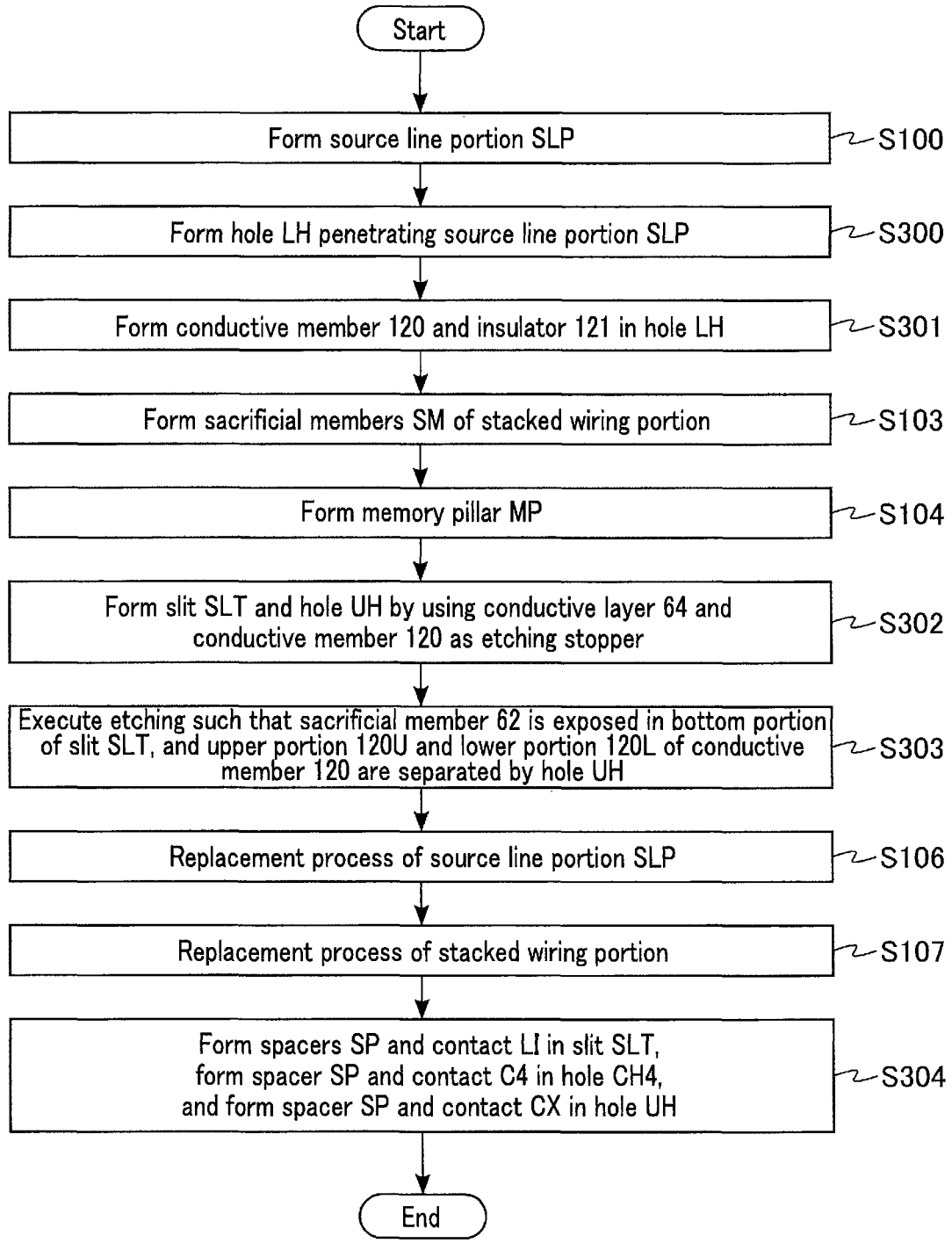
FIG. 38 is a flowchart illustrating an example of a method of manufacturing the semiconductor memory device according to the third embodiment.

FIG. 38 is a flowchart illustrating an example of a method of manufacturing the semiconductor memory device 1 according to the third embodiment, FIG. 38 illustrating an example of manufacturing steps relating to the formation of the discharge portion DCP and the memory cell array 10. FIGS. 39 to 45 are cross-sectional views illustrating an example of cross-sectional structure during manufacturing of the semiconductor memory device 1 according to the third embodiment. Each of FIG. 39 to FIG. 45 illustrates a region in which the memory region MA and contact region C3T illustrated in FIG. 37 are extracted. Hereinafter, referring to FIG. 38 where necessary, forming steps of the discharge portion DCP and memory cell array 10 in the third embodiment will be described.

To start with, like the first embodiment, the source line portion SLP is formed (step S100).

Next, as illustrated in FIG. 39, a hole LH penetrating the source line portion SLP is formed (step S300). The hole LH of the third embodiment is formed by, for example, two times of a lithography and an etching process. Specifically, the hole LH of the third embodiment is a combination of holes LHL and LHH. The hole LHL is provided to penetrate the insulating layers 32 and 31 and a part of the insulating layer 30, and a surface of the conductive layer 72 is exposed in the bottom portion of the hole LHL. The hole LHH is provided to penetrate the source line portion SLP, and a surface of the insulating layer 32 is exposed in the bottom portion of the hole LHH. The bottom surface of the hole LHH is aligned with, for example, the upper surface of the insulating layer 32. The diameter of the hole LHH is greater than the diameter of the hole LHL. In plan view, the area in which the hole LHH is formed includes the hole LHL.

Figure 41:
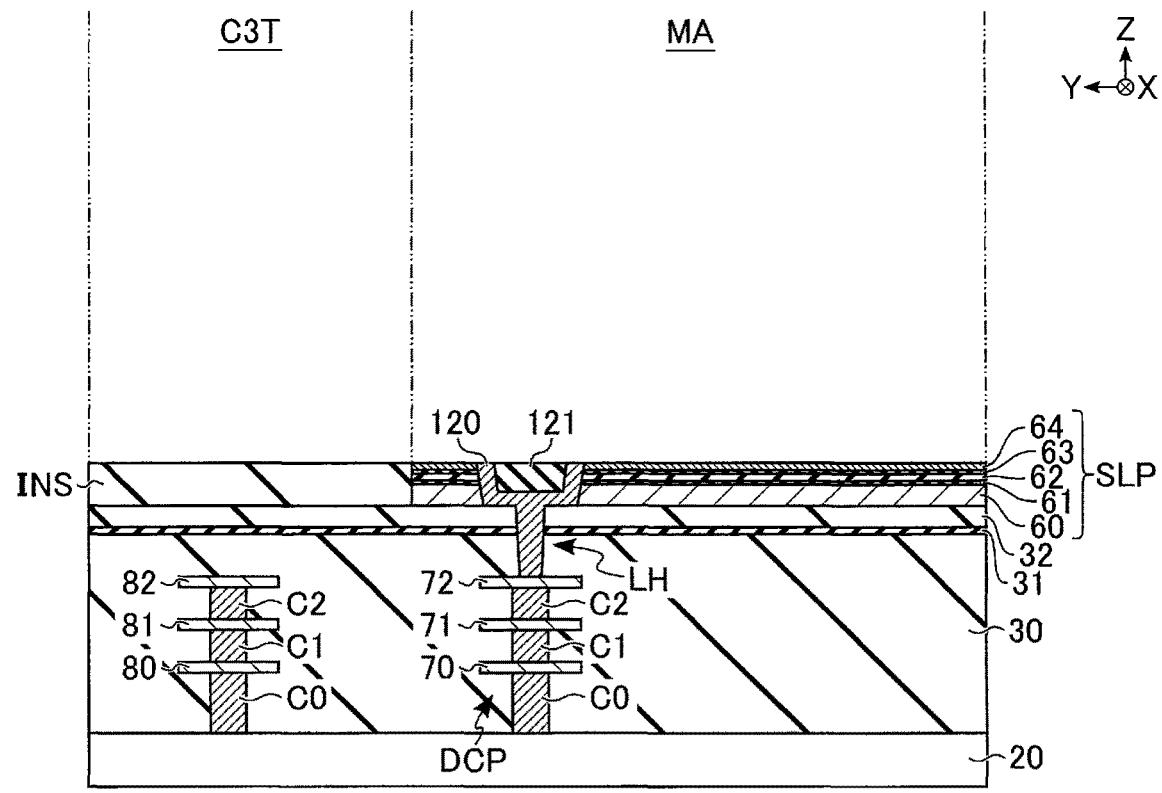

Subsequently, a conductive member 120 and an insulator 121 are formed in the hole LH (step S301). Specifically, at first, as illustrated in FIG. 40, the conductive member 120 and insulator 121 are formed in the named order in a manner to fill the hole LH. Thereafter, an etch-back process or CMP is executed, and, as illustrated in FIG. 41, a structure in which the conductive member 120 and insulator 121 remain in the hole LH is formed. The conductive member 120 is formed in a layer shape along the side surface and bottom surface of the hole LHH, and is buried, for example, in the hole LHL. The conductive member 120 is, for example, tungsten.

Figure 42:
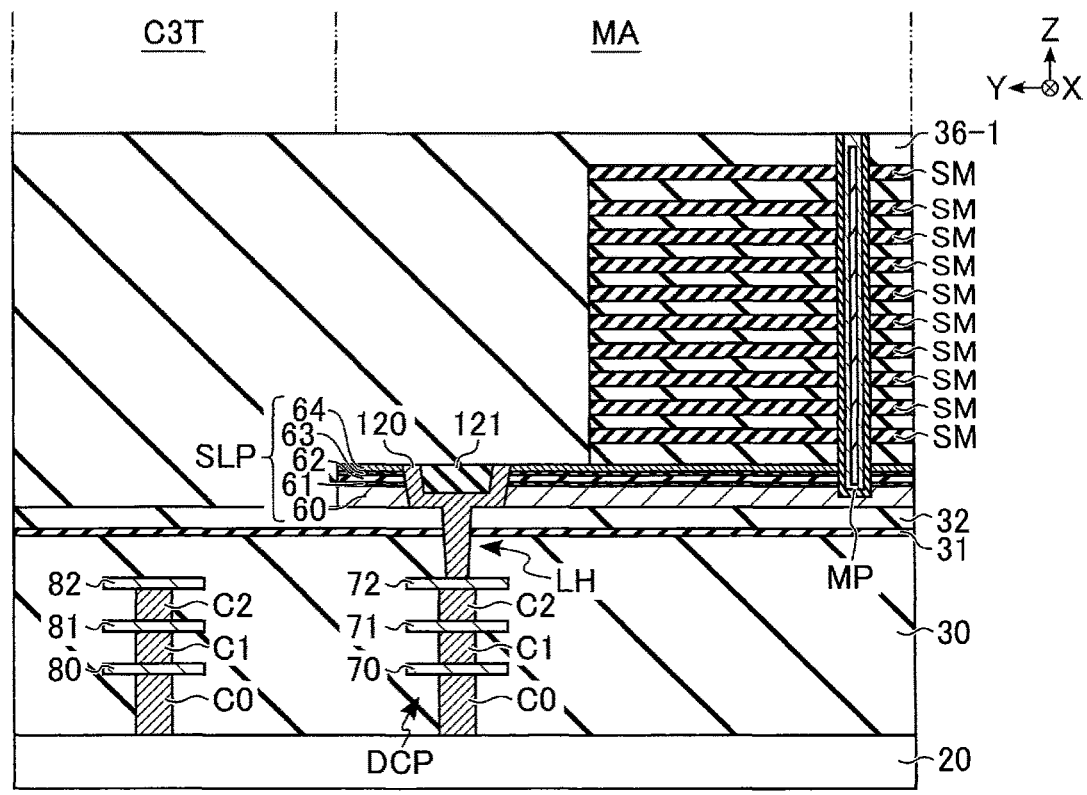

Next, as illustrated in FIG. 42, like the first embodiment, the sacrificial members SM of the stacked wiring portion are formed (step S103).

Then, like the first embodiment, the memory pillar MP is formed (step S104).

Figure 43:
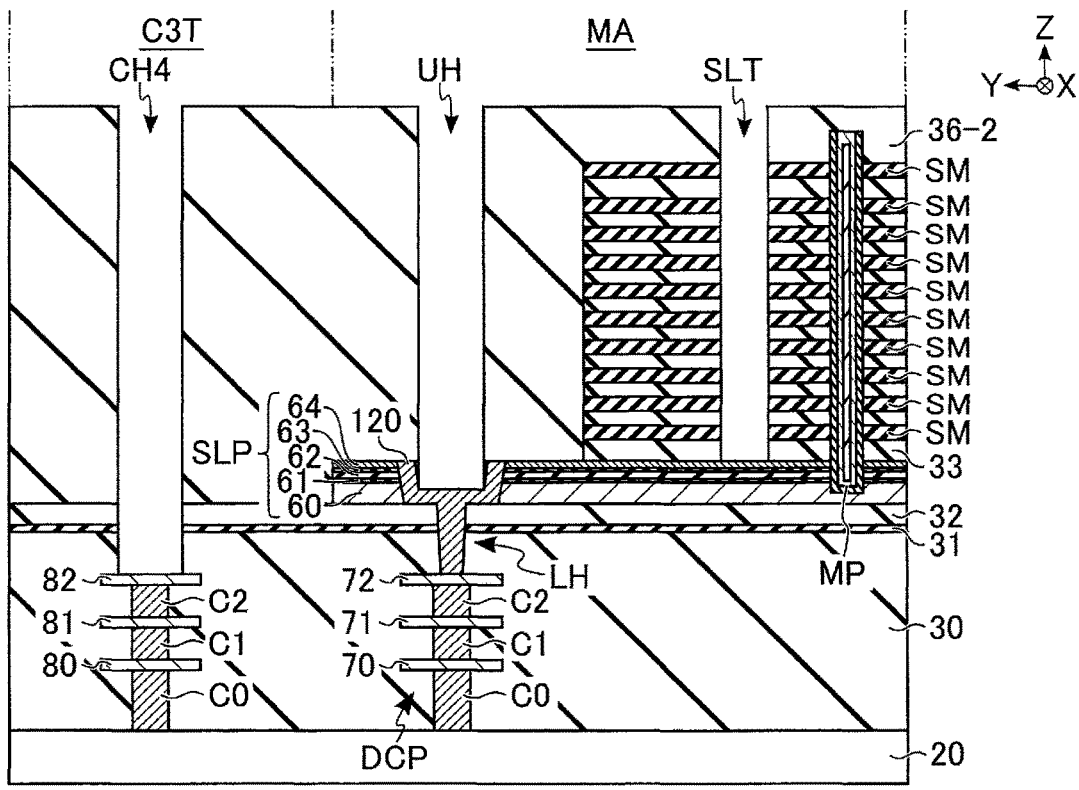

Next, as illustrated in FIG. 43, a slit SLT and a hole UH are formed by using the conductive layer 64 and conductive member 120 as an etching stopper (step S302). Specifically, at first, by photolithography, for example, a mask with openings in portions, in which the slit SLT and hole UH are formed, is formed. Then, an anisotropic etching process using the mask is executed. In this step, the slit SLT divides the insulating layer 36-2, stacked sacrificial members SM and insulating layer 33, and a part of the conductive layer 64 is exposed in the bottom portion of the slit SLT. In the present step, the hole UH is provided to penetrate the insulating layer 36-2, and a surface of the conductive member 120 is exposed in the bottom portion of the hole UH. Note that, in the present step, as illustrated in FIG. 43, a hole CH4 may be formed. The hole CH4 penetrates the insulating layers 36-2, 32 and 31, and a surface of the conductive layer 82 is exposed in the bottom portion of the hole CH4.

Figure 44:
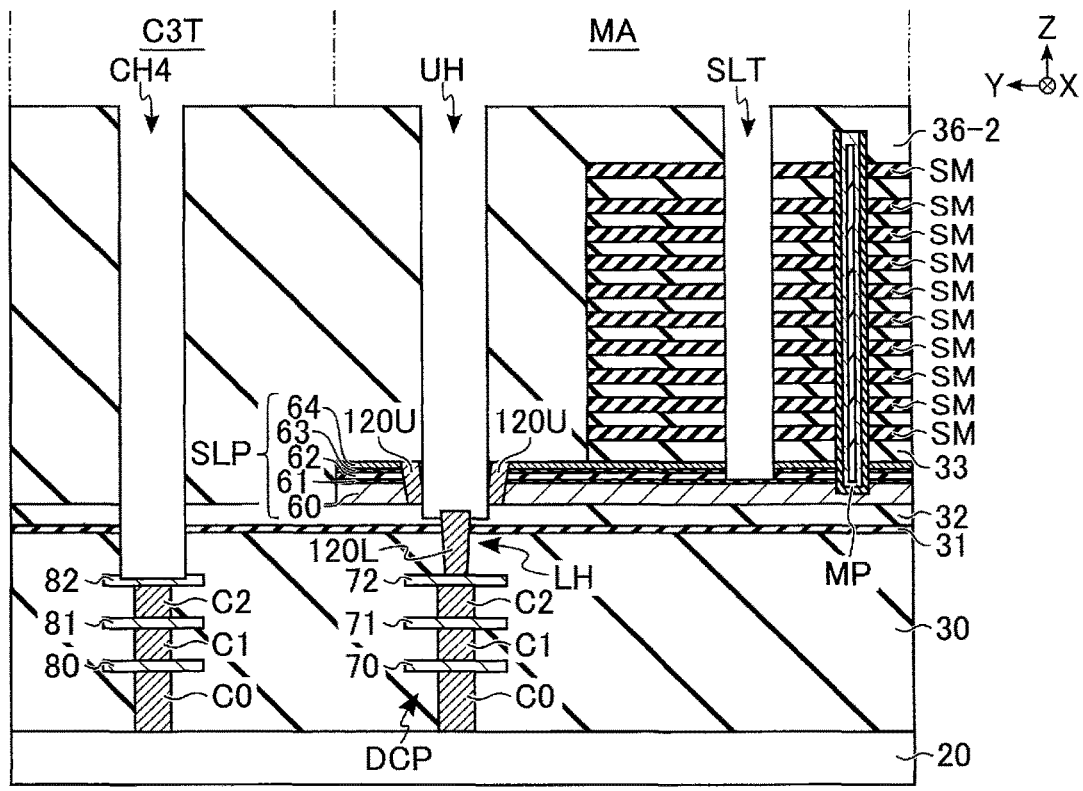

Subsequently, as illustrated in FIG. 44, an etching process is executed such that the sacrificial member 62 is exposed in the bottom portion of the slit SLT, and the upper portion (120U) and lower portion (120L) of the conductive member 120 are separated by the hole UH (step S303). Specifically, an anisotropic etching process (dry etching process) is executed, and portions exposed in the bottom portions of the slit SLT, hole UH and hole CH4 are etched. In the present step, the bottom portion of the slit SLT divides at least the insulating layer 63, and does not divide the insulating layer 61. In this step, the bottom portion of the hole UH divides, at least, the portion (120U) provided in the hole LHH of the conductive member 120 from the portion (120L) provided in the hole LHL of the conductive member 120. In this step, the bottom portion of the hole CH4 is designed not to penetrate the conductive layer 82.

Next, like the first embodiment, the replacement process of the source line portion SLP is executed (step S106).

Subsequently, like the first embodiment, the replacement process of the stacked wiring portion is executed (step S107).

Next, the spacers SP and contact LI are formed in the slit SLT, the spacer SP and contact C4 are formed in the hole CH4, and the spacer SP and contact CX are formed in the hole UH (step S304). Specifically, at first, spacers SP are formed on side surfaces and bottom surfaces of the slit SLT, hole CH4 and hole UH. Then, the spacers SP formed on the bottom portions of the slit SLT, hole CH4 and hole UH are removed by anisotropic etching. Subsequently, conductors are formed in a manner to fill the slit SLT, hole CH4 and hole UH. Thereafter, the conductors formed outside the slit SLT, hole CH4 and hole UH are removed by, for example, an etch-back process. Thereby, as illustrated in FIG. 45, the spacers SP and contact LI are formed in the slit SLT, the spacer SP and contact C4 are formed in the hole CH4, and the spacer SP and contact CX are formed in the hole UH. The contact CX is in contact with the conductive member 120L, and is electrically connected to the conductive member 120L.

(Variations of Structure of Discharge Portion DCP)

FIGS. 46 and 47 are cross-sectional views illustrating an example of cross-sectional structure during manufacturing of the semiconductor memory device 1 according to the third embodiment, and illustrate variations of the shape of the discharge portion DCP, which depend on differences in size between the hole UH and the conductive member 120. Hereinafter, the outside diameter of an upper portion of a hole LHL is defined as "W1", and the inside diameter of a lower portion of a hole LHU at a time of forming the conductive member 120 on the side surface and bottom surface of the hole LHU is defined as "W2". Note that W2 is designed to be greater than W1. In FIGS. 46 and 47, part (A) illustrates a state before the formation of the hole UH, part (B) illustrates a state after the process of step S302, part (C) illustrates a state after the process of step S303, and part (D) illustrates a state after the process of step S304.

In the example illustrated in FIG. 46, as illustrated in part (B) of FIG. 46, the inside diameter W3 of the hole UH is greater than W1 and is less than W2. In addition, a side wall portion of the hole UH is disposed between the inside of the hole LHU and the outside of the hole LHL. In this case, as illustrated in part (C) of FIG. 46, a bottom portion of a recessed part of the conductive member 120U is etched. Further, as illustrated in part (D) of FIG. 46, the side surface of the spacer SP is formed in a substantially flush shape from the part of the hole LHU to the bottom portion of the hole UH.

In the example illustrated in FIG. 47, as illustrated in part (B) of FIG. 47, the inside diameter W4 of the hole UH is greater than each of W1 and W2. In addition, a side wall portion of the hole UH is disposed in a manner to overlap the upper portion of the recessed part of the hole LHU. In this case, as illustrated in part (C) of FIG. 47, the hole UH includes a portion which is etched along the inner wall of the recessed part of the conductive member 120U. Furthermore, as illustrated in part (D) of FIG. 46, the side surface of the spacer SP is provided in a shape along the recessed part of the hole LHU.

[3-3] Advantageous Effects of the Third Embodiment

In the semiconductor memory device 1 according to the third embodiment, for example, when the slit SLT is formed, the conductive layers 64 and 60 are electrically connected to the semiconductor substrate 20 via the conductive member 120 of the discharge portion DCP. Thus, when the slit SLT is formed, the positive charge accumulated in the bottom portion of the slit SLT can be discharged to the semiconductor substrate 20 via the conductive member 120 of the discharge portion DCP. In other words, in the semiconductor memory device 1 according to the third embodiment, the conductive member 120 connected to the conductive layers 64 and 60, and the contacts C0 to C2 and conductive layers 70 to 72 between the conductive member 120 and the semiconductor substrate 20, function as the discharge path at the time of the high aspect ratio etching.

Thereby, like the first embodiment, the semiconductor memory device 1 according to the third embodiment can suppress the voltage difference between the source line SL and the semiconductor substrate 20. Accordingly, the semiconductor memory device 1 according to the third embodiment can suppress the occurrence of a defect due to the influence of arcing, and can improve the yield.

In addition, in the semiconductor memory device 1 according to the third embodiment, when the slit SLT is formed, the upper portion (120U) and lower portion (120L) of the conductive member 120 are divided by the hole UH, and the contacts C0 to C2, CX and C6 of the discharge portion DCP are electrically insulated from the source line SL by the spacer SP. As a result, like the first embodiment, the semiconductor memory device 1 according to the third embodiment can suppress the loss at a time of applying a voltage to the source line SL.

Moreover, in the semiconductor memory device 1 according to the third embodiment, the structure of the discharge portion DCP is formed at the same time as the slit SLT. As a result, the semiconductor memory device 1 according to the third embodiment can suppress an increase in the number of manufacturing steps due to the addition of the discharge portion DCP, and can hold down the manufacturing cost of the semiconductor memory device 1.

Besides, the semiconductor memory device 1 according to the third embodiment can independently drive the contact CX and the like provided in the discharge portion DCP, and the source line SL, at the time of various operations. As a result, in the semiconductor memory device 1 according to the third embodiment, like the first embodiment, the contact CX and the like provided in the discharge portion DCP can be used for the connection of wiring lines, and the like.

[4] Fourth Embodiment

A semiconductor memory device 1 according to a fourth embodiment is a modification of the first embodiment, and the conductor in the hole LH is removed by a method different from the method of the first embodiment. Hereinafter, the semiconductor memory device 1 according to the fourth embodiment will be described with respect to different points from the first embodiment.

[4-1] Structure of Semiconductor Memory Device 1

Figure 48:
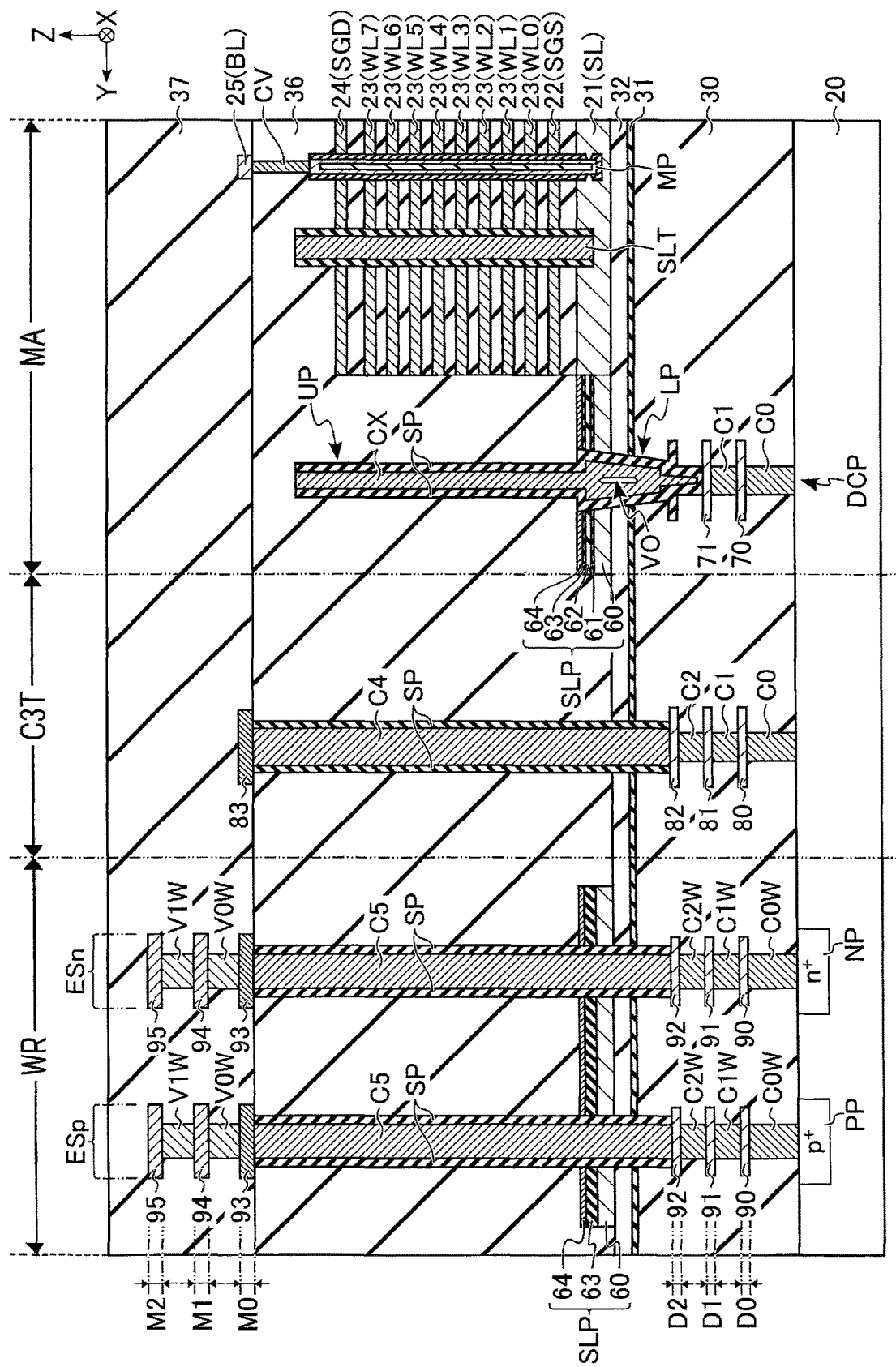
FIG. 48 is a cross-sectional view illustrating an example of cross-sectional structure in a memory region, a contact region and a wall region of a semiconductor memory device according to a fourth embodiment.

FIG. 48 is a cross-sectional view illustrating an example of cross-sectional structure in a memory region MA, a contact region C3T and a wall region WR of the semiconductor memory device 1 according to the fourth embodiment. As illustrated in FIG. 48, the semiconductor memory device 1 according to the fourth embodiment is different from the first embodiment with respect to the structure of the discharge portion DCP. The discharge portion DCP of the fourth embodiment includes, for example, contacts C0, C1 and CX, and conductive layers 70 and 71.

Specifically, like the first embodiment, the contacts C0 and C1 and conductive layers 70 and 71 are provided on the semiconductor substrate 20. The contact CX having the side surface and bottom surface covered with the spacer SP is provided on the conductive layer 71. The spacer SP of the fourth embodiment is, for example, buried in the part where the conductive layer 72 and contact C2 are provided in the first embodiment. In other words, the spacer SP of the fourth embodiment is provided in place of a part of the wiring layers D0 to D2 and contacts C0 to C2 provided from the wiring layer D2 to the semiconductor substrate 20.

In addition, the lower portion LP of the contact CX of the fourth embodiment can include a portion provided in a lower layer than the wiring layer D2 along the shape of the spacer SP. Furthermore, like the first embodiment, the contact CX is in contact with the source line portion SLP via the spacer SP, and is electrically insulated from the conductive layers 60 and 64 of the source line portion SLP. Besides, like the first embodiment, the contact CX can include the void VO. Note that another contact may or may not be connected to an upper part UP of the contact CX of the fourth embodiment.

The other structure of the semiconductor memory device 1 according to the fourth embodiment is the same as in the first embodiment. Note that in the discharge portion DCP, the contact CX may be electrically connected to the semiconductor substrate 20. The position of the provision of the contact CX and spacer SP between the wiring layer D2 and semiconductor substrate 20 May vary depending on a variance in manufacturing of the semiconductor memory device 1. For example, a part of the contact C2 may remain between the spacer SP and the conductive layer 71, or the spacer SP may be buried in the part of the conductive layer 71.

[4-2] Manufacturing Method of Semiconductor Memory Device 1

FIGS. 49 to 52 are cross-sectional views illustrating an example of cross-sectional structure during manufacturing of the semiconductor memory device 1 according to the fourth embodiment. Each of FIG. 49 to FIG. 52 illustrates a region in which the memory region MA and contact region C3T illustrated in FIG. 48 are extracted. Hereinafter, forming steps of the discharge portion DCP and memory cell array 10 in the fourth embodiment will be described.

To start with, the same process as in steps S100 to S104 described in the first embodiment is executed, and a structure as illustrated in FIG. 49 is formed. Note that in the fourth embodiment, in the process of step S102, in the hole LH, a conductive member 130 is formed in place of the conductive member 100. For example, the same material as the conductive layer 72 exposed in the bottom portion of the hole LH is used for the conductive member 130. The conductive member 130 is, for example, tungsten.

Next, as illustrated in FIG. 50, a slit SLT and a hole UH are formed. The slit SLT divides the insulating layer 36-2, stacked sacrificial members SM, the conductive layer 64 and the insulating layer 63, and the sacrificial member 62 is exposed in the bottom portion of the slit SLT. The hole UH is disposed to overlap the conductive member 130, and is provided to penetrate the insulating layer 36-2. A surface of the conductive member 130 is exposed in the bottom portion of the hole UH.

Subsequently, as illustrated in FIG. 51, the conductive member 130 is removed via the hole UH, and a hole CHX is formed. Wet etching is used to remove the conductive member 130. The wet etching can remove the conductive layer 72 or the like, for which the same material as the conductive member 130 is used. In the present example, the conductive layer 72 and contact C2 are removed.

Next, the same process as in steps S106 to S108 described in the first embodiment is executed, and, as illustrated in FIG. 52, the spacer SP and contact LI are formed in the slit SLT, and the spacer SP and contact CX are formed in the hole CHX.

[4-3] Advantageous Effects of the Fourth Embodiment

In the semiconductor memory device 1 according to the fourth embodiment, for example, when the slit SLT is formed, the conductive layers 64 and 60 are electrically connected to the semiconductor substrate 20 via the conductive member 130 of the discharge portion DCP. As a result, like the first embodiment, the semiconductor memory device 1 according to the fourth embodiment can suppress the voltage difference between the source line SL and the semiconductor substrate 20 in the high aspect ratio etching process. Accordingly, the semiconductor memory device 1 according to the fourth embodiment can suppress the occurrence of a defect due to the influence of arcing, and can improve the yield.

In addition, in the semiconductor memory device 1 according to the fourth embodiment, after the formation of the slit SLT, the conductive member 130 is removed, and the contact CX provided in the discharge portion DCP is electrically insulated from the source line SL by the spacer SP. As a result, like the first embodiment, the semiconductor memory device 1 according to the fourth embodiment can suppress the loss at a time of applying a voltage to the source line SL.

[5] Fifth Embodiment

A semiconductor memory device 1 according to a fifth embodiment is a modification of the first embodiment, and has such a structure that the lower portion LP of the contact CX is in contact with the semiconductor substrate 20. Hereinafter, the semiconductor memory device 1 according to the fifth embodiment will be described with respect to different points from the first embodiment.

[5-1] Structure of Semiconductor Memory Device 1

Figure 53:
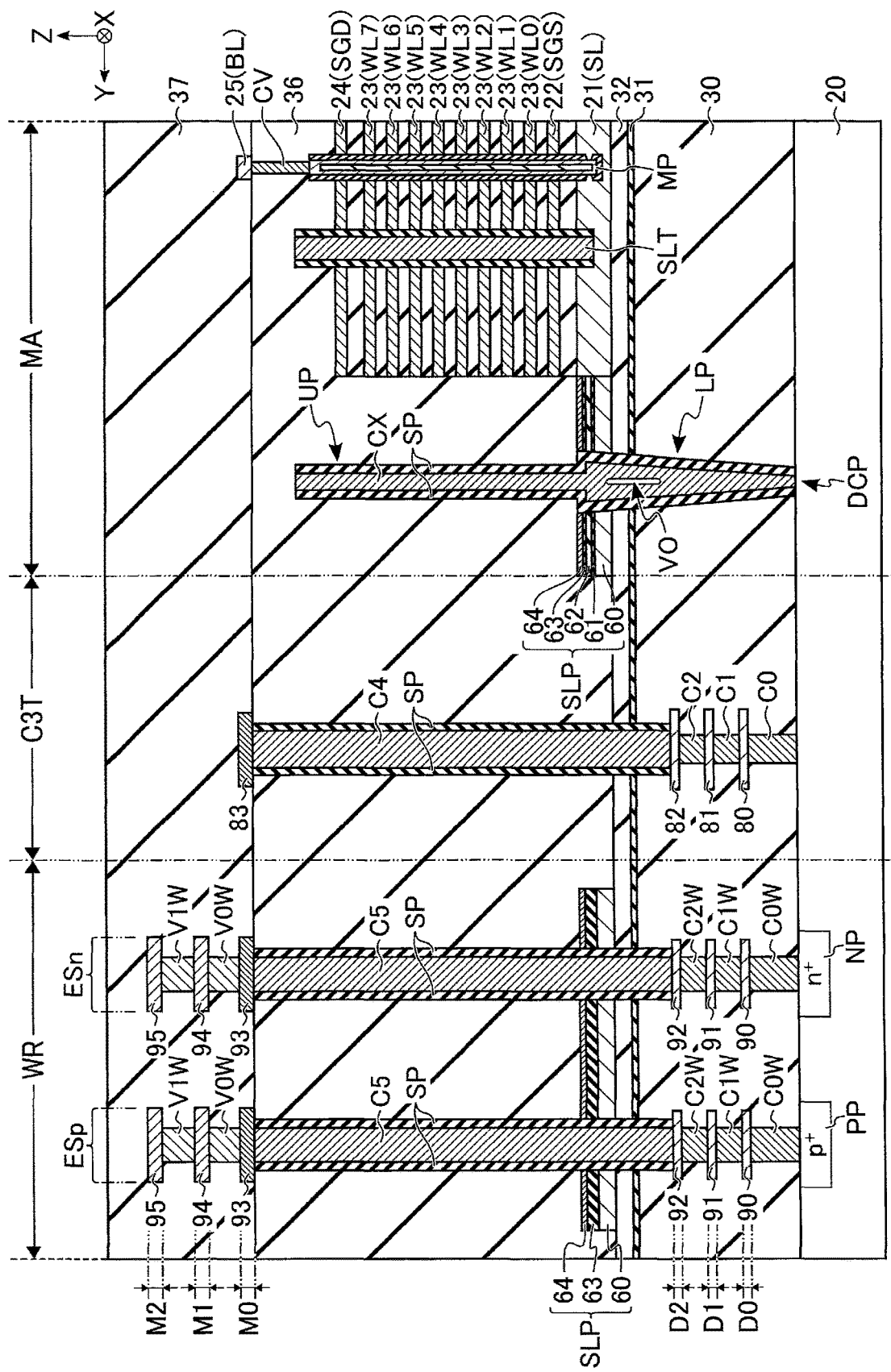
FIG. 53 is a cross-sectional view illustrating an example of cross-sectional structure in a memory region, a contact region and a wall region of a semiconductor memory device according to a fifth embodiment.

FIG. 53 is a cross-sectional view illustrating an example of cross-sectional structure in a memory region MA, a contact region C3T and a wall region WR of the semiconductor memory device 1 according to the fifth embodiment. As illustrated in FIG. 53, the semiconductor memory device 1 according to the fifth embodiment is different from the first embodiment with respect to the structure of the discharge portion DCP. The discharge portion DCP of the fifth embodiment includes, for example, a contact CX and a spacer SP.

Specifically, the contact CX is provided on the semiconductor substrate 20. The side surface of the contact CX is covered with the spacer SP. The spacer SP of the fifth embodiment may be provided between the semiconductor substrate 20 and the contact CX. The lower portion LP of the contact CX of the fifth embodiment extends from the upper portion of the semiconductor substrate 20 to the upper surface of the conductive layer 64. In other words, the lower portion of the contact CX of the fifth embodiment is formed in such a manner that when a hole penetrating the source line portion SLP is formed, the hole reaches the surface of the semiconductor substrate 20.

Like the first embodiment, the contact CX of the fifth embodiment is in contact with the source line portion SLP via the spacer SP, and is electrically insulated from the conductive layers 60 and 64 of the source line portion SLP. Besides, like the first embodiment, the contact CX of the fifth embodiment can include the void VO. Note that another contact may or may not be connected to an upper part UP of the contact CX of the fifth embodiment. The other structure of the semiconductor memory device 1 according to the fifth embodiment is the same as in the first embodiment.

[5-2] Manufacturing Method of Semiconductor Memory Device 1

FIGS. 54 to 57 are cross-sectional views illustrating an example of cross-sectional structure during manufacturing of the semiconductor memory device 1 according to the fifth embodiment. Each of FIG. 54 to FIG. 57 illustrates a region in which the memory region MA and contact region C3T illustrated in FIG. 53 are extracted. Hereinafter, forming steps of the discharge portion DCP and memory cell array 10 in the fifth embodiment will be described.

To start with, the same process as in steps S100 to S104 described in the first embodiment is executed, and a structure as illustrated in FIG. 54 is formed. Note that in the fifth embodiment, in the process of step S101, the hole LH is formed in a manner to reach the surface of the semiconductor substrate 20. In addition, in the process of step S102, in the hole LH, a conductive member 140 is formed in place of the conductive member 100. The conductive member 140 is, for example, tungsten.

Next, as illustrated in FIG. 55, a slit SLT and a hole UH are formed. The slit SLT divides the insulating layer 36-2, stacked sacrificial members SM, the conductive layer 64 and the insulating layer 63, and the sacrificial member 62 is exposed in the bottom portion of the slit SLT. The hole UH is disposed to overlap the conductive member 140, and is provided to penetrate the insulating layer 36-2. A surface of the conductive member 140 is exposed in the bottom portion of the hole UH.

Subsequently, as illustrated in FIG. 56, the conductive member 140 is removed via the hole UH, and a hole CHX is formed. Wet etching is used to remove the conductive member 140.

Next, the same process as in steps S106 to S108 described in the first embodiment is executed, and, as illustrated in FIG. 57, the spacer SP and contact LI are formed in the slit SLT, and the spacer SP and contact CX are formed in the hole CHX.

[5-3] Advantageous Effects of the Fifth Embodiment

In the semiconductor memory device 1 according to the fifth embodiment, for example, when the slit SLT is formed, the conductive layers 64 and 60 are electrically connected to the semiconductor substrate 20 via the conductive member 140 of the discharge portion DCP. As a result, like the first embodiment, the semiconductor memory device 1 according to the fifth embodiment can suppress the voltage difference between the source line SL and the semiconductor substrate 20 in the high aspect ratio etching process. Accordingly, the semiconductor memory device 1 according to the fifth embodiment can suppress the occurrence of a defect due to the influence of arcing, and can improve the yield.

In addition, in the semiconductor memory device 1 according to the fifth embodiment, after the formation of the slit SLT, the conductive member 140 is removed, and the contact CX provided in the discharge portion DCP is electrically insulated from the source line SL by the spacer SP. As a result, like the first embodiment, the semiconductor memory device 1 according to the fifth embodiment can suppress the loss at a time of applying a voltage to the source line SL.

[6] Sixth Embodiment

A semiconductor memory device 1 according to a sixth embodiment is a modification of the fourth embodiment, and has such a structure that the conductive member 130 and the semiconductor substrate 20 are insulated by the removal of a portion of the conductor between the conductive member 130 and the semiconductor substrate 20. Hereinafter, the semiconductor memory device 1 according to the sixth embodiment will be described with respect to different points from the fourth embodiment.

[6-1] Structure of Semiconductor Memory Device 1

Figure 58:
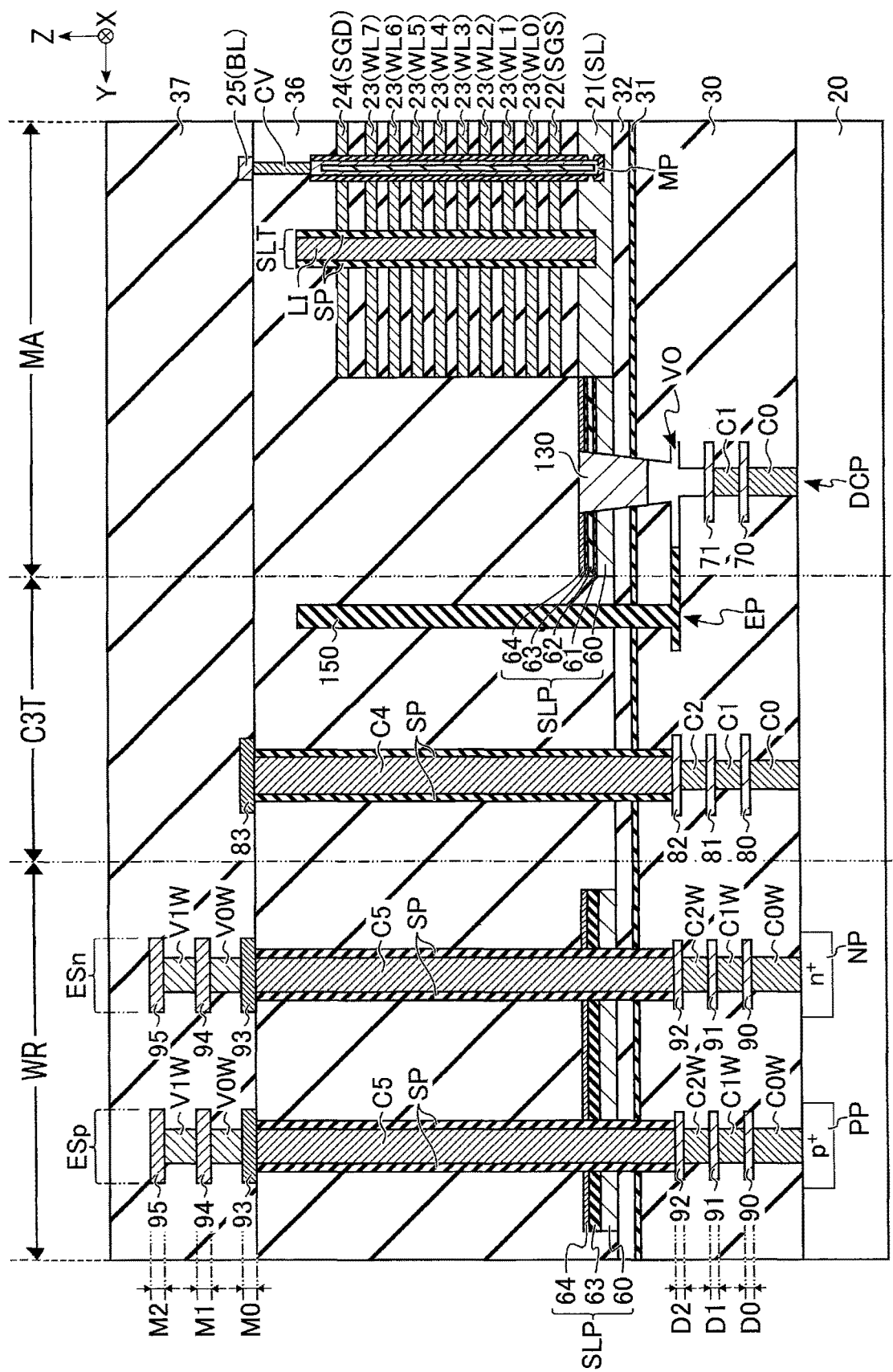
FIG. 58 is a cross-sectional view illustrating an example of cross-sectional structure in a memory region, a contact region and a wall region of a semiconductor memory device according to a sixth embodiment.

FIG. 58 is a cross-sectional view illustrating an example of cross-sectional structure in a memory region MA, a contact region C3T and a wall region WR of the semiconductor memory device 1 according to the sixth embodiment. As illustrated in FIG. 58, the semiconductor memory device 1 according to the sixth embodiment is different from the first embodiment with respect to the structure of the discharge portion DCP. The discharge portion DCP of the sixth embodiment includes, for example, contacts C0 and C1, conductive layers 70 and 71, a conductive member 130, and an insulator 150. In addition, in the sixth embodiment, the discharge portion DCP includes a void VO and an extension portion EP.

Specifically, like the first embodiment, the contacts C0 and C1 and conductive layers 70 and 71 are provided on the semiconductor substrate 20. The void VO is formed above the conductive layer 71. The conductive member 130 is provided above the void VO. For example, the conductive member 130 is provided to penetrate the source line SLP, and is electrically connected to the source line SL (conductive layer 21) via the conductive layers 60 and 64. The conductive layer 130 is, for example, tungsten.

The extension portion EP is provided in the wiring layer D2 in a manner to extend from a part where the void VO is formed, to the outside of the memory region MA. In other words, the extension portion EP is provided to extend from a lower portion of the conductive member 130 to a region which does not overlap the source line portion SLP. In addition, the insulator 150 is buried in a part of the extension portion EP. The insulator 150 includes a portion buried in the extension portion EP, and a portion provided to extend in the Z direction above a part which does not overlap the source line portion SLP in the Z direction in the extension portion EP. The insulator 150 buried in the extension portion EP is provided to extend from the region (the portion in contact with the void VO) near the lower portion of the conductive member 130, to the region which does not overlap the source line portion SLP in the Z direction. The height of that part of the insulator 150, which is provided to extend in the Z direction, is aligned with, for example, the height of the slit SLT. In addition, the insulator 150 is formed of the same material as, for example, the spacers SP in the slit SLT. The other structure of the semiconductor memory device 1 according to the sixth embodiment is the same as in the fourth embodiment.

[6-2] Manufacturing Method of Semiconductor Memory Device 1

FIGS. 59 to 62 are cross-sectional views illustrating an example of cross-sectional structure during manufacturing of the semiconductor memory device 1 according to the sixth embodiment. Each of FIG. 59 to FIG. 62 illustrates a region in which the memory region MA and contact region C3T illustrated in FIG. 58 are extracted. Hereinafter, forming steps of the discharge portion DCP and memory cell array 10 in the sixth embodiment will be described.

To start with, the same process as in steps S100 to S104 described in the first embodiment is executed, and a structure as illustrated in FIG. 59 is formed. Note that in the sixth embodiment, in the process of step S102, in the hole LH, a conductive member 130 is formed in place of the conductive member 100. The conductive member 130 is, for example, tungsten. In the sixth embodiment, in the discharge portion DCP, the conductive layer 72 provided in the wiring layer D2 includes the extension portion EP.

Next, as illustrated in FIG. 60, a slit SLT and a hole UH are formed. The slit SLT divides the insulating layer 36-2, stacked sacrificial members SM, the conductive layer 64 and the insulating layer 63, and the sacrificial member 62 is exposed in the bottom portion of the slit SLT. The hole UH is disposed to overlap the extension portion EP of the conductive layer 72, and not to overlap the source line portion SLP, and is provided to penetrate the insulating layers 36-2, 32 and 31, and a part of the insulating layer 30. A surface of the conductive member 72 is exposed in the bottom portion of the hole UH.

Subsequently, as illustrated in FIG. 61, the conductive layer 72 is removed via the hole UH, and the void VO is formed between the conductive member 130 and the conductive layer 71. Wet etching is used to remove the conductive layer 72. The wet etching can remove parts of the conductive member 130, contact C2 and the like. In the present example, a part of the conductive member 130 and the contact C2 are removed.

Next, the same process as in steps S106 to S108 described in the first embodiment is executed, and, as illustrated in FIG. 62, the spacers SP and contact LI are formed in the slit SLT, and the insulator 150 is buried in the hole UH and in a part of the extension portion EP. Specifically, the insulator 150 can be formed in the same step as the spacers SP. Note that, depending on the size of the hole UH, a conductor having a side surface surrounded by the insulator 150 may be formed in the hole UH.

[6-3] Advantageous Effects of the Sixth Embodiment

In the semiconductor memory device 1 according to the sixth embodiment, for example, when the slit SLT is formed, the conductive layers 64 and 60 are electrically connected to the semiconductor substrate 20 via the conductive member 130 of the discharge portion DCP. As a result, like the first embodiment, the semiconductor memory device 1 according to the sixth embodiment can suppress the voltage difference between the source line SL and the semiconductor substrate 20 in the high aspect ratio etching process. Accordingly, the semiconductor memory device 1 according to the sixth embodiment can suppress the occurrence of a defect due to the influence of arcing, and can improve the yield.

In addition, in the semiconductor memory device 1 according to the sixth embodiment, after the formation of the slit SLT, a part of the conductor between the conductive member 130 and the semiconductor substrate 20 is removed, and the semiconductor substrate 20 and the source line SL are electrically insulated by the void VO and/or the insulator 150. As a result, like the first embodiment, the semiconductor memory device 1 according to the sixth embodiment can suppress the loss at a time of applying a voltage to the source line SL.

[7] Seventh Embodiment

A semiconductor memory device 1 according to a seventh embodiment is a modification of the first embodiment, and includes a discharge portion DCP which is used as a contact CX connected to a guard ring. Hereinafter, the semiconductor memory device 1 according to the seventh embodiment will be described with respect to different points from the first to sixth embodiments.

[7-1] Structure of Semiconductor Memory Device 1

FIG. 63 is a plan view illustrating an example of a plan layout in a wiring layer including a source line SL of the semiconductor memory device 1 according to the seventh embodiment. FIG. 63 illustrates the same region as the plan layout of the semiconductor memory device 1 according to the first embodiment illustrated in FIG. 10. As illustrated in FIG. 63, in the semiconductor memory device 1 according to the seventh embodiment, a plurality of contacts CX are disposed, for example, in a peripheral portion of each core region CR. Note that at least one contact CX is disposed in each core region CR. The contacts CX may be arranged in the extending direction (X direction) of the word lines WL, or may be arranged in the extending direction (Y direction) of the bit lines BL. Depending on the layout of the core region CR, the contacts CX may be disposed in portions other than the peripheral portion of the core region CR. In addition, the arrangement of the contacts CX in the seventh embodiment is applicable to each of the first to fifth embodiments.

FIG. 64 is a plan view illustrating an example of a plan layout of an element formation region of the semiconductor memory device 1 according to the seventh embodiment. The element formation region is a region where transistors used in the row decoder module 15 and the sense amplifier module 16, and the like are formed. Parts (A), (B) and (C) of FIG. 64 correspond to regions overlapping each other in plan view, and illustrate a structure in the vicinity of the surface of the semiconductor substrate 20, a structure in the vicinity of the wiring layer D0, and a structure in the vicinity of the wiring layer D1, respectively. Part (B) of FIG. 64 illustrates, by broken lines or the like, the arrangement of the structure illustrated in part (A) of FIG. 64. Part (C) of FIG. 64 illustrates, by broken lines or the like, the arrangement of the structure illustrated in part (B) of FIG. 64.

As illustrated in part (A) of FIG. 64, the element formation region includes, in the vicinity of the surface of the semiconductor substrate 20, an N-type guard ring region NG, a P-type guard ring region PG, an N-type well region NW, a P-type well region PW, a plurality of gate electrodes GE, and a plurality of contacts C0. In the element formation region, an insulating region STI is provided in portions where the N-type guard ring region NG, P-type guard ring region PG, N-type well region NW and P-type well region PW are not formed. In the seventh embodiment, structures connected to the N-type guard ring region NG and structures connected to the P-type guard ring region PG are used as discharge portions DCP.

The N-type guard ring region NG is a semiconductor region in which the concentration of N-type impurities is higher than the concentration of P-type impurities. The N-type guard ring region NG is provided, for example, in a ring shape, and surrounds at least one PMOS transistor PM. Specifically, the N-type guard ring region NG surrounds at least one N-type well region NW. At least one contact C0 is connected to the N-type guard ring region NG. In the present example, a plurality of contacts C0 are arranged in a ring shape on the N-type guard ring region NG which is provided in the ring shape.

The P-type guard ring region PG is a semiconductor region in which the concentration of P-type impurities is higher than the concentration of N-type impurities. For example, at least a part of the P-type semiconductor substrate 20 is used as the P-type guard ring region PG. The P-type guard ring region PG is provided, for example, in a ring shape, and surrounds at least one NMOS transistor NM. Specifically, the P-type guard ring region PG surrounds at least one P-type well region PW. At least one contact C0 is connected to the P-type guard ring region PG. In the present example, a plurality of contacts C0 are arranged in a ring shape on the P-type guard ring region PG which is provided in the ring shape.

The PMOS transistor PM is provided in each N-type well region NW. Specifically, at least one gate electrode GE is disposed to overlap each N-type well region NW. In each N-type well region NW, P-type impurity diffusion regions are provided in portions corresponding to the source and drain of the PMOS transistor PM, and contacts C0 are connected to the P-type impurity diffusion regions. In addition, the contact C0 is also provided on the gate electrode GE of the PMOS transistor PM.

The NMOS transistor NM is provided in each P-type well region PW. Specifically, at least one gate electrode GE is disposed to overlap each P-type well region PW. In each P-type well region PW, N-type impurity diffusion regions are provided in portions corresponding to the source and drain of the NMOS transistor NM, and contacts C0 are connected to the N-type impurity diffusion regions. In addition, the contact C0 is also provided on the gate electrode GE of the NMOS transistor NM.

As illustrated in part (B) of FIG. 64, the element formation region includes, in the vicinity of the wiring layer D0, a plurality of conductive layers 41A and 41B, conductive layers 70A and 70B, and a plurality of contacts C1.

Each conductive layer 41A is connected to any one of the source, drain and gate of the PMOS transistor PM. Each conductive layer 41B is connected to any one of the source, drain and gate of the NMOS transistor NM. At least one contact C1 is connected to each of the conductive layers 41A and 41B.

The conductive layer 70A includes a portion overlapping the N-type guard ring region NG, and is provided, for example, in a ring shape. The conductive layer 70A is connected to the N-type guard ring region NG via a plurality of contacts C0. The conductive layer 70B includes a portion overlapping the P-type guard ring region PG, and is provided, for example, in a ring shape. The conductive layer 70B is connected to the P-type guard ring region PG via a plurality of contacts C0. At least one contact C1 is connected to each of the conductive layers 70A and 70B.

As illustrated in part (C) of FIG. 64, the device formation region includes, in the vicinity of the wiring layer D1, a plurality of conductive layers 42A and 42B, a plurality of conductive layers 71A and 71B, and a plurality of contacts C2.

Each conductive layer 42A is connected to any one of the source, drain and gate of the PMOS transistor PM via the contact C1. Each conductive layer 42B is connected to any one of the source, drain and gate of the NMOS transistor NM via the contact C1. The conductive layer 42A includes, for example, a portion provided between two conductive layers 71A. The conductive layer 42B includes, for example, a portion provided between two conductive layers 71B.

Each conductive layer 71A includes a portion overlapping the conductive layer 70A. Each conductive layer 71A is connected to the N-type guard ring region NG via at least one contact C1, and is connected to the contact CX via at least one contact C2. Each conductive layer 71B includes a portion overlapping the conductive layer 70B. Each conductive layer 71B is connected to the P-type guard ring region PG via at least one contact C1, and is connected to the contact CX via at least one contact C2.

FIG. 65 is a cross-sectional view taken along a line LXV-LXV of FIG. 64, FIG. 65 illustrating an example of cross-sectional structure of the element formation region of the semiconductor memory device according to the seventh embodiment. As illustrated in FIG. 65, the element formation region further includes a plurality of conductive layers 72A and 72B. The insulating region STI is disposed between the N-type guard ring region NG and the P-type guard ring region PG. The insulating region STI has such a structure that an insulator is buried in a trench formed in the semiconductor substrate 20.

The contact CX corresponding to the N-type guard ring region NG is electrically connected to the N-type guard ring region NG of the semiconductor substrate 20 via the conductive layers 70A, 71A and 72A. The contact CX corresponding to the P-type guard ring region PG is electrically connected to the P-type guard ring region PG of the semiconductor substrate 20 via the conductive layers 70B, 71B and 72B. The structure of the contact CX illustrated in FIG. 65 is the same as in the first embodiment. In addition, the other structure of the semiconductor memory device 1 according to the seventh embodiment is the same as in the first embodiment.

Note that in each core region CR, a plurality of N-type guard ring regions NG and a plurality of P-type guard ring regions PG may be disposed. The number of MOS transistors disposed in each guard ring region can be freely designed. The shape of each guard ring region may not be a square ring shape, and can be freely designed. The shape of the conductive layers 70 to 72 connected to the guard ring region can be freely designed. For example, the conductive layers 70A and 70B may not have ring shapes. By devising the shapes of the conductive layers 70 to 72 for each wiring layer, the circuitry formed in the region surrounded by the guard ring region can be connected to circuitry on the outside of the guard ring region. The structure of the discharge portion DCP in the seventh embodiment can be applied to the structure of each of the first to fifth embodiments, except for the kind of semiconductor regions connected in the semiconductor substrate 20.

[7-2] Advantageous Effects of the Seventh Embodiment

FIG. 66 is a cross-sectional view illustrating an example of cross-sectional structure during manufacturing of the semiconductor memory device 1 according to the seventh embodiment. Each of parts (A) and (B) of FIG. 66 illustrates, in an extracted manner, a part of the region illustrated in FIG. 65. Part (A) of FIG. 66 exemplifies a state at a time of forming the slit SLT. Part (B) of FIG. 66 exemplifies a structure after the formation of the contact CX.

As illustrated in part (A) of FIG. 66, when the slit SLT is formed, the conductive layers 64 and 60 are electrically connected to the N-type guard ring region NG or P-type guard ring region PG of the semiconductor substrate 20 via the conductive member 100 of the discharge portion DCP. Thus, at the time of the formation of the slit SLT, the positive charge accumulated in the bottom portion of the slit SLT can be discharged to the N-type guard ring region NG or P-type guard ring region PG of the semiconductor substrate 20 via the conductive member 100 of the discharge portion DCP.

In this manner, the semiconductor memory device 1 according to the seventh embodiment suppresses the voltage difference between the source line SL and the semiconductor substrate 20 by discharging the positive charge to the N-type guard ring region NG or P-type guard ring region PG of the semiconductor substrate 20 in the high aspect ratio etching process. As a result, the semiconductor memory device 1 according to the seventh embodiment can suppress the occurrence of a defect due to the influence of arcing, and can improve the yield.

In addition, in the semiconductor memory device 1 according to the seventh embodiment, as illustrated in part (B) of FIG. 66, after the completion of the replacement process of the source line portion SLP and the stacked wiring portion, the conductive member 100 is removed, and the contacts C0 to C2 and CX of the discharge portion DCP are electrically insulated from the source line SL by the spacer SP.

Thereby, the semiconductor memory device 1 according to the seventh embodiment can independently drive the contact CX and the like provided in the discharge portion DCP, and the source line SL, at the time of various operations. As a result, in the semiconductor memory device 1 according to the seventh embodiment, the N-type guard ring region NG and P-type guard ring region PG provided in the discharge portion DCP can be independently driven, and can be used as guard rings.

Note that in the seventh embodiment, the case was exemplified in which the contact CX of the discharge portion DCP described in the first embodiment is used for the connection of the guard ring, but the seventh embodiment is not limited to this. The seventh embodiment may be combined with the second embodiment to the fifth embodiments. Also when the structure of the discharge portion DCP is the same as in the second embodiment to the fifth embodiments, the discharge portion DCP can be used as a part of the contact and wiring for the guard ring.

[8] Eighth Embodiment

A semiconductor memory device 1 according to an eighth embodiment is a modification of the first embodiment, and includes a discharge portion DCP which is used as a part of the sealing members ESn and ESp. Hereinafter, the semiconductor memory device 1 according to the eighth embodiment will be described with respect to different points from the first embodiment.

[8-1] Structure of Semiconductor Memory Device 1

FIG. 67 is a plan view illustrating an example of a plan layout in a wiring layer including a source line SL of the semiconductor memory device 1 according to the eighth embodiment. FIG. 67 illustrates the same region as the plan layout of the semiconductor memory device 1 according to the first embodiment illustrated in FIG. 10. As illustrated in FIG. 67, in the semiconductor memory device 1 according to the eighth embodiment, the source line portion SLP of each core region CR includes a portion crossing at least one of the sealing members ESn and ESp, and this portion functions as the discharge portion DCP. The discharge portions DCP of the respective core regions CR are spaced apart from each other. In the present example, the source line portion SLP in the wall region WR is omitted except for the discharge portion DCP. Note that, in the eighth embodiment, it suffices that the source line portion SLP in the wall region WR does not include at least a portion provided continuously between the core regions CR. For example, that part of the source line portion SLP, which crosses the sealing members ESn and ESp, may further extend to the outer peripheral side of the wall region WR, and may be provided continuously with the source line portion SLP in the kerf region KR. In addition, the arrangement of the source line portion SLP in the eighth embodiment is applicable to each of the first to seventh embodiments.

Figure 68:
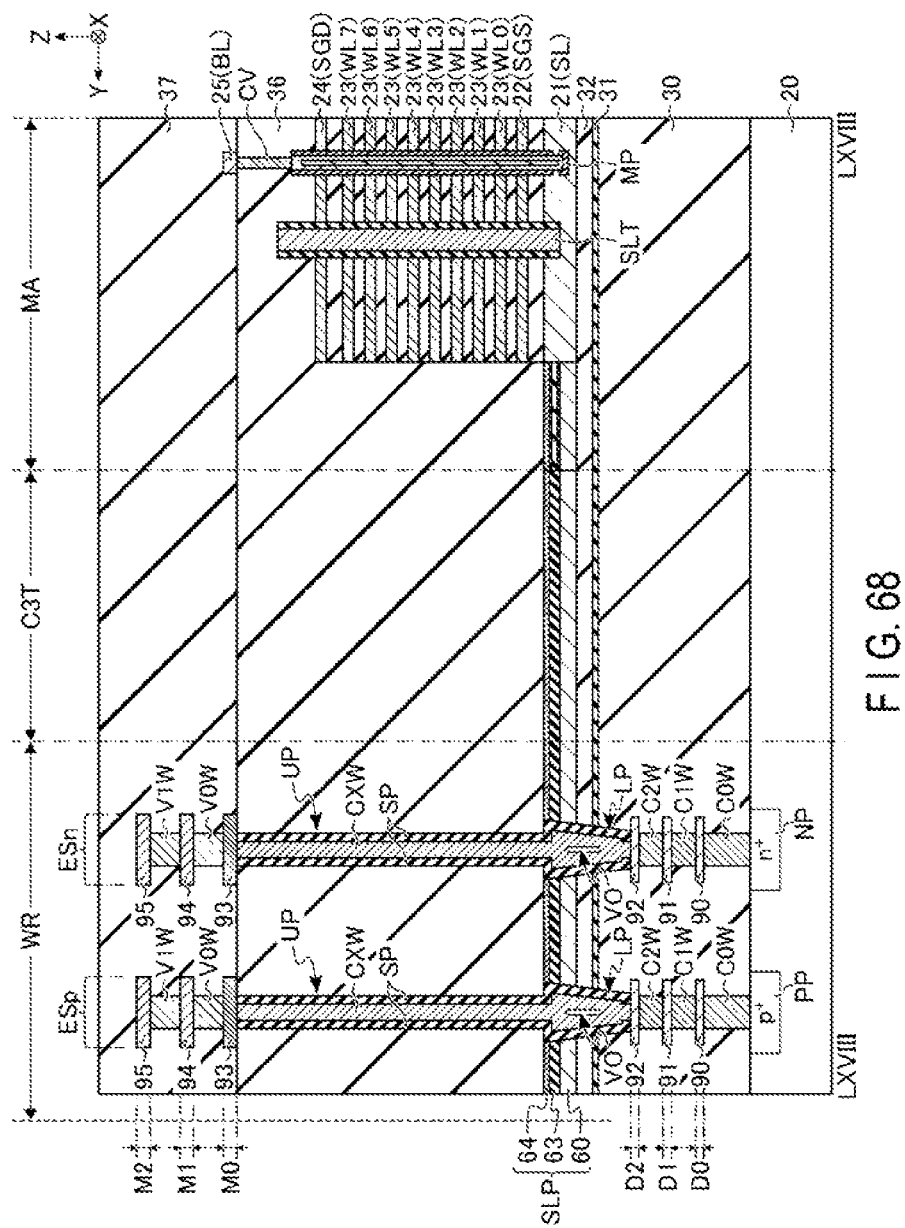
FIG. 68 is a cross-sectional view taken along a line LXVIII-LXVIII of FIG. 67, FIG. 68 illustrating an example of cross-sectional structure in a memory region, a contact region and a wall region of the semiconductor memory device according to the eighth embodiment.

FIG. 68 is a cross-sectional view taken along a line LXVIII-LXVIII of FIG. 67, FIG. 68 illustrating an example of cross-sectional structure in a memory region MA, a contact region C3T and a wall region WR of the semiconductor memory device according to the eighth embodiment. As illustrated in FIG. 68, the semiconductor memory device 1 according to the eighth embodiment includes a portion where the source line portion SLP in the memory region MA and the source line portion SLP in the wall region WR are continuously provided. In addition, each of the sealing members ESn and ESp has such a structure that the contact C5 is replaced with a contact CXW, compared to the sealing members ESn and ESp of the first embodiment.

Specifically, the conductive layer 93 is provided on the conductive layer 92 via the contact CXW. The cross-sectional shape of the contact CXW in the eighth embodiment is similar to, for example, the cross-sectional shape of the contact CX of the first embodiment. The contact CXW is separated and insulated by the spacer SP from the conductive layers 60 and 64 of the source line portion SLP in the memory region MA. In addition, like the contact C5, the contact CXW includes a portion extending in the Y direction and a portion extending in the X direction, and is provided, for example, in a ring shape. Thereby, in the eighth embodiment, the set of the contacts C0W, C1W, C2W, CXW, V0W and V1W and the conductive layers 90 to 95 is provided, for example, in a square ring shape, and surrounds a plurality of the core regions CR.

Note that the source line portion SLP is divided by the sealing members ESn and ESp. Thus, the source line portion SLP, with which the sealing member (ESp in this example) provided on the outside is in contact, is spaced apart from the source line portion SLP in the memory region MA.

[8-2] Advantageous Effects of the Eighth Embodiment

Figure 69:
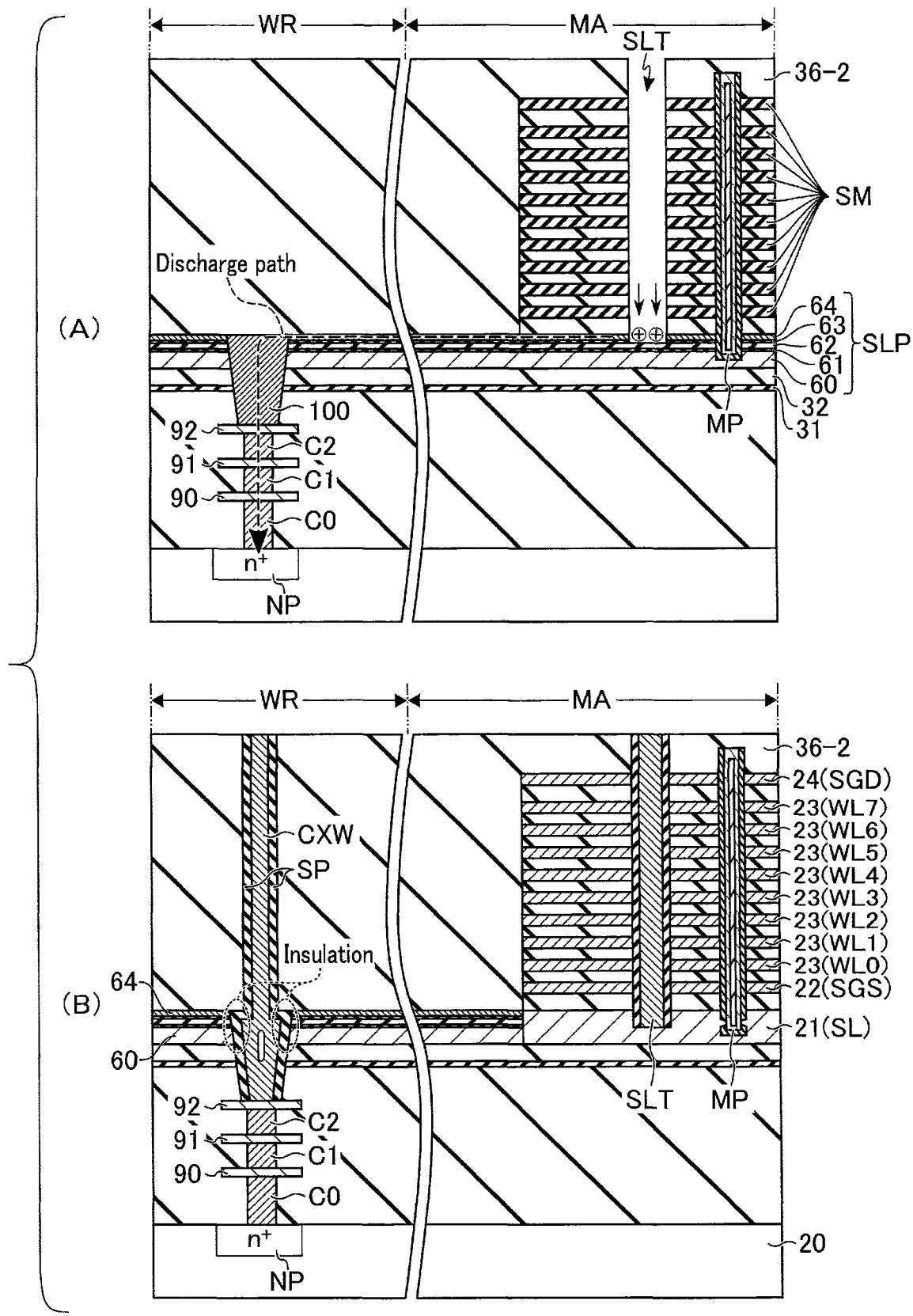
FIG. 69 is a cross-sectional view illustrating an example of cross-sectional structure during manufacturing of the semiconductor memory device according to the eighth embodiment.

FIG. 69 is a cross-sectional view illustrating an example of cross-sectional structure during manufacturing of the semiconductor memory device 1 according to the eighth embodiment. Each of parts (A) and (B) of FIG. 69 illustrates, in an extracted manner, a part of the region illustrated in FIG. 68. Part (A) of FIG. 69 exemplifies a state at a time of the formation of the slit SLT. Part (B) of FIG. 69 exemplifies a structure after the formation of the contact CXW.

As illustrated in part (A) of FIG. 69, when the slit SLT is formed, the conductive layers 64 and 60 are electrically connected to the N-type impurity diffusion region NP or P-type impurity diffusion region PP of the semiconductor substrate 20 via the conductive member 100 of the discharge portion DCP. Thus, at the time of the formation of the slit SLT, the positive charge accumulated in the bottom portion of the slit SLT can be discharged to the N-type impurity diffusion region NP or P-type impurity diffusion region PP of the semiconductor substrate 20 via the conductive member 100 of the discharge portion DCP in the wall region WR.

In this manner, the semiconductor memory device 1 according to the eighth embodiment suppresses the voltage difference between the source line SL and the semiconductor substrate 20 by discharging the positive charge to the N-type impurity diffusion region NP or P-type impurity diffusion region PP of the semiconductor substrate 20 in the high aspect ratio etching process. As a result, the semiconductor memory device 1 according to the eighth embodiment can suppress the occurrence of a defect due to the influence of arcing, and can improve the yield.

In addition, in the semiconductor memory device 1 according to the eighth embodiment, as illustrated in part (B) of FIG. 69, after the completion of the replacement process of the source line portion SLP and the stacked wiring portion, the conductive member 100 is removed, and the contacts C0 to C2 and CXW of the discharge portion DCP are electrically insulated from the source line SL by the spacer SP. As a result, the semiconductor memory device 1 according to the eighth embodiment can use the contact CXW and the like provided in the discharge portion DCP as a part of the sealing members ESn and ESp.

Furthermore, in the semiconductor memory device 1 according to the eighth embodiment, the contact CXW and the like of parts of the sealing members ESn and ESp in the wall region WR are formed in the same manner as the discharge portion DCP described in the first embodiment. In addition, since the discharge portion DCP is provided in the region for forming the sealing members ESn and ESp, the region for providing only the discharge portion DCP can be omitted. As a result, the semiconductor memory device 1 according to the eighth embodiment can suppress an increase in chip area due to the addition of the discharge portion DCP, and can hold down the manufacturing cost of the semiconductor memory device 1.

Note that in the eighth embodiment, the case was exemplified in which the structure similar to the contact CX of the discharge portion DCP described in the first embodiment is used as the part of the sealing members ESn and ESp, but the eighth embodiment is not limited to this. The eighth embodiment may be combined with the second embodiment to the fifth embodiments. Also when the structure of the discharge portion DCP is similar to the second embodiment to the fifth embodiments, the discharge DCP can be used as a part of the sealing members Esn and Esp.

[9] Modifications and the Like

The above-described embodiments can variously be modified. Hereinafter, a first modification and a second modification, and other variations of the embodiments will be described.

First Modification

FIG. 70 is a cross-sectional view illustrating an example of cross-sectional structure in a memory region MA and a contact region C3T of a semiconductor memory device 1 according to a first modification. As illustrated in FIG. 70, the first modification is different from the first embodiment with respect to the structure of the hole CHX. Specifically, the diameter of the hole CHX in the first modification is set to be smaller than in the first embodiment. As a result, the upper portion UH of the hole CHX in the first modification is closed by the spacer SP, and does not include the contact CX. In addition, the lower portion LH of the hole CHX in the first modification can include the void VO, like the first embodiment.

In this manner, the hole CHX corresponding to the discharge portion DCP may not include the structure corresponding to the contact CX. The contacts C0 to C2 and conductive layers 70 to 72 provided in the discharge portion DCP in the first modification are not used in the operation of the semiconductor memory device 1. On the other hand, like the first embodiment, the discharge portion DCP of the first modification can be a current path between the source line portion SLP and the semiconductor substrate 20 in the high aspect ratio etching process, since the discharge portion DCP includes, for example, the conductive member 100.

As a result, like the first embodiment, the semiconductor memory device 1 according to the first modification can suppress a decrease in the yield due to the influence of arcing. Note that when the discharge portion DCP is not used in the operation of the semiconductor memory device 1, the first modification may be combined with the second to the fifth embodiments. Also when the first modification is combined with the second to the fifth embodiments, a decrease in the yield due to the influence of arcing can be suppressed.

Second Modification

FIG. 71 is a cross-sectional view illustrating an example of cross-sectional structure in a memory region and a contact region of a semiconductor memory device according to a second modification. The second modification is different from the first embodiment with respect to the structure of the memory pillar MP. Specifically, the semiconductor layer 51 of the memory pillar MP in the second modification is connected to the conductive layer 21 via the bottom portion of the memory pillar MP. In addition, in the second modification, the source line SL is formed without executing the replacement process of the source line portion SLP described in the first embodiment. In short, the semiconductor memory device according to the second modification does not have the multilayer structure of the source line portion SLP.

In this manner, the connection between the memory pillar MP and the source line SL is not limited to the structure described in the first embodiment. The advantageous effect that the discharge portion DC suppresses the influence of arcing can be achieved without depending on the structure of the source line SL and memory pillar MP. Furthermore, also when the second modification is combined with any one of the second to eighth embodiments, the decrease in the yield due to the influence of arcing can be suppressed.
(Others)

The manufacturing steps described in the above embodiments are merely examples. Another process may be inserted between the manufacturing steps. The order of manufacturing steps may be changed as far as no problem will occur. For example, the structure relating to the contact C4 may not necessarily be formed batchwise with the structure relating to the contact CX or the structure relating to the slit SLT. For example, the structure of the source line portion SLP described in the first embodiment may be formed by a method different from the above-described manufacturing method. When the replacement process is executed, a protective film may be formed as appropriate in the slit SLT or in the hole CHX, in order to protect a structure that is not an etching target. For example, in the replacement process of the source line portion SLP, a protective film can be formed on the side surface of the stacked sacrificial members SM. Furthermore, in the replacement process of the stacked wiring portion, a protective film can be formed on the surface of the conductive layer 21 (source line SL), which is exposed at the bottom portion of the slit SLT.

The number of wiring layers described in the above embodiments is merely an example. It suffices that at least one wiring layer is provided between the source line SL and the semiconductor substrate 20. Similarly, it suffices that at least one wiring layer is provided in a layer above the stacked wiring portion. The "wiring layer" corresponds to, for example, a layer in which a wiring used for connection between elements is disposed. The "contact" is a member used, for example, when electrically connecting two wiring lines provided in different wiring layers, or when electrically connecting a wiring line and the semiconductor substrate 20.

In the above embodiments, the structure of the discharge portion DCP may be provided in the kerf region KR. The discharge portion DCP provided in the kerf region KR can suppress the occurrence of arcing in the kerf region KR.

In the above embodiments, the case was exemplified in which, in the source line portion SLP, the part penetrated by the contact CX of the discharge portion DCP is not replaced with the conductive layer 21, but the embodiments are not limited to this. The part penetrated by the contact CX of the discharge portion DCP may be replaced with the conductive layer 21. In this case, too, since the conductive layer 21 and the contact CX are insulated by the spacer SP, the same advantageous effect as in the above embodiments can be obtained.

In the above embodiments, the number of sealing members ESn and ESp provided in the semiconductor memory device 1 is not limited to the number described in the embodiments. It suffices that the semiconductor memory device 1 includes at least one set of the sealing members ESn and ESp. Two or more sealing members ESn may be provided. A plurality of the sealing members ESn may be adjacent to each other. Two or more sealing members ESp may be provided. A plurality of the sealing members ESp may be adjacent to each other. The conductive layer 93 and the like may be shared between two or more sealing members ESn adjacent to each other. The conductive layer 93 and the like may be shared between two or more sealing members ESp adjacent to each other.

In addition, it suffices that each of the sealing members ESn and ESp has at least a square ring wall-like structure, and the numbers of contacts and conductive layers included in each of the sealing members ESn and ESp may be other numbers. As a material used as the conductive layer and the contact included in the sealing members ESn and ESp, use is made of, for example, a metallic material such as titanium, titanium nitride or tungsten. Aside from this, various metallic materials can be used for the sealing members ESn and ESp. As a measure against static electricity or the like from the outside, it is preferable that the sealing member ESn is disposed on the outermost periphery.

In the above embodiments, the memory pillar MP may have such a structure that two or more memory pillars MP are connected together in the Z direction. In this case, the term "high aspect ratio etching process" used in the description of the present specification corresponds to the etching process of the hole corresponding to the pillar reaching the source line SL, or the like. Furthermore, the memory pillar MP may have such a structure that a pillar corresponding to the select gate line SGD and a pillar corresponding to the word line WL are connected together. The memory pillar MP and the bit line BL, the contact CC and the conductive layer 26, and the contact C3 and the conductive layer 27, may each be connected by a plurality of contacts which are connected together in the Z direction. A conductive layer may be inserted into a connecting portion of the plurality of contacts. This also applies to other contacts.

In the drawings used for the description in the above embodiments, the case was exemplified in which the memory pillar MP has the same diameter in the Z direction; however, the embodiments are not limited to this. For example, the memory pillar MP may have a tapered shape or a reverse tapered shape, or may have a shape in which the intermediate portion is bulged (bowing shape). Similarly, each of the slit SLT and SHE may have a tapered shape or a reverse tapered shape, or may have a bowing shape. Similarly, each of the contacts C0W, C1W, C2W, C0 to C6, V0W, and V1W may have a tapered or reverse tapered shape, or may have a bowing shape. Furthermore, in the above embodiments, the case was exemplified in which the cross-sectional structures of the memory pillar MP and the contacts CC, C3, C4 and CX are circular; however, these cross-sectional structures may be elliptical and can be designed in any shape. The contact CX may be provided in a plate shape.

In the above embodiments, the inside of each of the slits SLT and SHE may include a single or a plurality of types of insulators. In this case, for example, a contact for the source line SL (conductive layer 21) is provided in, for example, the hookup region HA. In the present specification, a position of the slit SLT is specified based on, for example, a position of the contact LI. When the slit SLT is composed of an insulator, the position of the slit SLT may be specified by a seam in the slit SLT or a material remaining in the slit SLT during the replacement process.

Note that, as regards the "square ring" in the present specification, it suffices that a target constituent element is formed in a ring shape while including at least portions extending in directions intersecting with each other. Furthermore, the "square ring" May be formed to have a corner portion obliquely formed, and may include a portion in which a side is not formed in a straight line. The "square ring" is preferably a perfect ring, but a part of the ring portion may be interrupted. If the sealing members ESn and ESp have substantially ring structures, the advantageous effects of the sealing members ESn and ESp described in the above embodiments can be obtained. The "ring" is not limited to a circle, but also includes a square ring. The "diameter" indicates the inside diameter of a hole or the like in a cross section parallel to the surface of the semiconductor substrate. The "width" indicates the width of a constituent element in, for example, the X direction or the Y direction. The "side walls" indicate one side surface portion and the other side surface portion of the slit.

In the present specification, the "connection" indicates a state of being electrically connected, and does not exclude, for example, a connection via another element. The term "electrically connected" May indicate a connection via an insulator, if the same operation as by electrical connection is possible. The term "columnar" indicates being a structure which is provided in the hole formed in the manufacturing process of the semiconductor memory device 1. It suffices that the term "identical layer structure" means that at least the order of formation of layers is identical.

In the present specification, the "P-type well region" and "N-type well region" indicate a region of the semiconductor substrate 20 containing P-type impurities, and a region of the semiconductor substrate 20 containing N-type impurities, respectively. The "N-type impurity diffusion region" indicates a region in which the semiconductor substrate 20 is doped with N-type impurities. The "P-type impurity diffusion region" indicates a region in which the semiconductor substrate 20 is doped with P-type impurities. The "semiconductor layer" May be referred to as "conductive layer". The conductive layers 60 and 64 of the source line portion SLP may be referred to as "source line". In the source line portion SLP, the upper surface of the source line corresponds to the upper surface of the conductive layer 64.

In the present specification, the "region" May be regarded as a configuration included by the semiconductor substrate 20. For example, when the semiconductor substrate 20 is defined as including the memory region MA and the hookup region HA, the memory region MA and the hookup region HA are respectively associated with different regions above the semiconductor substrate 20. The "height" corresponds to, for example, a distance in the Z direction between a measurement target configuration and the semiconductor substrate 20. As a reference of the "height", a configuration other than the semiconductor substrate 20 may be used. The "planar position" indicates a position of a structural element in a plan layout. The "plan view" corresponds to, for example, a state of viewing, from the Z direction, the XY plane defined by the X direction and the Y direction.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:
1. A semiconductor memory device comprising:
a substrate;
a source line provided above the substrate;
a stacked structure portion provided in a same layer as the source line, the stacked structure portion including at least a first silicon layer;
a plurality of word lines provided above the source line, the word lines including tungsten and being spaced apart from each other in a first direction intersecting a surface of the substrate;
a pillar extending in the first direction and forming a memory cell at each of intersection portions with the word lines, a bottom portion of the pillar reaching the source line; and
a first member provided to extend in the first direction and provided with a first portion and a second portion in which the first portion is farther from the substrate than the second portion and a length of the first portion in the first direction is larger than a length of the second portion in the first direction, the first member including a first conductor and a first insulating film provided on a side surface portion of the first conductor,
the first conductor extending in the first direction from the first portion to the second portion of the first member, penetrating the stacked structure portion including the first silicon layer, being electrically connected to the substrate, and including a void correspondingly to the second portion of the first member.
2. The device of claim 1, wherein
the substrate includes a core region and a first region, the core region including the word lines and the source line, and the first region being provided to surround the core region and including the stacked structure portion, and
the first conductor is provided in the first region in such a manner as to surround the core region.

3. The device of claim 1, wherein
the stacked structure portion further includes a second silicon layer spaced apart from the first silicon layer in the first direction.

4. The device of claim 3, wherein
the first conductor penetrates the first silicon layer and the second silicon layer of the stacked structure portion.

5. The device of claim 3, wherein
the second silicon layer is farther from the substrate than the first silicon layer.

6. The device of claim 5, wherein
an upper surface of the source line is substantially flush with an upper surface of the second silicon layer.

7. The device of claim 3, wherein
the stacked structure portion further includes an insulator between the first silicon layer and the second silicon layer.

8. The device of claim 3, wherein
the stacked structure portion further includes a first insulating layer and a second insulating layer between the first silicon layer and the second silicon layer, the first insulating layer being in contact with the first silicon layer and the second insulating layer being in contact with the second silicon layer.

9. The device of claim 8, wherein
the stacked structure portion further includes a sacrificial member between the first insulating layer and the second insulating layer.

10. The device of claim 1, wherein
the first conductor includes the void at least within a range of a height in which the first silicon layer of the stacked structure portion is provided.

11. The device of claim 10, wherein
a lower end of the void is positioned lower than a lower surface of the first silicon layer of the stacked structure portion.

12. The device of claim 11, wherein
an upper end of the void is positioned lower than an upper surface of the first silicon layer of the stacked structure portion.

13. A semiconductor memory device comprising:
a substrate;
a source line provided above the substrate;
a stacked structure portion included in a range of a height of a layer in which the source line is provided, the stacked structure portion including a first silicon layer and a second silicon layer spaced apart from each other in a first direction intersecting a surface of the substrate;
a plurality of word lines provided above the source line, the word lines being spaced apart from each other in the first direction;
a pillar provided to extend in the first direction, a bottom portion of the pillar reaching the source line, and each of intersection portions between the pillar and the word lines functioning as a memory cell; and
a first member provided to extend in the first direction and provided with a first portion which is far from the substrate and a second portion which is near the substrate, the first member including a first conductor and a first insulating film provided on a side surface portion of the first conductor,
the first conductor extending in the first direction from the first portion to the second portion of the first member, penetrating the first silicon layer and the second silicon layer of the stacked structure portion, being electrically connected to the substrate, and including a void correspondingly to the second portion of the first member.

14. The device of claim 13, wherein
the substrate includes a core region and a first region, the core region including the word lines and the source line, and the first region being provided to surround the core region and including the stacked structure portion, and
the first conductor is provided in the first region in such a manner as to surround the core region.

15. The device of claim 13, wherein
the second silicon layer is farther from the substrate than the first silicon layer.

16. The device of claim 15, wherein
an upper surface of the source line is substantially flush with an upper surface of the second silicon layer.

17. The device of claim 13, wherein
the stacked structure portion further includes an insulator between the first silicon layer and the second silicon layer.

18. The device of claim 13, wherein
the first conductor includes the void at least within a range of a height in which the first silicon layer of the stacked structure portion is provided.

19. The device of claim 18, wherein
a lower end of the void is positioned lower than a lower surface of the first silicon layer of the stacked structure portion.

20. The device of claim 19, wherein
an upper end of the void is positioned lower than an upper surface of the first silicon layer of the stacked structure portion.

* * * * *